United States Patent
Isojima et al.

(10) Patent No.: US 12,379,616 B2
(45) Date of Patent: Aug. 5, 2025

(54) OPTICAL FILM, POLARIZER PROTECTIVE FILM, TRANSFER BODY FOR POLARIZER PROTECTIVE FILM, POLARIZATION PLATE, IMAGE DISPLAY DEVICE, AND METHOD FOR MANUFACTURING POLARIZER PROTECTIVE FILM

(71) Applicant: DAI NIPPON PRINTING CO., LTD., Tokyo (JP)

(72) Inventors: Seiichi Isojima, Tokyo (JP); Takahisa Nomura, Tokyo (JP); Tomoyuki Horio, Tokyo (JP); Makoto Nanaumi, Tokyo (JP); Kana Horii, Tokyo (JP); Yusuke Hiruma, Tokyo (JP); Takashi Kuroda, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 929 days.

(21) Appl. No.: 17/419,050

(22) PCT Filed: Dec. 27, 2019

(86) PCT No.: PCT/JP2019/051630
§ 371 (c)(1),
(2) Date: Jun. 28, 2021

(87) PCT Pub. No.: WO2020/138502
PCT Pub. Date: Jul. 2, 2020

(65) Prior Publication Data
US 2022/0075227 A1    Mar. 10, 2022

(30) Foreign Application Priority Data

Dec. 28, 2018  (JP) ................................. 2018-247909
Feb. 20, 2019  (JP) ................................. 2019-028249

(51) Int. Cl.
*G02F 1/00*    (2006.01)
*G02F 1/1333*  (2006.01)
(Continued)

(52) U.S. Cl.
CPC ...... *G02F 1/0063* (2013.01); *G02F 1/133305* (2013.01); *G02F 1/133509* (2013.01);
(Continued)

(58) Field of Classification Search
CPC ................. G02F 1/0009; G02F 1/0063; G02F 1/133305; G02F 1/133528
See application file for complete search history.

(56) References Cited

U.S. PATENT DOCUMENTS

2014/0247486 A1  9/2014  Shibata et al.
2016/0077267 A1  3/2016  Inagaki
(Continued)

FOREIGN PATENT DOCUMENTS

CN  101133347    2/2008
JP  2012-234164  11/2012
(Continued)

OTHER PUBLICATIONS

International Search Report of PCT/JP2019/051630, Mar. 17, 2020, 10 pages including English translation.
(Continued)

*Primary Examiner* — Joseph P Martinez
(74) *Attorney, Agent, or Firm* — HSML P.C.

(57) ABSTRACT

Provided is an optical film which can promise to be thinner and makes it possible to enhance adhesion between a first functional layer and a second functional layer; and a polarizing plate and an image display device both of which include such an optical film. One aspect of the present invention is to provide an optical film 10 including a light-transmitting base material 11, a first functional layer
(Continued)

12, and a second functional layer 13 in this order, and further including a mixed layer 14; wherein at least one of the first functional layer 12 and the second functional layer 13 contains an ultraviolet absorber; wherein the mixed layer 14 is provided between the first functional layer 12 and the second functional layer 13, is adjacent to the first functional layer 12 and the second functional layer 13, and contains a component of the first functional layer 12 and a component of the second functional layer 13; wherein the total film thickness of the first functional layer 12, the second functional layer 13, and the mixed layer 14 is 1 μm or more and 10 μm or less; and wherein the ratio of the film thickness of the mixed layer 14 to the total film thickness of the first functional layer 12, the second functional layer 13, and the mixed layer 14 is 0.6% or more and 40% or less.

11 Claims, 17 Drawing Sheets

(51) Int. Cl.
*G02F 1/1335* (2006.01)
*H10K 85/10* (2023.01)
*H10K 50/86* (2023.01)
*H10K 59/80* (2023.01)

(52) U.S. Cl.
CPC ....... *G02F 1/133528* (2013.01); *H10K 85/10* (2023.02); *H10K 50/865* (2023.02); *H10K 59/8792* (2023.02)

(56) References Cited

U.S. PATENT DOCUMENTS

2017/0306093 A1* 10/2017 Matsumaru ................ C08J 5/18
2019/0196075 A1 6/2019 Iwasaki et al.
2019/0391308 A1 12/2019 Nomura et al.

FOREIGN PATENT DOCUMENTS

| JP | 2014-126662 | 7/2014 |
|---|---|---|
| JP | 2016-200709 | 12/2016 |
| JP | 2017-155213 | 9/2017 |
| JP | 2017-182080 | 10/2017 |
| JP | 2018-010086 | 1/2018 |
| JP | 6376126 | 8/2018 |
| JP | 2018-169513 | 11/2018 |
| TW | 201731677 | 9/2017 |
| TW | 201806764 | 3/2018 |
| TW | 201827231 | 8/2018 |
| WO | 2017/115784 | 7/2017 |
| WO | 2017/200042 | 11/2017 |
| WO | 2018/074102 | 4/2018 |
| WO | 2018/143167 | 8/2018 |

OTHER PUBLICATIONS

International Preliminary Report on Patentability, issued in the corresponding PCT Application No. PCT/JP2019/051630, dated Jun. 16, 2021, 22 pages (including translation).

* cited by examiner

OPTICAL FILM, POLARIZER PROTECTIVE FILM, TRANSFER BODY FOR POLARIZER PROTECTIVE FILM, POLARIZATION PLATE, IMAGE DISPLAY DEVICE, AND METHOD FOR MANUFACTURING POLARIZER PROTECTIVE FILM

CROSS-REFERENCE TO RELATED APPLICATION

The present application enjoys the benefit of priority to the prior Japanese Patent Application No. 2018-247909 (filed on Dec. 28, 2018) and Japanese Patent Application No. 2019-28249 (filed on Feb. 20, 2019), the entire disclosure of both of which is incorporated herein by reference.

TECHNICAL FIELD

The present invention relates to an optical film, a polarizer protective film, a polarizer protective film transferring member, a polarizing plate, an image display device, and a method of producing a polarizer protective film.

BACKGROUND ART

In recent years, an image display device such as a smartphone has been developed, in which an organic light-emitting diode (OLED) element is used as a display element. Differently from a light-receiving type display device typified by a liquid crystal display device, an image display device using an organic light-emitting diode element is a self-light-emitting type display device, does not need a light source such as a backlight device, and thus, can promise to be thinner and more lightweight.

On the other hand, an OLED element can be deteriorated by ultraviolet light, and thus, a functional layer such as an adhesive layer of an optical film incorporated in an image display device contains an ultraviolet absorber in some cases (see, for example, Patent Documents 1 and 2).

In addition, Patent Document 2 discloses that an overcoat layer is provided on a cured layer containing an ultraviolet absorber, wherein the overcoat layer contains substantially no ultraviolet absorber or a smaller amount of ultraviolet absorber than the cured layer.

Furthermore, a film having a cycloolefin polymer base material (COP base material) and a hard coat layer provided on the COP base material is currently used as a polarizer protective film provided to protect a polarizer and arranged on the observer's side of the polarizer (see, for example, Patent Document 1).

PRIOR ART DOCUMENTS

Patent Documents

Patent Document 1: JP2017-155213A
Patent Document 2: JP2016-200709A

SUMMARY OF INVENTION

Currently, an even thinner image display device is demanded. Accordingly, a thinner optical film to be incorporated in an image display device is also demanded. In response to such a demand for a thinner film, a thinner functional layer in an optical film is under study.

However, simply allowing the functional layer to have a smaller film thickness leads to increasing the concentration of the ultraviolet absorber in the functional layer, and thus, results in decreasing the reaction rate of a polymerizable compound to be polymerized with ultraviolet light to form the functional layer. Accordingly, the functional layer containing an ultraviolet absorber results in having low adhesion with another functional layer adjacent to that functional layer.

In addition, simply allowing the functional layer to have a smaller film thickness leads to increasing the concentration of the ultraviolet absorber in the functional layer, and thus, will undesirably decrease the surface hardness and scratch resistance of the functional layer. In this regard, such a decrease in surface hardness and scratch resistance is more likely to generate scratches in processing steps.

In addition, allowing the concentration of the ultraviolet absorber in the functional layer to increase is more likely to cause the ultraviolet absorber to precipitate, and thus, will undesirably decrease the endurance.

Here, in cases where two functional layers, for example, a cured layer and an overcoat layer, are laminated as described in Patent Document 2, and in cases where the total film thickness of the functional layers is small, any extreme difference caused in the concentration of an ultraviolet absorber between these two layers will undesirably generate a crack during an endurance test owing to a difference in thermal shrinkage between the functional layer containing a larger amount of ultraviolet absorber and the functional layer containing a smaller amount of ultraviolet absorber.

In addition, there are some cases where a COP base material is used as the base material of a polarizer protective film, but such a COP base material used as the base material of a polarizer protective film is thick. On the other hand, it is difficult to thin a COP base material, and thus, it is difficult to use a COP base material for a polarizer protective film with a view to further thinning an image display device.

On the other hand, an image displayed on an image display device is sometimes observed in environments such as outdoor venues by users wearing sunglasses. If the sunglasses are polarized sunglasses, the displayed image will undesirably decrease in visibility when observed through polarized sunglasses.

The present invention is designed to solve the above-mentioned problems. That is, an object of the present invention is to provide: an optical film which can promise to be thinner and makes it possible to enhance adhesion between a first functional layer and a second functional layer; and a polarizing plate and an image display device both of which include such an optical film.

In addition, another object of the present invention is to provide: an optical film which can promise to be thinner and has favorable surface hardness, favorable scratch resistance, and favorable endurance; and a polarizing plate and an image display device both of which include such an optical film.

Furthermore, a still another object of the present invention is to provide: a polarizer protective film which can promise to be thinner and makes it possible that a decrease in visibility is inhibited even in cases where a displayed image is observed through polarized sunglasses; a polarizer protective film transferring member, a polarizing plate, and an image display device all of which include such a polarizer protective film; and a method of producing such a polarizer protective film.

The present invention includes the following inventions.
[1] An optical film including a light-transmitting base material, a first functional layer, and a second functional layer in this order; wherein the light-transmitting base material contains at least any one of a cellulose triacetate resin, a cycloolefin polymer resin, and a (meth)acrylic resin; at least one of the first functional layer and the second functional layer contains an ultraviolet absorber; the optical film further comprises a mixed layer provided between the first functional layer and the second functional layer, being adjacent to the first functional layer and the second functional layer, and containing a component of the first functional layer and a component of the second functional layer; the total film thickness of the first functional layer, the second functional layer, and the mixed layer is 1 µm or more and 10 µm or less; and the ratio of the film thickness of the mixed layer to the total film thickness of the first functional layer, the second functional layer, and the mixed layer is 0.6% or more and 40% or less.

[2] An optical film including a light-transmitting base material, a first functional layer, and a second functional layer in this order; wherein at least one of the first functional layer and the second functional layer contains an ultraviolet absorber; the optical film further comprises a mixed layer provided between the first functional layer and the second functional layer, being adjacent to the first functional layer and the second functional layer, and containing a component of the first functional layer and a component of the second functional layer; the total film thickness of the first functional layer, the second functional layer, and the mixed layer is 1 µm or more and 10 µm or less; and the film thickness of the mixed layer is 0.02 µm or more and 1 µm or less.

[3] The optical film according to the above-mentioned [1] or [2], wherein the mixed layer is formed by: applying a composition for the first functional layer to one face of the light-transmitting base material to form a first coating film of the composition, the composition containing at least a polymerizable compound; half-curing the first coating film; forming a second coating film of a composition for the second functional layer on the half-cured first coating film, the composition containing at least a polymerizable compound; and curing the first coating film and the second coating film.

[4] The optical film according to any one of the above-mentioned [1] to [3], wherein the film thickness of the mixed layer is 0.1 µm or more.

[5] The optical film according to any one of the above-mentioned [1] to [4], wherein the first functional layer and the second functional layer each contain the ultraviolet absorber.

[6] The optical film according to any one of the above-mentioned [1] to [5], wherein the first functional layer contains the ultraviolet absorber, and wherein the first functional layer has an indentation hardness of 50 MPa or more and 600 MPa or less.

[7] An optical film including a light-transmitting base material and a functional layer; wherein the functional layer contains an ultraviolet absorber containing a nitrogen atom; wherein the functional layer has a film thickness of 1 µm or more and 10 µm or less; the ratio of the intensity of secondary ions derived from the ultraviolet absorber in a second region to the intensity of secondary ions derived from the ultraviolet absorber in a first region is 1.1 or more and 4.0 or less, and the ratio of the intensity of secondary ions derived from the ultraviolet absorber in a third region to the intensity of the secondary ions derived from the ultraviolet absorber in the second region is 1.2 or more and 4.0 or less, the first region including the surface of the functional layer and having a thickness of 0.3 µm, the second region including a bisector that bisects the functional layer in the depth direction of the functional layer, and having a thickness of 0.3 µm, and the third region including the back face of the functional layer and having a thickness of 0.3 µm; wherein the intensities of the secondary ions are measured in the depth direction of the functional layer by time-of-flight secondary ion mass spectrometry.

[8] The optical film according to the above-mentioned [7], wherein the smallest intensity of the secondary ions derived from the ultraviolet absorber in the first region is smaller than the smallest intensity of secondary ions derived the ultraviolet absorber in a fourth region ranging from the boundary on the light-transmitting base material side of the first region in the functional layer to the back face.

[9] The optical film according to the above-mentioned [7] or [8], wherein the functional layer contains at least one of a fluorine atom-containing compound and a silicon atom-containing compound.

[10] The optical film according to the above-mentioned [9], wherein the functional layer contains the fluorine atom-containing compound, and wherein the intensity of secondary ions derived from the fluorine atom-containing compound in the first region is larger than the intensity of secondary ions derived from the fluorine atom-containing compound in each of the second region and the third region, as measured by the time-of-flight secondary ion mass spectrometry.

[11] The optical film according to the above-mentioned [9] or [10], wherein the functional layer contains the silicon atom-containing compound, and wherein the intensity of secondary ions derived from the silicon atom-containing compound in the first region is larger than the intensity of secondary ions derived from the silicon atom-containing compound in each of the second region and the third region, as measured by the time-of-flight secondary ion mass spectrometry.

[12] A polarizing plate including: the optical film according to any one of the above-mentioned [1] to [11]; and a polarizer provided on one face of the optical film.

[13] An image display device including: a display element; and the optical film according to any one of the above-mentioned [1] to [11] or the polarizing plate according to the above-mentioned [12], wherein the optical film or the polarizing plate is arranged on the observer's side of the display element.

[14] The image display device according to the above-mentioned [13], wherein the display element is an organic light-emitting diode element.

[15] A polarizer protective film having no base material, including: a first resin layer containing a cured product of a first ionizing radiation-curable resin composition; and a second resin layer arranged on one face of the first resin layer and containing a cured product of a second ionizing radiation-curable resin composition containing at least a liquid crystal compound.

[16] The polarizer protective film according to [15], wherein the second resin layer has a film thickness of 0.1 µm or more and 10 µm or less.

[17] The polarizer protective film according to the above-mentioned [15] or [16], wherein the in-plane retardation of the polarizer protective film is 80 nm or more and 220 nm or less at a wavelength of 589 nm.

[18] The polarizer protective film according to the above-mentioned [15] or [16], wherein the first resin layer has a larger indentation hardness than the second resin layer.

[19] The polarizer protective film according to any one of the above-mentioned [15] to [18], wherein the polarizer protective film has a thickness of 15 µm or less.

[20] The polarizer protective film according to any one of the above-mentioned [15] to [19], wherein the first resin layer contains an ultraviolet absorber.

[21] A polarizer protective film transferring member, including: the polarizer protective film according to any one of the above-mentioned [15] to [20]; and a release film provided on the first resin layer side of the polarizer protective film.

[22] A polarizing plate including: a polarizer; and the polarizer protective film according to any one of the above-mentioned [15] to [20] attached to the polarizer; wherein the second resin layer in the polarizer protective film is located closer to the polarizer side than the first resin layer.

[23] An image display device including: a display element; and the polarizing plate according to the above-mentioned [22] arranged closer to the observer's side than the display element; wherein the polarizer protective film is located closer to the observer's side than the polarizer.

[24] The image display device according to the above-mentioned [23], wherein the display element is a light-emitting element configured to emit blue light, and the relationship $\lambda 1 > \lambda 2 > \lambda 3$ is satisfied, wherein $\lambda 1$ is the light-emitting peak wavelength of the blue light emitted from the light-emitting element, $\lambda 2$ is the absorption start wavelength of the first resin layer, and $\lambda 3$ is the absorption start wavelength of the second resin layer.

[25] The image display device according to [23] or [24], wherein the display element is an organic light-emitting diode.

[26] A method of producing a polarizer protective film, including the steps of: applying a first ionizing radiation-curable resin composition to one face of a release film and curing the composition by exposure to ionizing radiation to form a first resin layer; applying a second ionizing radiation-curable resin composition containing a liquid crystal compound to the first resin layer side and curing the composition by exposure to ionizing radiation to form a second resin layer on the first resin layer; and removing the release film from the first resin layer.

An aspect of the present invention makes it possible to provide: an optical film which can promise to be thinner and makes it possible to enhance adhesion between a first functional layer and a second functional layer; and a polarizing plate and an image display device both of which include such an optical film.

Another aspect of the present invention makes it possible to provide: an optical film which can promise to be thinner and has favorable surface hardness, favorable scratch resistance, and favorable endurance; and a polarizing plate and an image display device both of which include such an optical film.

A still another aspect of the present invention makes it possible to provide: a polarizer protective film which can promise to be thinner and makes it possible that a decrease in visibility is inhibited even in cases where a displayed image is observed through polarized sunglasses; a polarizer protective film transferring member, a polarizing plate, and an image display device all of which include such a polarizer protective film; and a method of producing such a polarizer protective film.

DESCRIPTION OF EMBODIMENTS

First Embodiment

Figure 1:
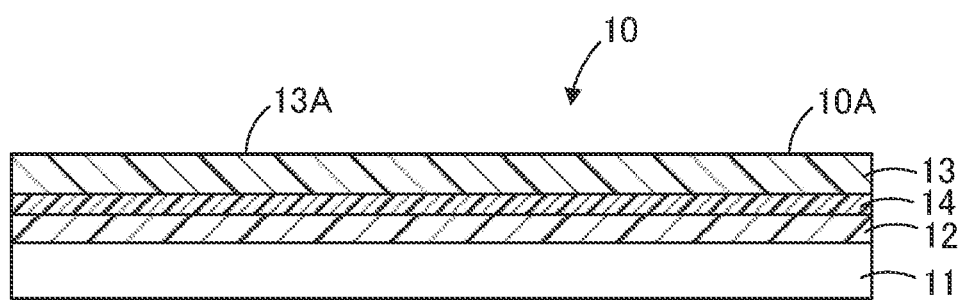
FIG. 1 depicts a schematic diagram of an optical film according to a first embodiment.
Figure 2A:
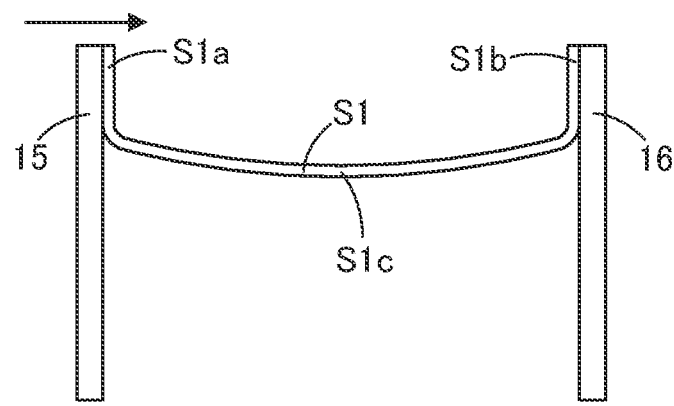
FIG. 2(A) to FIG. 2(C) schematically illustrate the steps of a folding test.
Figure 2B:
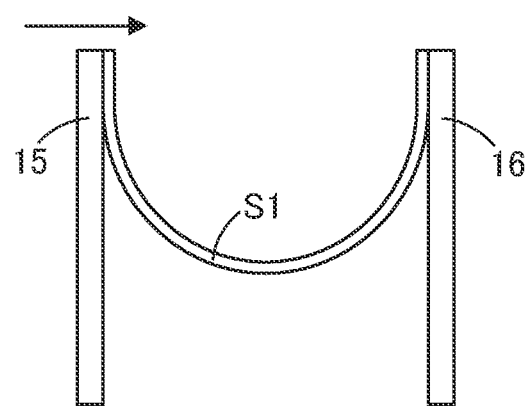
Figure 2C:
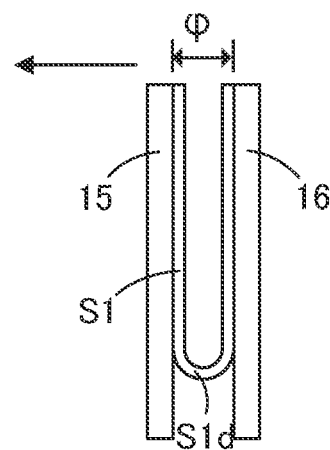
Figure 3:
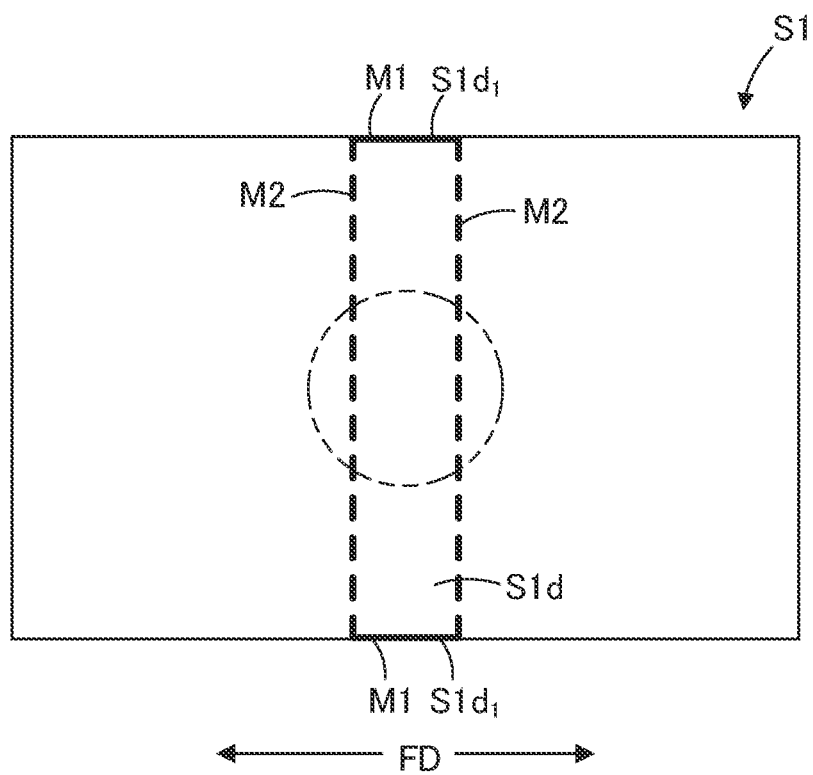
FIG. 3 is a top view of a sample used for the folding test.
Figure 4A:
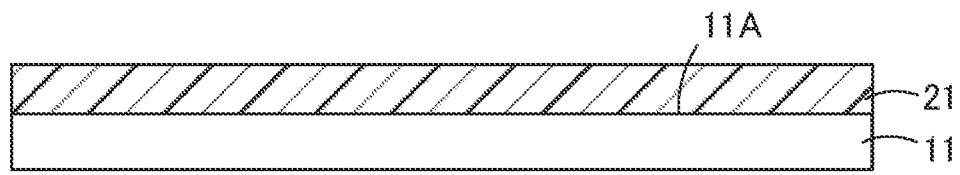
FIG. 4(A) and FIG. 4(B) schematically illustrate the production steps of an optical film according to the first embodiment.
Figure 4B:
Figure 4B:

Below, an optical film and an image display device according to a first embodiment of the present invention will be described with reference to the drawings. As used herein, the terms "film" and "sheet" are not distinguished from each other on the basis of the difference in naming alone. For example, the term "film" is thus used to refer inclusively to a member called "sheet". FIG. 1 is a schematic diagram of an optical film according to the present embodiment. FIG. 2(A) to FIG. 2(C) schematically illustrate the steps of a folding test. FIG. 3 is a top view of a sample used for the folding test. FIG. 4 and FIG. 5 schematically illustrate the production steps of an optical film according to the present embodiment.

<<<<Optical Film>>>>

An optical film 10 depicted in FIG. 1 includes a light-transmitting base material 11, a first functional layer 12, and a second functional layer 13 in this order. The optical film 10 further include a mixed layer 14 formed between the first functional layer 12 and the second functional layer 13. The term "functional layer" as used herein refers to a layer intended to exert some function in an optical film. Specific examples of functional layers include an underlayer for enhancing adhesion with a light-transmitting base material, hard coat layer, spectral transmittance adjustment layer, antiglare layer, invisible layer, refractive index modification layer, antifouling layer, and combinations thereof. The "functional layer" in the present embodiment has a monolayer structure.

The optical film 10 preferably has a thickness (total thickness) of 5 µm or more and 80 µm or less. The optical film 10 having a thickness of 5 µm or more makes it possible to obtain a desired pencil hardness, and in addition, 80 µm or less enables the optical film 10 to promise to be thinner. In addition, controlling the thickness of the optical film 10 in such a manner makes it possible that the thickness of the whole of an image display device having the optical film 10 incorporated therein is made smaller, and consequently that the image display device can be made more lightweight. The optical film 10 preferably has a minimum thickness of 8 µm or more, 10 µm or more, or 15 µm or more in terms of ensuring the mechanical strength of the optical film 10. In addition, the thickness is preferably 50 µm or less, 40 µm or less, or 30 µm or less in terms of making the optical film 10 promise to be even thinner.

Additionally, to impart flexibility to the optical film 10 as below-mentioned, the thickness of the optical film 10 is preferably 73 µm or less, more preferably 63 µm or less, though depending on the kind of a resin for the light-transmitting base material 11. In particular, even though the gap distance φ between the edges in the below-mentioned folding test is small, the thickness of the optical film 10 is preferably 48 µm or less, more preferably 43 µm or less, in terms of not coming closer in the folding direction. In addition, the thickness of the optical film 10 is preferably 21 µm or more, more preferably 28 µm or more, not only to obtain flexibility but also to ensure mechanical strength.

The total film thickness of the first functional layer 12, the second functional layer 13, and the mixed layer 14 is 1 µm or more and 10 µm or less. This total film thickness of 1 µm or more makes it possible to ensure firm adhesion between these layers. In addition, 10 µm or less as this total film thickness makes it possible to make the film promise to be thinner. Here, the thickness of the light-transmitting base material accounts for the majority of that of an optical film according to the present invention. Accordingly, the final design of an image display device in some cases does not enable the light-transmitting base material to be made thinner. Such a case makes it difficult that the above-mentioned whole thickness of the optical film is made 80 µm or less, or 50 µm or less, which affords favorable flexibility in particular, if the thickness of the mixed layer 14 is not made small. To sufficiently ensure the function of a functional layer which is, for example, a 10 µm monolayer, a component for exerting the function conventionally needs to be added in a large amount to the functional layer, and as a result, a component capable of imparting adhesion with a light-transmitting base material in the functional layer results in being insufficient, not making it possible at all to afford favorable adhesion. Accordingly, to obtain a sufficient amount of the component for imparting adhesion with the light-transmitting base material, the concentration of the component for exerting the function of the functional layer needs to be decreased. In order that such a function as obtained by the above-mentioned 10 µm monolayer functional layer can be sufficiently ensured in such a state where the concentration of this component is decreased, the film thickness of the functional layer has no choice but to be increased. In addition, the above-mentioned component for imparting adhesion with the light-transmitting base material is conventionally insufficient, and thus, the physical intensity of the optical film is also insufficient.

This total film thickness is preferably a minimum of 1.5 µm or more, 2 µm or more, or 2.5 µm or more in terms of ensuring the mechanical strength. In addition, this total film thickness may be a maximum of 9 µm or less, 8 µm or less, or 5 µm or less in terms of making the film promise to be even thinner.

The surface 10A of the optical film 10 depicted in FIG. 1 is the surface 13A of the second functional layer 13. However, in cases where the third functional layer is formed on the surface of the second functional layer, the surface of the optical film is the surface of the third functional layer. The "surface of the functional layer" as used herein refers to the opposite side of the functional layer from the light-transmitting base material side.

The optical film 10 preferably has a spectral transmittance of less than 10% at a wavelength of 380 nm. The optical film 10 having a spectral transmittance of less than 10% at a wavelength of 380 nm makes it possible to inhibit the photo-deterioration of the polarizer. The above-mentioned spectral transmittance at a wavelength 380 nm is more preferably 8% or less, 5% or less, or 1% or less in terms of further inhibiting the photo-deterioration of the polarizer.

The optical film 10 preferably has a spectral transmittance of 20% or less at a wavelength of 410 nm. The optical film 10 having a spectral transmittance of 20% or less at a wavelength of 410 nm makes it possible to inhibit the photo-deterioration of a display element, for example, an OLED element. The above-mentioned spectral transmittance at a wavelength 410 nm is more preferably 18% or less, 15% or less, or 10% or less in terms of further inhibiting the photo-deterioration of a display element.

The optical film 10 preferably has a spectral transmittance of 75% or more at a wavelength of 440 nm. The optical film 10 having a spectral transmittance of 75% or more at a wavelength of 440 nm makes it possible to inhibit the visibility from being decreased by coloration. The above-mentioned spectral transmittance at a wavelength 440 nm is more preferably 78% or more, 80% or more, or 85% or more in terms of further inhibiting the visibility from being decreased by coloration.

The spectral transmittance of an optical film should be determined by: cutting a piece having a size of 50 mm×50 mm out of the optical film; arranging the resulting piece of film into a spectrophotometer capable of measuring the transmittance in units of 0.5 nm (product name "UV-2450" manufactured by Shimadzu Corporation; light source: tungsten and deuterium lamps) in such a manner that the light-transmitting base material of the optical film faces toward the light source; measuring the transmittance at minimally five points which are each within 1 nm centered at a wavelength of 380 nm, 410 nm, and 440 nm under the following measurement conditions; and calculating the means of the values. The arithmetic mean of three measurements made at each wavelength of 380 nm, 410 nm, and 440 nm is regarded as the spectral transmittance at the wavelength. Additionally, in cases where fluctuations are observed in the spectral transmittance curve, the curve may be smoothed with a delta of 5.0 nm. Additionally, in cases where the optical film cannot be cut to the above-mentioned size, the film does not need to have the above-mentioned size provided that the film is equal to or larger than 15 mm×40 mm.

(Measurement Conditions)
Wavelength range: 300 nm to 780 nm
Scan speed: high
Slit width: 2.0
Sampling interval: Auto (0.5-nm intervals)
Illumination: C
Light source: D2 and WI
Visual field: 2°
Light source switching wavelength: 360 nm
S/R switching: standard
Detector: PM
Auto-zero: performed at 550 nm after baseline scan
Temperature: 23±5° C.
Relative humidity: 30% or more and 70% or less The spectral transmittance of the optical film 10 may be less than 1%, extremely low, at a wavelength up to 380 nm, exhibit a gradual increase in the wavelength range of from 410 nm upward, and exhibit a sharp increase at a wavelength of approximately 440 nm. Specifically, for example, the spectral transmittance of the optical film 10 may vary sigmoidally in the wavelength range of from 380 nm to 440 nm.

The optical film 10 preferably has a blue light blocking rate of 20% or more. The blue light blocking rate of 20% or more makes it possible to fully solve the below-mentioned problems due to blue light. For example, the blue light blocking rate of an optical film is determined by: first cutting a piece having a size of 50 mm×50 mm out of the optical film; arranging the resulting piece of film into a spectrophotometer capable of measuring the spectral transmittance in units of 0.5 nm (product name "UV-2450" manufactured by Shimadzu Corporation; light source: tungsten and deuterium lamps) in such a manner that the light-transmitting base material of the optical film faces toward the light source; and measuring the transmittance at minimally five points which are each within 1 nm centered at a wavelength of 300 nm to 780 nm. Then, the blue cut-off rate is determined in accordance with the following mathematical equation (1), where A represents the blue light cut-off rate (%), B represents the mean transmittance (%) in the wavelength range of from 380 nm to 500 nm, and C represents the mean transmittance (%) in the wavelength range of from 500 nm to 650 nm. The arithmetic mean of three measurements is regarded as the blue light blocking rate. In addition, the conditions for measuring the spectral transmittance are the same as the above-mentioned conditions for measuring the spectral transmittance at a wavelength of 380 nm, 410 nm, and 440 nm.

$$A=\{1-(B/C)\}\times 100 \quad (1)$$

The optical film 10 preferably has a yellow index (YI) of 15 or less. The optical film 10 having a YI of 15 or less makes it possible to inhibit the yellow tint of the optical film 10, and can be used for applications that needs transparency. The yellow index (YI) is obtained by: cutting a piece having a size of 50 mm×50 mm out of an optical film; arranging the resulting piece of film into a spectrophotometer (product name "UV-2450" manufactured by Shimadzu Corporation; light source: tungsten and deuterium lamps) in an environment at a temperature of 23±5° C. and a relative humidity of 30% or more and 70% or less in such a manner that the light-transmitting base material faces toward the light source; measuring the transmittance of the optical film in the wavelength range of from 300 nm to 780 nm; calculating color tristimulus values X, Y, and Z from the obtained values of transmittance in accordance with the formula described in JIS Z8722: 2009; and calculating a yellow index from the obtained tristimulus values X, Y, and Z in accordance with the formula described in ASTM D1925: 1962. The transmittance in the wavelength range of from 300 nm to 780 nm is measured three times for each optical film to calculate three yellow index values, and the yellow index (YI) of the optical film is defined as the arithmetic mean of the three calculated values. In the UV-2450, a yellow index is calculated on a personal computer (PC) connected to the UV-2450 by reading the above-mentioned measurement data of transmittance and selecting the item "YI" in the calculation menu. The conditions for measuring the transmittance in the wavelength range of from 300 nm to 780 nm are the same as the above-mentioned conditions for measuring the spectral transmittance at a wavelength of 380 nm, 410 nm, and 440 nm. As the minimum YI, a lower value is normally preferred in terms of ensuring a high level of transparency, and a YI of 1 or more, 2 or more, or 3 or more, is more preferred in terms of imparting ultraviolet absorbing properties. However, an excessively high YI in turn enhances the yellow tint in some cases. Because of this, the maximum YI is more preferably 10 or less, 7 or less, or 6 or less in terms of further inhibiting the yellow tint of the optical film 10.

The optical film 10 preferably has a total light transmittance of 80% or more. The optical film 10 having a total light transmittance of 80% or more makes it possible to obtain sufficient optical performance. The optical film 10 more preferably has a total light transmittance of 88% or more, 89% or more, 90% or more in terms of further obtaining optical performance.

The above-mentioned total light transmittance is defined as the arithmetic mean of three measurements obtained by: cutting a piece having a size of 50 mm×50 mm out of an optical film; then placing the cut piece without curl or wrinkle and without any dirt such as fingerprints or grime in a haze meter (product name "HM-150" manufactured by Murakami Color Research Laboratory Co., Ltd.) in such a manner that the light-transmitting base material faces toward the light source; and measuring the total light transmittance three times for one optical film using the haze meter in accordance with JIS K7361-1:1997 in an environment at a temperature of 23±5° C. and a relative humidity of 30% or more and 70% or less. The phrase "measuring three times" as used herein should refer not to measuring at the same position three times but to measuring at three different positions. The surface of the optical film 10 is visually determined to be flat, and also a laminated layer such as the first functional layer 12 is flat. In addition, a deviation in the film thickness is within ±10%, preferably ±5%, of the mean thickness value. Accordingly, it is considered that an approximate mean total light transmittance of the whole optical film can be obtained by measuring the total light transmittance at three different positions on the piece cut out of the optical film. Additionally, if a sample having the above-mentioned size cannot be cut out of the optical film, a sample having a size 21 mm or more in diameter is required because, for example, the HM-150 haze meter has an entrance port aperture having a diameter of 20 mm for use in the measurement. Thus, a piece having a size equal to or larger than 22 mm×22 mm may be cut out of the optical film as appropriate. In cases where the piece of the optical film is small in size, the optical film is gradually shifted or turned to the extent that the light source spot is within the piece of the optical film to secure three measurement positions. The total light transmittance deviation obtained from the optical film 10 is within ±10% of the mean total light transmittance even if a measurement object has a size as large as 1 m×3000 m or as large as a 5-inch smartphone.

The optical film 10 preferably has a haze value (total haze value) of 1% or less. In cases where the haze value of the optical film 10 is 1% or less and where the optical film 10 is used in a mobile device, the screen of the device can be inhibited from turning white in color. The maximum haze value of the optical film 10 is more preferably 0.5% or less, 0.4% or less, 0.3% or less, or 0.2% or less in terms of further inhibiting such whitening.

The above-mentioned haze value can be measured using a haze meter (product name "HM-150" manufactured by Murakami Color Research Laboratory Co., Ltd.) by a method in accordance with JIS K7136: 2000 in an environment at a temperature of 23±5° C. and a relative humidity of 30% or more and 70% or less. Specifically, the haze value is measured by the same measurement method as the total light transmittance.

The pencil hardness on the surface 10A of the optical film 10 is preferably 3B to 2H. The pencil hardness test should be performed by: cutting a piece having a size of 50 mm×100 mm out of an optical film; and moving a pencil (product name "uni" manufactured by Mitsubishi Pencil Co., Ltd.) on the surface of the piece under a load of 300 g at a speed of 3 mm/second using a pencil hardness testing machine (product name "Pencil Scratch Hardness Tester (electric type)" manufactured by Toyo Seiki Seisaku-sho, Ltd.) in an environment at a temperature of 23±5° C. and a relative humidity of 30% or more and 70% or less. The grade of the hardest pencil that does not scratch the surface of the optical film 10 during the pencil hardness test is regarded as the pencil hardness of the optical film. A plurality of different pencils having different hardnesses are used for the measurement of pencil hardness, and the pencil hardness test is repeated five times for each pencil. In cases where no scratch is made on the surface of the optical film 10 with a pencil with a specific hardness in four or more out of the five replicates, the pencil with the hardness is determined to be one which has made no scratch on the surface of the optical film 10. The above-mentioned scratch refers to a scratch which is visibly recognized when the surface of an optical film 10 subjected to the pencil hardness test is observed under transmitting fluorescent light.

It is preferable that the optical film 10 is not cracked or broken even after undergoing a test (folding test) repeatedly 100,000 times, 200,000 times, 500,000 times, or 1,000,000 times in an environment at a temperature of 23±5° C. and a relative humidity of 30% or more and 70% or less, wherein the test includes: folding the optical film 10 180° in such a manner that the gap distance $\varphi$ between the opposing edges of the optical film 10 reaches 6 mm and that the second functional layer 13 faces inward; and then unfolding the folded optical film. In cases where the resulting optical film 10 is, for example, cracked or broken after undergoing the folding test repeatedly 100,000 times, it means that the optical film 10 has low foldability. As the number of times of folding is increased, the formation of cracks or breaks is promoted. Accordingly, from a technical viewpoint, there is a significant difference between an optical film which is neither cracked nor broken after undergoing the folding test repeatedly 200,000 times, 300,000 times, 500,000 times, or 1,000,000 times and an optical film which is neither cracked nor broken after undergoing the folding test repeatedly 100,000 times. Moreover, the reason why the above-mentioned folding test is repeated at least 100,000 times for evaluation purposes is as described below. For example, assuming that an optical film is incorporated in a foldable smartphone, the frequency of folding (the frequency of opening and closing) is very high. Thus, an evaluation obtained by the above-mentioned folding test based on, for example, 10,000 or 50,000 times of folding is unlikely to be practically meaningful. Specifically, assuming, for example, a person who constantly uses a smartphone, the smartphone is supposed to be opened and closed at a frequency of 5 to 10 times even during a morning commute by, for example, train or bus, and is supposed to be opened and closed at least 30 times even in one day. Thus, assuming that a smartphone is opened and closed 30 times in one day, a folding test with 10,000 folding events is considered as a test assuming that the smartphone is used for one year because 30 times multiplied by 365 days equals 10,950 times. It means that an optical film in the smartphone will undesirably be cracked or broken after using the smartphone for one year, even if the optical film presents a good evaluation result in the folding test with 10,000 folding events. Accordingly, an evaluation obtained by the folding test with 10,000 folding events is only sufficient for identification of optical films with a level for which the optical films are not usable as commercial products, and even optical films that can be used but are insufficient are evaluated as good in such a folding test and are not able to be properly evaluated. Thus, the evaluation should be performed by the above folding test with at least 100,000 folding events, to assess whether or not an optical film is practically sufficient. It is more preferable that the optical film 10 is neither cracked nor broken even after undergoing 100,000 times of folding and unfolding in such a manner that the gap distance $\varphi$ between the opposing edges of the optical film 10 reaches 6 mm and that the second functional layer 13 faces outward.

In the above-mentioned folding test, the optical film 10 is folded in such a manner that the gap distance $\varphi$ between the opposing edges reaches 6 mm. However, in terms of making image display devices promise to be thinner, it is more preferable that the optical film 10 is neither cracked nor broken even after undergoing a folding test repeatedly 100,000 times, wherein the test includes: folding the optical film 10 180° in such a manner that the gap distance $\varphi$ between the opposing edges is further reduced, specifically to 4 mm; and unfolding the folded optical film. As the length of the above gap distance $\varphi$ is reduced, it becomes more difficult to avoid formation of cracks or breaks even if the number of folding events is not changed. Accordingly, from a technical viewpoint, there is a significant difference between optical films in which no crack or break is formed after repeating the folding test in which the above gap distance $\varphi$ is 4 mm and those in which no crack or break is formed after repeating the folding test in which the above gap distance $\varphi$ is 6 mm.

When the folding test is performed, a sample S1 with a predetermined size (for example, in a rectangular shape with a size of 125 mm×50 mm) is first cut out from an optical film 10 that has not been subjected to a folding test (see FIG. 2(A)). In cases where a sample having a size of 125 mm×50 mm cannot be cut out of the optical film, such a sample to be cut out of the optical film may be a rectangular sample having a size enough for the below-mentioned evaluations following the folding test, such as 80 mm×25 mm. After the sample S1 is cut out of the optical film 10 that has not been subjected to a folding test, the above folding test is performed on the sample S1.

The folding test is performed by the following procedure. The folding test starts with fixing an edge S1a and an edge S1b, which is opposite to the edge S1a, of the sample S1 to fixing members 15 and 16 arranged parallel to each other, as depicted in FIG. 2(A), of a folding endurance testing machine (for example, product name "Tension Free U-shape Folding Test Machine DLDMLH-FS" manufactured by Yuasa System Co., Ltd.; in accordance with IEC 62715 15-6-1). The sample S1 is fixed by the fixing members 15 and 16 holding the longitudinal edges of the sample S1 within about 10 mm on each side. However, in cases where the sample S1 has a much smaller size than the above-mentioned size, the sample S1 can be fixed to the fixing members 15 and 16 by means of a tape and then be provided for the measurement if the length required for fixing the sample is up to about 20 mm (that is, a sample with the smallest size is 60 mm×25 mm in size). In addition, the fixing members 15 can slide in the horizontal direction, as depicted in FIG. 2(A). Preferably, the above testing machine can conduct an evaluation of the endurance of a sample against bending load without creating tension or friction inside the sample, differing from, for example, a conventional method in which a sample is wrapped around a rod.

Next, the fixing member 15 is moved with the fixing member 16 fixed in such a manner that the fixing member 15 and the fixing member 16 come closer to each other so that the sample S1 can be folded back and deformed about the middle point S1$c$, as depicted in FIG. 2(B); the fixing member 15 is further moved until the gap distance φ between the two opposing edges S1$a$ and S1$b$ of the sample S1 fixed to the fixing members 15 and 16 reaches 6 mm, as depicted in FIG. 2(C); and subsequently, the fixing member 15 is moved in the opposite direction to resolve the deformation of the sample S1.

As depicted in FIG. 2(A) to FIG. 2(C), the fixing member 15 can be moved to allow the sample S1 to be folded 180° back about the middle point S1$c$. In addition, the gap distance φ between the two opposing edges S1$a$ and S1$b$ of the sample S1 can be maintained at 6 mm by performing the folding test under the below-mentioned conditions in such a manner that the bent part S1$d$ of the sample S1 is prevented from being forced out beyond the lower edges of the fixing members 15 and 16 and that the gap distance between the fixing members 15 and 16 is controlled to be 6 mm when they approach each other closest. In this case, the outer diameter of the bent part S1$d$ is regarded as 6 mm. The thickness of the sample S1 is small enough as compared with the gap distance (6 mm) between the fixing members 15 and 16. Thus, a difference in the thickness of the sample S1 can be regarded as having no influence on the result of the folding test on the sample S1.

(Folding Conditions)

Reciprocating speed: 80 rpm (revolutions per minute)
Test stroke: 60 mm
Bend angle: 180°

When the above folding test is performed on the sample S1, creases or microcracks are likely to be created at the bent part in the sample S1 subjected to the folding test even if no crack or break is formed, which potentially will undesirably result in appearance defects, particularly clouding, or interlayer separation (adhesion defect) originating from the microcracks. One of the causes of the clouding is believed to be a change in the crystal structure of an organic compound as a material for any of the layers constituting the optical film. If poor adhesion occurs locally in the optical film, the optical film will undesirably allow water or air to fill the space between separated layers in response to changes in temperature or humidity, which will undesirably expand the area covered by cloud. Recently, displays not with a simple flat design but with various three-dimensional designs, such as folded or curved designs, are increasingly available. Thus, inhibition of crease or microcrack formation on bent parts in optical films is very important to use those optical films in image display devices. Accordingly, the optical film 10 is preferred to have some flexibility. The "flexibility" in the present embodiment refers not only to formation of no crack or break after the above-mentioned folding test, but also to recognition of no crease and microcrack. Accordingly, the "flexibility" in the present embodiment is different from the "flexibility" used in the third embodiment, which only requires that no crack or break is formed after the above-mentioned folding test.

The above-mentioned crease is to be observed visually, and in observing such a crease, the bent part is uniformly observed with transmitted light and reflected light under white illumination (at 800 luxes to 2000 luxes) in a bright room, and both the portion corresponding to the internal side and the portion corresponding to the external side at the bent part after folding are observed. The above-mentioned creases should be observed in an environment at a temperature of 23±5° C. and a relative humidity of 30% or more and 70% or less.

The above-mentioned microcracks should be observed under a digital microscope. Digital Microscope VHX-5000 manufactured by Keyence Corporation is an example of the digital microscope. The microcracks should be observed in reflected light under darkfield conditions using a ring light selected as the light source for the digital microscope. Specifically, the sample subjected to the folding test is first slowly unfolded and is fixed on a stage of the microscope by means of a tape. When the creases are tight, an area to be observed is made as smooth as possible. However, the area to be observed (at the bent part) at and around the center of the sample should not be touched by hand and is protected from any excessive force. Then, the area on both the inner and outer surfaces should be observed under unfolded conditions. The above-mentioned microcracks should be observed in an environment at a temperature of 23±5° C. and a relative humidity of 30% or more and 70% or less.

For observation of the above-mentioned creases and microcracks, marks M1 should be drawn on both the edges S1$d_1$ perpendicular to the folding direction FD in the bent part S1$d$, with a permanent marker, to indicate the position of the bent part for ease of finding the position of an area to be observed, as depicted in FIG. 3, when the sample that has not been subjected to a folding test is fixed to fixing members of the endurance testing machine and is folded once. Moreover, in cases where no crease is observed at all in the sample after the folding test, the sample is dismounted from the endurance testing machine after the folding test, and lines M2 (dotted lines in FIG. 3) connecting the marks M1 on both the edges S1$d_1$ of the bent part S1$d$ may be drawn with a permanent marker to prevent the area to be observed from being missed. Then, the entire region of the bent part S1$d$ formed by the marks M1 on both the edges S1$d_1$ of the bent part S1$d$ and by the lines M2 connecting the marks M1 is visually observed to find creases. Moreover, for observation of microcracks, the microscope is positioned such that the center of the bent part S1$d$ is in alignment of the center of the field of view (the area surrounded by a double dot-dashed line in FIG. 3) of the microscope. It is noted that the marks are not drawn within the area to be observed in the sample by means of, for example, a permanent marker.

In addition, the adhesion between the light-transmitting base material and the first functional layer will undesirably be reduced when the above-mentioned folding test is performed on the sample S1. Thus, it is preferable that no defects, such as separation of layers, are observed near the interfacial boundary between the light-transmitting base material 11 and the first functional layer 12, wherein the bent part of the optical film subjected to the above folding test, particularly the area at and around the interfacial boundary between the light-transmitting base material 11 and the first functional layer 12, is observed with a digital microscope. Examples of digital microscopes include VHX-5000 manufactured by Keyence Corporation.

In cases where an additional film such as a polarizing plate is provided on the optical film through an adhesive or adhesion layer, the additional film and the adhesive or adhesion layer should be removed before the spectral transmittance, YI, total light transmittance, haze value, and pencil hardness are measured, and the folding test should be performed. The additional film can be removed, for example, as below-mentioned. First of all, a laminate composed of an optical film attached to an additional film through an adhesive or adhesion layer is heated using a hair dryer, and is slowly separated by inserting a cutter blade into a possible interfacial boundary between the optical film and the additional film. By repeating such a process of heating and separation, the adhesive or adhesion layer and the additional film can be removed. Even if such a removal process is performed, measurement of the spectral transmittance or the like is not significantly affected.

In this regard, the optical film 10 needs to be cut out into pieces having the above-mentioned sizes, as above-mentioned, when the optical film 10 is used for measurement of the spectral transmittance, YI, total light transmittance, haze value, and pencil hardness, but in cases where the optical film 10 is large (for example, in the shape of a roll), the optical film 10 is cut out at any position into an A5 size (148 mm×210 mm) followed by being cut out into pieces having a size for each measurement item. For example, in cases where the optical film 10 is roll-shaped, the optical film 10 in roll shape is unrolled by a predetermined length, and cut out not at the non-effective region extending along the longitudinal direction of the roll and including both ends but at the effective regions being at and around the central portion and having stable quality. Additionally, to measure the spectral transmittance, YI, total light transmittance, haze value, and pencil hardness of the optical film 10, the above-mentioned devices are used, and to perform the folding test on the optical film 10, the above-mentioned device is used, but without limitation to the devices, equivalent devices such as their successors may be used for the measurement and folding test.

Examples of applications of the optical film 10 include, but are not limited particularly to, image display devices in smartphones, tablet terminals, personal computers (PCs), wearable terminals, digital signage systems, televisions, automotive navigation systems, and the like. In addition, the optical film 10 is also suitable for vehicle applications. The form of each above-mentioned image display device is also preferable for applications which require flexible forms, such as foldable or rollable forms.

The optical film 10 may be cut into a desired size or may be rolled. In cases where the optical film 10 is cut into a desired size, the optical film is not limited to a particular size, and the size of the film is appropriately determined depending on the display size of an image display device. Specifically, the optical film 10 may be, for example, 2.8 inches or more and 500 inches or less in size. The term "inch" as used herein refers to the length of a diagonal when the optical film is rectangular, and to the length of a diameter when the optical film is circular, and to the mean of the major and minor axes when the optical film is elliptical. In this regard, in cases where the optical film is rectangular, the optical film is not limited to any particular aspect ratio when the above-mentioned length in inches is determined, provided that the aspect ratio has no problem with the display screen of an image display device. Examples of the aspect ratio include height-to-width ratios of 1:1, 4:3, 16:10, 16:9, and 2:1. However, particularly for optical films used for vehicle applications and digital signage systems which are rich in designs, the aspect ratio is not limited to the above-mentioned height-to-width ratios. For example, in cases where the optical film 10 is roll-shaped, the optical film 10 in roll shape is unrolled by a predetermined length, and cut out by a desired size not at the non-effective region extending along the longitudinal direction of the roll and including both ends but at the effective regions being at and around the central portion and having stable quality.

<<<Light-Transmitting Base Material>>>

The light-transmitting base material 11 is a base material having light-transmitting properties. The light-transmitting base material 11 contains at least any one of a cellulose acetate resin, cycloolefin polymer resin, and (meth)acrylic resin. An image displayed on an image display device is sometimes observed in environments such as outdoor venues by users wearing sunglasses. If the sunglasses are polarized sunglasses, the visibility of the displayed image will undesirably be reduced owing to rainbow unevenness exhibited when the images are observed through polarized sunglasses. This is considered to be because the light-transmitting base material has a high in-plane retardation (Re). Accordingly, image display devices are currently required to have the ability to inhibit a displayed image from decreasing in visibility even if observed through polarized sunglasses. With respect to this, a base material containing a cellulose acetate resin or a (meth)acrylic base material has an in-plane retardation of 10 nm or less. A light-transmitting base material containing a cycloolefin polymer resin is either a base material the retardation of which is not adjusted or a base material the retardation of which is adjusted to, for example, $\lambda/4$. A base material the retardation of which is not adjusted has an in-plane retardation of 10 nm or less, and a base material the retardation of which is adjusted has an in-plane retardation of 150 nm or less. Accordingly, a light-transmitting base material 11 containing any one of a cellulose acetate resin, cycloolefin polymer resin, or (meth)acrylic resin has a low in-plane retardation, and thus, makes it possible to inhibit a decrease in the visibility of a displayed image observed through polarized sunglasses. The above-mentioned in-plane retardation is a value measured at a wavelength of 589 nm.

Examples of cellulose acetate resins include cellulose triacetate resins and cellulose diacetate resins. The cellulose triacetate resin is a resin capable of having a mean light transmittance of 50% or more in the visible light range of from 380 to 780 nm. The cellulose triacetate resin preferably has a mean light transmittance of 70% or more, more preferably 85% or more.

In this regard, a cellulose triacetate resin may be not only pure cellulose triacetate but also a resin in which a component other than acetic acid is combined as a fatty acid for forming an ester with cellulose, examples of such fatty acids including cellulose acetate propionate or cellulose acetate butyrate. In addition, these cellulose triacetates may include other lower cellulose fatty acid esters, such as cellulose diacetate, if necessary.

Examples of the cycloolefin polymer resin can include norbornene resins, monocyclic olefin resins, cyclic conjugated diene resins, vinyl alicyclic hydrocarbon resins, and hydrides thereof. Among these, norbornene resins have favorable transparency and moldability, and thus, can be suitably used.

Examples of the norbornene resins can include ring-opening polymers composed of norbornene-based monomers, ring-opening copolymers composed of norbornene-based monomers and other monomers, or hydrides thereof, and addition polymers composed of norbornene-based monomers, addition copolymers composed of norbornene-based monomers and other monomers, or hydrides thereof.

Commercially available cycloolefin polymer resins include, for example, tradename "ZEONEX (registered trademark)" and "ZEONOR (registered trademark)" (norbornene resins) manufactured by ZEON Corporation, tradename "SUMILITE (registered trademark) FS-1700" manufactured by Sumitomo Bakelite Co., Ltd., tradename "ARTON (registered trademark)" (modified norbornene resins) manufactured by JSR Corporation, tradename "APEL (registered trademark)" (cyclic olefin copolymers) manufactured by Mitsui Chemicals Inc., tradename "Topas (registered trademark)" (cyclic olefin copolymers) manufactured by Ticona, and tradename "OPTREZ OZ-1000 series" (alicyclic acrylic resins) manufactured by Hitachi Chemical Co., Ltd. A light-transmitting base material can be obtained by forming such a cycloolefin polymer resin into a film. The method of forming a film is not limited to any particular one, and a known method of forming a film, such as a solvent casting method or a melt-extrusion method, can be used. In addition, cycloolefin polymer films are also commercially available, and can be used as light-transmitting base materials. Examples of cycloolefin polymer films include: tradename "S—SI NA (registered trademark)" and "SCA40" manufactured by Sekisui Chemical Co., Ltd.; tradename "ZEONOR Film (registered trademark)" manufactured by Zeon Corporation; tradename "ARTON (registered trademark) Film" manufactured by JSR Corporation; and the like.

Examples of (meth)acrylic resins include poly(methyl (meth)acrylate), poly(ethyl(meth)acrylate), and methyl (meth)acrylate-butyl(meth)acrylate copolymers.

The thickness of the light-transmitting base material 11 is not limited to a particular value, but is preferably 60 µm or less. The light-transmitting base material 11 having a thickness of 60 µm or less enables the film to promise to be even thinner. The light-transmitting base material 11 more preferably has a minimum thickness of 5 µm or more, 10 µm or more, or 15 µm or more in terms of ensuring the mechanical strength of the optical film 10. The light-transmitting base material 11 more preferably has a maximum thickness of 50 µm or less, 45 µm or less, 40 µm or less, 35 µm or less, or 30 µm or less, in terms of making the film promise to be even thinner.

The thickness of the light-transmitting base material can be determined by: imaging a cross-section of the light-transmitting base material using a scanning electron microscope (SEM); measuring the thickness of the light-transmitting base material at 10 different locations within the cross-section of the image; and calculating the arithmetic mean of the thickness values at the 10 locations. The image should be acquired with a scanning electron microscope at a magnification suitable for the thickness of the light-transmitting base material, at which the interfacial boundary between the light-transmitting base material and the functional layer is clearly delineated. Specifically, the magnification is suitably adjusted depending on the thickness of the light-transmitting base material, as the magnification is adjusted, for example, to 1,000 times for 50 µm in the thickness of the light-transmitting base material and to 500 times for 100 µm in the thickness. The light-transmitting base material 11 preferably has a deviation in thickness within 15% or less, 10% or less, or 7% or less. When a scanning transmission electron microscope (STEM) is used to measure the thickness of the light-transmitting base material, the measurement can be performed by the same method as the film thickness of the functional layer is measured. However, a cross-section of the light-transmitting base material is imaged at a magnification of 100 to 20,000 times.

In cases where an optical film, which is required to have some flexibility (for example, foldability), has a thick light-transmitting base material and a thick functional layer, creases and/or microcracks as well as cracks will undesirably be formed on a bent part in the light-transmitting base material and/or the functional layer when the optical film is folded. The formation of cracks, creases, and/or microcracks will undesirably cause appearance defects, particularly clouding, and adhesion defects due to the microcracks. Accordingly, in using the optical film for flexibility applications, control of the thicknesses of the light-transmitting base material and the functional layer and adhesion between layers (adhesion by chemical binding depending on the material, or physical adhesion that does not generate cracks) are important. In particular, in cases where the light-transmitting base material 11 contains a cellulose acetate resin, cycloolefin polymer resin, or (meth)acrylic resin, the likelihood of crack depends on the thickness, and thus, it is important to control the thickness of the light-transmitting base material. However, the preferred thickness of the light-transmitting base material 11 is different between the cases where the optical film 10 is folded to direct the second functional layer 13 inward (bent inward) and where the optical film 10 is folded to direct the second functional layer 13 outward (bent outward).

(Case where Optical Film is Bent Inward)

In cases where the light-transmitting base material 11 contains, for example, a cellulose acetate resin, the thickness of the light-transmitting base material 11 is preferably 15 µm or more and 60 m or less. If the thickness of the light-transmitting base material is excessively small, the light-transmitting base material will undesirably split when folded. However, if the thickness of the light-transmitting base material 11 is 15 µm or more, the light-transmitting base material 11 can be inhibited from splitting when folded. Additionally, in cases where the light-transmitting base material 11 has a thickness of 60 µm or less, the light-transmitting base material 11 can be inhibited from being broken at the bent part when folded, and makes it possible to inhibit clouding at the bent part. In this case, the light-transmitting base material 11 preferably has a maximum thickness of 45 µm or less, 40 µm or less, 35 µm or less, or 30 µm or less, in terms of inhibiting the crack and clouding at the bent part when the film is further folded.

In cases where the light-transmitting base material 11 contains, for example, a cycloolefin polymer resin, the thickness of the light-transmitting base material 11 is preferably 5 µm or more and 50 µm or less. The light-transmitting base material 11 having a thickness of 5 µm or more has favorable handling properties. The light-transmitting base material 11 having a thickness of 50 µm or less can be inhibited from cracking or clouding at the bent part when the light-transmitting base material 11 is folded. In this case, the light-transmitting base material 11 preferably has a maximum thickness of 45 µm or less, 40 µm or less, 30 µm or less, or 18 µm or less, in terms of inhibiting the crack and clouding at the bent part when the film is further folded.

In cases where the light-transmitting base material 11 contains, for example, a (meth)acrylic resin, the light-transmitting base material 11 preferably has a thickness of 15 μm or more and 50 μm or less. The light-transmitting base material 11 having a thickness of 15 μm or more has favorable handling properties. The light-transmitting base material 11 having a thickness of 50 μm or less can be inhibited from cracking or clouding at the bent part when the light-transmitting base material 11 is folded. In this case, the light-transmitting base material 11 preferably has a maximum thickness of 45 μm or less, 40 μm or less, 35 μm or less, or 30 μm or less, in terms of inhibiting the crack and clouding at the bent part when the film is further folded.

In cases where the above-mentioned light-transmitting base material has a thickness of 35 μm or less, the light-transmitting base material 11 has better processing suitability when provided with a protective film attached thereto during production, and thus, are preferable.

(Case where Optical Film is Bent Outward)

In cases where the light-transmitting base material 11 contains, for example, a cellulose acetate resin, cycloolefin polymer resin, or (meth)acrylic resin, the light-transmitting base material 11 preferably has a thickness of 10 μm or more and 50 μm or less. This light-transmitting base material 11 having a thickness of 10 μm or more can absorb various external impacts because the base material is used on the outer side. The light-transmitting base material 11 having a thickness of 50 μm or less can be inhibited from cracking or clouding at the bent part when the light-transmitting base material is folded. In this case, the light-transmitting base material 11 preferably has a maximum thickness of 45 μm or less, or 30 μm or less.

In terms of adhesion between the light-transmitting base material 11 and the first functional layer 12, the light-transmitting base material 11 may be a permeable base material into which a component (for example, a polymerizable compound) of the first functional layer 12 permeates when the first functional layer 12 is formed, but in terms of dimensional stability, the base material is preferably a non-permeable base material into which a component of the first functional layer 12 does not permeate. Examples of permeable base materials include base materials containing a cellulose acetate resin, (meth)acrylic resin, and the like, and examples of non-permeable base materials include base materials containing a cycloolefin polymer resin, and the like.

The surface of the light-transmitting base material 11 may be etched or undercoated beforehand by sputtering, corona discharge treatment, ultraviolet exposure, electron beam exposure, chemical conversion, oxidation, or the like. Such pretreatment can improve the adhesion with, for example, a functional layer formed on the above-mentioned light-transmitting base material 11. In addition, the surface of the light-transmitting base material 11 may be cleaned or cleansed, if necessary, by solvent cleaning, ultrasonic cleaning, or the like before the first functional layer 12 and the like are formed.

<<<First Functional Layer>>>

The first functional layer 12 is an underlayer for enhancing adhesion between the light-transmitting base material 11 and the second functional layer 13. However, the first functional layer 12 may be a layer having another function. In particular, in cases where the light-transmitting base material 11 contains a cycloolefin polymer resin, the light-transmitting base material 11 does not easily adhere to the second functional layer 13, and thus, the first functional layer 12 is preferably arranged between the light-transmitting base material 11 and the second functional layer 13. The first functional layer 12 is adhered to the light-transmitting base material 11. In addition, the first functional layer 12 is light-transmitting.

The first functional layer 12 preferably has a film thickness of 0.1 μm or more and 5 μm or less. The first functional layer 12 having a film thickness of 0.1 μm or more makes it possible to ensure the firm adhesion with the second functional layer 13. In addition, the first functional layer 12 having a film thickness of 5 μm or less not only makes it possible to maintain a desired pencil hardness but also makes it possible to inhibit cracks from being generated by folding or curving. The first functional layer 12 preferably has a minimum film thickness of 0.3 μm or more, 0.5 μm or more, or 1 μm or more in terms of the adhesion with the second functional layer 13. The first functional layer 12 having a film thickness of 0.5 μm or more makes it possible to obtain a hardness which can prevent scratching in production processes. The first functional layer 12 preferably has a maximum film thickness of 4.5 μm or less, 4 μm or less, or 3 μm or less in terms of obtaining a higher pencil hardness.

The interfacial boundary line between the light-transmitting base material and the first functional layer and the interfacial boundary line between the first functional layer and the mixed layer can be recognized on the basis of the difference in contrast in the microscopic image. Thus, the "film thickness of the first functional layer" in the present embodiment refers to a distance between these interfacial boundary lines. The film thickness of the first functional layer can be determined by: imaging a cross-section of the functional layer using a scanning electron microscope (SEM), transmission electron microscope (TEM), scanning transmission electron microscope (STEM), or the like; measuring the film thickness values of the first functional layer at 10 different locations within the image of the cross-section; and calculating the arithmetic mean of film thickness values at the 10 different locations.

Specifically, the method of imaging a cross-section should be as below-mentioned. First of all, a piece having a size of 1 mm×10 mm is cut out of an optical film and embedded in an embedding resin to produce a block, and homogeneous sections having a thickness of approximately 70 nm to 300 nm and having no openings or the like are sliced out of the block according to a commonly used sectioning technique. For the production of sections, an "Ultramicrotome EM UC7" (Leica Microsystems GmbH) or the like is used. Then, the homogeneous sections having no openings or the like are used as measurement samples. Then, cross-section of the measurement sample is imaged using a scanning transmission electron microscope (STEM) (product name "S-4800" manufactured by Hitachi High-Technologies Corporation). The cross-section imaged using the S-4800, with the detector, accelerating voltage, and emission current set to "TE", "30 KV", and "10 μA" respectively, is observed. The focus, contrast, and brightness are suitably adjusted at a magnification of 100 to 100,000 times, preferably 10,000 to 100,000 times depending on the film thickness of the first functional layer, in such a manner that each layer can be identified by observation. To reduce the deviation in measured film thickness values, the observation at a magnification as low as possible is recommended for measuring the film thickness of the first functional layer. For example, the magnification is preferably 20,000 times when the film thickness of the first functional layer is approximately 1 μm, and the magnification preferably ranges from 30,000 to 100,000 times when the film thickness of the first functional layer is approximately 0.5 μm. Furthermore, the condensing lens 1 of "5.0" is used, and W.D. is "8.9 mm".

The first functional layer 12 preferably has an indentation hardness of 50 MPa or more and 600 MPa or less. The first functional layer 12 having an indentation hardness of 50 MPa or more makes it possible to obtain a desired pencil hardness and to inhibit a decrease in the scratch resistance. In addition, the first functional layer 12 having an indentation hardness of 600 MPa or less makes it possible to obtain favorable flexibility and to inhibit generation of cracks in chip-cutting. As used herein, the "indentation hardness" refers to a value determined from a load-displacement curve drawn from the loading to unloading of an indenter. In this regard, the indentation hardness of a layer having too low a hardness, such as an adhesive layer, is unmeasurable in some cases. The first functional layer 12 more preferably has a minimum indentation hardness of 70 MPa or more, 85 MPa or more, 100 MPa or more, or 150 MPa or more in terms of obtaining a higher pencil hardness and favorable scratch resistance. In addition, the first functional layer 12 more preferably has a maximum indentation hardness of 500 MPa or less, 450 MPa or less, 400 MPa or less, or 350 MPa or less in terms of obtaining excellent flexibility and further inhibiting generation of cracks in chip-cutting.

The indentation hardness ($H_{IT}$) can be measured using a TI950 TriboIndenter manufactured by Hysitron, Inc. Specifically, a piece of 1 mm×10 mm is first cut out of an optical film and embedded in an embedding resin to produce a block, from which measurement samples suitable for the hardness measurement by the nanoindentation technique are produced. For the production of measurement samples, a "Ultramicrotome EM UC7" (Leica Microsystems GmbH) or the like can be used. Then, the measurement sample is fixed on the stage of a TI950 TriboIndenter manufactured by Hysitron, Inc., in such a manner that the surface of the measurement sample to which an indenter is to be pressed is arranged parallel to the top surface of the stage. Then, a Berkovich indenter is pressed into the central flat portion of the cross-section of the first functional layer using a load control method at a loading rate of 10 μN/second under a load applied for 30 seconds starting at 0 μN and ending at 300 μN so that the maximum indentation load can become 300 μN. Here, a Berkovich indenter should be pressed into a portion of the functional layer in order to avoid the influence of the side edges of the first functional layer, wherein the portion is at least 500 nm away from both the side edges of the first functional layer toward the central part of the first functional layer. Subsequently, the indenter is held at 300 μN for 5 seconds, and then unloaded from 300 μN to 0 μN over 30 seconds. Then, an indentation depth h (nm) corresponding to an indentation load F(N) thus obtained is continuously measured to prepare a load-displacement curve. From the prepared load-displacement curve, an indentation hardness $H_{IT}$ can be determined in accordance with the below-mentioned mathematical equation (2) using a value obtained by dividing the maximum indentation load $F_{max}$(N) by a projection area $A_p$ (mm$^2$) over which the indenter is in contact with the first functional layer. The arithmetic mean of the measurements at 10 different positions is regarded as the indentation hardness. In addition, the measurement of the indentation hardness is performed in an environment at a temperature of 23±5° C. and a relative humidity of 30% or more and 70% or less.

$$H_{IT}=F_{max}/A_p \quad (2)$$

wherein, $A_p$ is a value determined in accordance with the following mathematical equation (3):

$$A_p=23.96(h_{max}-0.75(h_{max}-h_r))^2 \quad (3)$$

In the mathematical equation (3), $h_{max}$ is a maximum indentation depth, and $h_r$ is a value of the intersection between a line tangent to an unloading curve at $F_{max}$ and the abscissa (displacement).

The first functional layer 12 contains a resin and an ultraviolet absorber. In this regard, the ultraviolet absorber needs only to be contained in one of the first functional layer 12 and the second functional layer 13, and does not necessarily need to be contained in the first functional layer 12. The first functional layer 12 may contain a polymerization initiator and/or a residue thereof, in addition to a resin and an ultraviolet absorber.

<<Resin>>

The resin contained in the first functional layer 12 includes a polymer (cured product) of a polymerizable compound. The resin may contain an air-dry curable resin and/or a thermosetting compound, in addition to a polymer of a polymerizable compound.

(Polymerizable Compound)

The polymerizable compound has at least one polymerizable functional group. The "polymerizable functional group" as used herein refers to a functional group which can undergo polymerization reaction. Examples of the polymerizable functional group include ethylenic unsaturated groups such as (meth)acryloyl group, vinyl group, and allyl group. The "(meth)acryloyl group" as used herein refers to an "acryloyl group" or a "methacryloyl group". In addition, examples of types of ionizing radiation applied to induce polymerization of a polymerizable compound include visible light, ultraviolet light, X ray, electron beam, α ray, β ray, and γ ray.

Examples of polymerizable compounds having one ethylenic unsaturated group can include ethyl (meth)acrylate, ethylhexyl(meth)acrylate, styrene, methylstyrene, and N-vinylpyrrolidone. Examples of polymerizable compounds having two or more ethylenic unsaturated groups can include polyfunctional compounds, such as polymethylol propane tri(meth)acrylate, hexanediol(meth)acrylate, tripropylene glycol di(meth)acrylate, diethylene glycol di(meth)acrylate, pentaerythritol tri(meth)acrylate, dipentaerythritol hexa(meth)acrylate, 1,6-hexanediol di(meth)acrylate, and neopentyl glycol di(meth)acrylate; reaction products between the above-mentioned polyfunctional compounds and (meth)acrylates or the like (for example, poly(meth)acrylate esters of polyhydric alcohols).

As the polymerizable compound, a polymerizable monomer, a polymerizable oligomer, and/or a polymerizable prepolymer can be prepared and used as appropriate.

(Air-Dry Curable Resin)

The air-dry curable resin refers to a resin, such as a thermoplastic resin, which forms a coating film just by evaporation of an added solvent for adjustment of the content of solids in a coating process. Combinational use of an air-dry curable resin allows effective prevention of coating failure on a coating surface. The air-dry curable resin which can be used in combination with the above-mentioned polymerizable compound is not limited to a particular resin, and a thermoplastic resin can generally be used as the air-dry curable resin.

Examples of the thermoplastic resin include, but are not limited particularly to, styrene resins, (meth)acrylic resins, vinyl acetate resins, vinyl ether resins, halogen-containing resins, alicyclic olefin resins, polycarbonate resins, polyester resins, polyamide resins, cellulose derivatives, silicone resins, and silicone rubber.

The above-mentioned thermoplastic resin is preferably amorphous and soluble in organic solvents (particularly, common solvents that can dissolve plural polymers and polymerizable compounds). In particular, styrene resins, (meth)acrylic resins, alicyclic olefin resins, polyester resins, cellulose derivatives (such as cellulose esters) and the like are preferred in terms of film-forming property, transparency, and weather resistance.

(Thermosetting Compound)

Examples of the thermosetting compound include, but are not limited particularly to, phenol resin, urea resin, diallylphthalate resins, melamine resins, guanamine resins, unsaturated polyester resins, polyurethane resins, epoxy resins, aminoalkyd resins, melamine-urea condensate resins, silicon resins, and polysiloxane resins.

<Ultraviolet Absorber>

An ultraviolet absorber absorbs at least ultraviolet light (having a wavelength of 10 nm to 400 nm). The ultraviolet absorber may have a maximum absorption wavelength in the visible light range provided that the ultraviolet absorber absorbs ultraviolet light. The ultraviolet absorber preferably has a maximum absorbance of 0.5 or more in the wavelength range of 360 nm or more and 430 nm or less. Examples of ultraviolet absorbers include benzotriazole compounds, indole compounds, benzophenone compounds, triazine compounds, and the like. Among these, benzotriazole compounds and indole compounds are preferable in terms of inhibiting a visibility decrease due to coloration.

Whether the first functional layer 12 contains an ultraviolet absorber can be examined by first collecting a fragment from the first functional layer 12, measuring the fragment by infrared spectroscopic analysis (IR), and comparing the obtained infrared absorption spectrum of the fragment with that of a commercially available ultraviolet absorber. The ultraviolet absorber may be contained in copolymer form in a resin constituting the first functional layer 12.

Examples of benzotriazole compounds include sesamol-bound benzotriazole monomers represented by the below-mentioned general formula (A), 2-[2-hydroxy-3,5-bis(α,α-dimethylbenzyl)phenyl]-2H-benzotriazole (product name "Tinuvin 234"; manufactured by BASF SE), 2-(5-chloro-2-benzotriazolyl)-6-tert-butyl-p-cresol (product name "Tinuvin 326" manufactured by BASF SE), or the like. Among those, sesamol-bound benzotriazole monomers represented by the below-mentioned general formula (A) are preferable in terms of exhibiting a large slope in the spectrum and having the capability of absorbing ultraviolet light more selectively.

[Chem. 1]

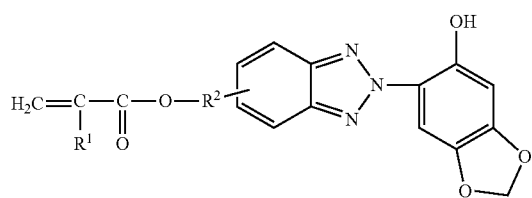

(A)

In the formula, $R^1$ represents a hydrogen atom or methyl group. $R^2$ represents a linear or branched alkylene or oxyalkylene group having 1 to 6 carbon atoms.

A sesamol-bound benzotriazole monomer represented by the above-mentioned general formula (A) is contained as a monomer unit in a resin constituting the first functional layer 12. In addition, a sesamol-bound benzotriazole monomer represented by the above-mentioned general formula (A) is a derivative from a compound in which a sesamol is bound to the nitrogen atom at the 2-position of a benzotriazole ring and which has a molecular structure in which a polymerizable double bond is introduced to the benzene site of the benzotriazole ring. This monomer has a maximum absorption wavelength $\lambda_{max}$ of 365 nm or more, has a wide range of ultraviolet light absorption spectrum encompassing the wavelength range of 300 nm or more and 400 nm or less, and has the ultraviolet light absorption capability in the long-wavelength range up to approximately 400 nm.

The above-mentioned sesamol-bound benzotriazole monomer is not limited to a particular sesamol-bound benzotriazole monomer. Specific examples of the substance include 2-[2-(6-hydroxybenzo[1,3]dioxol-5-yl)-2H-benzotriazol-5-yl]ethylmethacrylate, 2-[2-(6-hydroxybenzo[1,3]dioxol-5-yl)-2H-benzotriazol-5-yl]ethylacrylate, 3-[2-(6-hydroxybenzo[1,3]dioxol-5-yl)-2H-benzotriazol-5-yl]propylmethacrylate, 3-[2-(6-hydroxybenzo[1,3]dioxol-5-yl)-2H-benzotriazol-5-yl]propylacrylate, 4-[2-(6-hydroxybenzo[1,3]dioxol-5-yl)-2H-benzotriazol-5-yl]butylmethacrylate, 4-[2-(6-hydroxybenzo[1,3]dioxol-5-yl)-2H-benzotriazol-5-yl]butylacrylate, 2-[2-(6-hydroxybenzo[1,3]dioxol-5-yl)-2H-benzotriazol-5-yloxy]ethylmethacrylate, 2-[2-(6-hydroxybenzo[1,3]dioxol-5-yl)-2H-benzotriazol-5-yloxy]ethylacrylate, 2-[3-{2-(6-hydroxybenzo[1,3]dioxol-5-yl)-2H-benzotriazol-5-yl}propanoyloxy]ethylmethacrylate, 2-[3-{2-(6-hydroxybenzo[1,3]dioxol-5-yl)-2H-benzotriazol-5-yl}propanoyloxy]ethylacrylate, 4-[3-{2-(6-hydroxybenzo[1,3]dioxol-5-yl)-2H-benzotriazol-5-yl}propanoyloxy]butylmethacrylate, 4-[3-{2-(6-hydroxybenzo[1,3]dioxol-5-yl)-2H-benzotriazol-5-yl}propanoyloxy]butylacrylate, 2-[3-{2-(6-hydroxybenzo[1,3]dioxol-5-yl)-2H-benzotriazol-5-yl}propanoyloxy]ethylmethacrylate, 2-[3-{2-(6-hydroxybenzo[1,3]dioxol-5-yl)-2H-benzotriazol-5-yl}propanoyloxy]ethylacrylate, 2-(methacryloyloxy)ethyl 2-(6-hydroxybenzo[1,3]dioxol-5-yl)-2H-benzotriazole-5-carboxylate, 2-(acryloyloxy)ethyl 2-(6-hydroxybenzo[1,3]dioxol-5-yl)-2H-benzotriazole-5-carboxylate, 4-(methacryloyloxy)butyl 2-(6-hydroxybenzo[1,3]dioxol-5-yl)-2H-benzotriazole-5-carboxylate, and 4-(acryloyloxy)butyl 2-(6-hydroxybenzo[1,3]dioxol-5-yl)-2H-benzotriazole-5-carboxylate. In addition, these sesamol-bound benzotriazole monomers can be used individually or in combination of two or more kinds thereof.

(Indole Compound)

Examples of indole compounds include compounds represented by the below-mentioned general formula (B). A compound represented by the below-mentioned general formula (B) can absorb light in the wavelength range of 380 nm or more and 400 nm or less.

[Chem. 2]

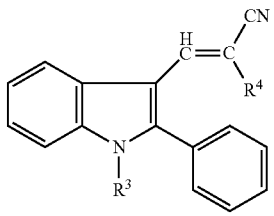

(B)

In the formula (B), $R^3$ represents a linear or branched alkyl group or aralkyl group, and $R^4$ represents —CN or —COOR$^5$, wherein $R^5$ is an alkyl group or aralkyl group optionally having a substituent (however, an ethyl group is excluded in cases where $R^3$ is a methyl group).

$R^3$ can have 1 to 12 carbon atoms. Specific examples of $R^3$ include a methyl group, ethyl group, (iso)butyl group, t-butyl group, hexyl group, octyl group, 2-ethylhexyl group, dodecyl group, benzyl group, and the like. Specific examples of $R^5$ include the above-mentioned groups enumerated for $R^3$, a β-cyanoethyl group, β-chloroethyl group, ethoxypropyl group, hydroxyalkyl group, and alkoxyalkyl group. However, in cases where $R^3$ is a methyl group, $R^5$ is not an ethyl group.

Examples of indole compounds include BONASORB UA-3911 manufactured by Orient Chemical Industries Co., Ltd.

The above-mentioned ultraviolet absorber may be contained, for example, at a concentration of 0.05% by mass or more and 50% by mass or less in the first functional layer 12. Containing an ultraviolet absorber in such a range makes it possible to absorb ultraviolet light effectively. In cases where the above-mentioned ultraviolet absorber is a sesamol-bound benzotriazole compound, the ultraviolet absorber may be contained at a concentration of 0.1% by mass or more and 50% by mass or less in the first functional layer 12.

The first functional layer 12 can be formed, for example, using a composition used for the first functional layer and containing a polymerizable compound or an ultraviolet absorber. Such a composition for the first functional layer contains the above-mentioned polymerizable compound and the like, and may additionally contain a polymerization initiator, a solvent, a leveling agent, and/or the like, if necessary.

(Polymerization Initiator)

A polymerization initiator that can be used is, but not limited particularly to, a known such initiator. One kind or two or more kinds of polymerization initiator(s) may be used. Specific examples of polymerization initiators include acetophenones, benzophenones, Michler's benzoyl benzoate, α-amyloxime esters, thioxantones, propyophenones, benzyls, benzoins, and acylphosphine oxides. In addition, the polymerization initiator is preferably used in mixture with a photosensitizer, and specific examples of photosensitizers include n-butylamine, triethylamine, and poly-n-butylphosphine.

In cases where the above-mentioned polymerizable compound contains a radical polymerizable functional group(s), a radical polymerization initiator that can be used is preferably any one of an acetophenone, benzophenone, thioxanthone, benzoin, and benzoin methyl ether, and these can be used individually or in mixture. Among radical polymerization initiators, for example, 2,4,6-trimethylbenzoyl-diphenyl phosphine oxide (for example, Omnirad TPO manufactured by IGM Resins B.V.), bis(2,4,6-trimethylbenzoyl)phenyl phosphine oxide (for example, Omnirad 819 manufactured by IGM Resins B.V.), 1-hydroxycyclohexyl phenyl ketone (for example, Omnirad 184 manufactured by IGM Resins B.V.), oligo (2-hydroxy-2-methyl-1-(4-(1-methylvinyl)phenyl) propanone) (ESACURE ONE manufactured by DKSH Japan Co., Ltd.), and mixtures thereof are more preferable in terms of inhibiting curing retardation caused by ultraviolet absorbing properties.

Additionally, in cases where the above-mentioned polymerizable compound contains a cationic polymerizable functional group(s), cationic polymerization initiators, such as aromatic diazonium salts, aromatic sulfonium salts, aromatic iodonium salts, metallocene compounds, and benzoin sulfonate, are preferably used individually or in mixture as the polymerization initiator. Among cationic polymerization initiators, aromatic sulfonium salts or the like are more preferable in terms of excellent curing properties.

Additionally, in cases where the light-transmitting base material 11 contains a cycloolefin polymer resin, it is important that the first functional layer 12 is adhered to the light-transmitting base material 11. To adhere such a first functional layer 12 to the light-transmitting base material 11, it is preferable to use an oxime ester compound as a polymerization initiator. Examples of commercially available oxime ester compounds include IRGACURE (registered trademark) OXE01, IRGACURE (registered trademark) OXE02, and IRGACURE (registered trademark) OXE03 (which are all manufactured by BASF Japan Ltd.).

The amount of a polymerization initiator contained in a composition for the first functional layer is preferably 1 part by mass or more and 10 parts by mass or less with respect to 100 parts by mass of the polymerizable compound. The polymerization initiator contained in an amount of 1 part by mass or more affords sufficient hardness to the first functional layer, and 10 parts by mass or less enables ionizing radiation to reach the deep portion of the coating film, thus promoting internal curing and enabling the optical film to obtain a surface hardness of interest (for example, a pencil hardness equal to or harder than 3B).

The polymerization initiator is contained more preferably in a minimum amount of 2 parts by mass or more and more preferably in a maximum amount of 8 parts by mass or less. Causing the polymerization initiator to be contained in amount within this range makes it possible to generate no uneven distribution of hardness in the film thickness direction and thus to promote even distribution of hardness.

(Solvent)

A solvent can be selected and used depending on the type and solubility of a polymerizable compound to be used, and examples of the solvent can include ketones (such as acetone, methyl ethyl ketone, methyl isobutyl ketone, cyclohexanone, and diacetone alcohol), ethers (such as dioxane, tetrahydrofuran, propylene glycol monomethyl ether, and propylene glycol monomethyl ether acetate), aliphatic hydrocarbons (such as hexane), alicyclic hydrocarbons (such as cyclohexane), aromatic hydrocarbons (such as toluene and xylene), halocarbons (such as dichloromethane and dichloroethane), esters (such as methyl acetate, ethyl acetate, and butyl acetate), water, alcohols (such as ethanol, isopropanol, butanol, and cyclohexanol), cellosolves (such as methyl cellosolve and ethyl cellosolve), cellosolve acetates, sulfoxides (such as dimethyl sulfoxide), amides (such as dimethylformamide and dimethylacetamide), and may be mixture solvents thereof.

(Leveling Agent)

The leveling agent is preferably, but is not limited particularly to, a fluorine leveling agent. Using a fluorine leveling agent affords high leveling properties, thus making it possible to provide smoothness and recoatability. Examples of commercially available fluorine leveling agents include F-555 (manufactured by DIC Corporation), F-568 (manufactured by DIC Corporation), and FTERGENT (registered trademark) 683 (manufactured by Neos Company Limited).

The ratio of raw material (solid) contained in a composition for the first functional layer is not limited to a particular value, and is preferably 5% by mass or more and 70% by mass or less, more preferably 15% by mass or more and 60% by mass or less.

The composition for the first functional layer can be prepared using any known apparatus, such as a paint shaker, bead mill, kneader, or mixer, by any method without particular limitation, provided that a homogeneous mixture of all components can be prepared by the method.

Examples of a method of applying the composition for the first functional layer to the light-transmitting base material 11 include, but are not limited particularly to, known coating methods, such as a spin coating method, dipping method, spraying method, die coating method, bar coating method, roll coating method, meniscus coating method, flexography, screen printing method, and bead coating method.

An ionizing radiation source having an emission peak mainly in the wavelength range of from 190 to 450 nm is preferable as an ionizing radiation source used for curing the composition for the first functional layer. Examples of the ionizing radiation source include light sources such as super high pressure mercury lamp, high pressure mercury lamp, low pressure mercury lamp, carbon arc lamp, blacklight fluorescent lamp, and metal halide lamp.

<<Second Functional Layer>>

The second functional layer 13 is a hard coat layer. However, the second functional layer 13 may be a layer having another function. The "hard coat layer" in the present embodiment refers to a layer the indentation hardness of which is larger than that of the first functional layer. The indentation hardness of the second functional layer is determined in the same manner as the indentation hardness of the first functional layer.

The second functional layer 13 preferably has an indentation hardness of 75 MPa or more and 1000 MPa or less. The second functional layer 13 having an indentation hardness of 75 MPa or more makes it possible to obtain a desired pencil hardness, and 1000 MPa or less makes it possible to inhibit generation of cracks. In terms of obtaining a higher pencil hardness, it is more preferable that the second functional layer 13 has a minimum indentation hardness of 100 MPa or more, 150 MPa or more, or 200 MPa or more. In terms of further inhibiting generation of cracks, it is more preferable that the second functional layer 13 has a maximum indentation hardness of 900 MPa or less, 750 MPa or less, 600 MPa or less, or 500 MPa or less. The second functional layer 13 having an indentation hardness of 600 MPa or less makes it possible that the obtained second functional layer 13 has excellent flexibility.

The second functional layer 13 preferably has a film thickness of 0.1 μm or more and 9.8 μm or less. The second functional layer 13 having a film thickness of 0.1 μm or more makes it possible to ensure a desired pencil hardness, and the second functional layer 13 having a film thickness of 9.8 μm or less enables the film to promise to be even thinner, and makes it possible to inhibit cracks from being generated by folding or curving. The second functional layer 13 preferably has a minimum film thickness of 0.3 μm or more, 0.5 μm or more, or 1 μm or more in terms of obtaining a higher pencil hardness. The second functional layer 13 having a film thickness of 0.5 μm or more makes it possible to obtain a hardness which can prevent scratching in production processes. The second functional layer 13 preferably has a maximum film thickness of 8 μm or less, 5 μm or less, 4 μm or less, or 3 μm or less in terms of making the film to promise to be even thinner. The film thickness of the second functional layer 13 can be determined in the same manner as the film thickness of the first functional layer 12.

The second functional layer 13 contains a resin and an ultraviolet absorber. However, the second functional layer does not need to contain an ultraviolet absorber in cases where the first functional layer 12 contains an ultraviolet absorber. The second functional layer 13 may further contain an antiblocking agent to prevent portions of the optical film 10 from sticking to each other when the optical film 10 is wound in roll shape. The resin contained in the second functional layer 13 contains a polymer of a polymerizable compound. The resin may contain an air-dry curable resin and/or a thermosetting compound, in addition to a polymer of a polymerizable compound.

The concentration of the ultraviolet absorber in the second functional layer 13 is preferably lower than the concentration of the ultraviolet absorber in the first functional layer 12. Causing the concentration of the ultraviolet absorber in the second functional layer 13 to be lower than the concentration of the ultraviolet absorber in the first functional layer 12 makes it possible to decrease the bleedout of the ultraviolet absorber and to further enhance the scratch resistance of the surface of the second functional layer 13.

Examples of a polymerizable compound as a component of the second functional layer 13 includes a polymerizable monomer, a polymerizable oligomer, and a polymerizable prepolymer, and these can be prepared and used as appropriate. A combination of a polymerizable monomer and a polymerizable oligomer or a polymerizable prepolymer is preferable as the polymerizable compound.

Examples of polymerizable monomers include monomers containing a hydroxyl group(s), such as 2-hydroxyethyl (meth)acrylate, 2-hydroxypropyl (meth)acrylate, and 2-ethylhexyl(meth)acrylate; and (meth)acrylate esters, such as ethylene glycol di(meth)acrylate, diethylene glycol di(meth)acrylate, triethylene glycol di(meth)acrylate, tetraethylene glycol di(meth)acrylate, tetramethylene glycol di(meth)acrylate, trimethylolpropane tri(meth)acrylate, trimethylolethane tri(meth)acrylate, pentaerythritol di(meth)acrylate, pentaerythritol tri(meth)acrylate, pentaerythritol tetra(meth)acrylate, dipentaerythritol tetra(meth)acrylate, dipentaerythritol hexa(meth)acrylate, and glycerol(meth)acrylate.

The polymerizable oligomer is preferably a polyfunctional oligomer having two or more functional groups, preferably a polyfunctional oligomer having three or more polymerizable functional (trifunctional or more polyfunctional) groups. Examples of the above-mentioned polyfunctional oligomer include polyester (meth)acrylate, urethane (meth)acrylate, polyester-urethane (meth)acrylate, polyether (meth)acrylate, polyol (meth)acrylate, melamine (meth)acrylate, isocyanurate (meth)acrylate, and epoxy (meth)acrylate.

The polymerizable prepolymer has a weight average molecular weight of more than 10,000, preferably a weight average molecular weight of 10,000 or more and 80,000 or less, more preferably 10,000 or more and 40,000 or less. In cases where the polymerizable prepolymer has a weight average molecular weight of more than 80,000, the coating suitability is reduced due to the high viscosity of the prepolymer, which will undesirably deteriorate the appearance of a resulting light-transmitting resin. Examples of polyfunctional prepolymers include urethane (meth)acrylate, isocyanurate (meth)acrylate, polyester-urethane (meth)acrylate, and epoxy (meth)acrylate.

<Ultraviolet Absorber>

An ultraviolet absorber that can be used is the same ultraviolet absorber as described in the section for the first functional layer 12, and thus, is not described here.

The second functional layer 13 can be formed using a composition used for the second functional layer and containing a polymerizable compound and the like. The composition for the second functional layer may contain, in addition to a polymerizable compound and an ultraviolet absorber, an air-dry curable resin, a thermosetting compound, a polymerization initiator, a solvent, and/or the like. In addition, the composition for the second functional layer may contain any one of the below-mentioned various additives, if necessary, to the extent that the effects of the present invention are not compromised. Examples of such additives include inorganic particles, anti-static agents, adhesion-improving agents, leveling agents, thixotropy enhancing agents, coupling agents, plasticizers, antifoam agents, bulking agents, coloring agents, and fillers.

The air-dry curable resin, thermosetting compound, polymerization initiator, solvent, leveling agent, and the like for the composition for the second functional layer are the same as the air-dry curable resin, thermosetting compound, polymerization initiator, solvent, leveling agent, and the like described for the composition for the first functional layer, and thus, are not described here.

The polymerization initiator in the composition for the second functional layer may be the same as, but is preferably different from, the polymerization initiator in the composition for the first functional layer. Allowing the polymerization initiator in the composition for the second functional layer to be different from the polymerization initiator in the composition for the first functional layer makes it possible to select a more easily half-curable polymerization initiator for the composition for the first functional layer and to select a very surface-curable polymerization initiator for the composition for the second functional layer.

<<Mixed Layer>>

The mixed layer 14 contains a component of the first functional layer 12 and a component of the second functional layer 13, and is adjacent to the first functional layer 12 and the second functional layer 13. Forming such a mixed layer 14 makes it possible to enhance adhesion between the first functional layer 12 and the second functional layer 13. Whether the mixed layer 14 contains a component of the first functional layer 12 and a component of the second functional layer 13 can be verified by time-of-flight secondary ion mass spectrometry (TOF-SIMS).

The mixed layer 14 is not limited to any particular forming method provided that the mixed layer 14 contains a component of the first functional layer 12 and a component of the second functional layer 13, and is adjacent to the first functional layer 12 and the second functional layer 13. For example, the mixed layer 14 may be formed by coating the surface of the first functional layer 12 with a composition containing the component of the first functional layer 12 and the component of the second functional layer 13, or may be formed by allowing a coating film of a composition for the first functional layer to be half-cured and coating the surface of this half-cured coating film with a composition for the second functional layer. However, to further enhance the adhesion and make the film promise to be even thinner, the mixed layer is preferably formed by allowing a coating film of a composition for the first functional layer to be half-cured and coating the surface of this half-cured coating film with a composition for the second functional layer. In cases where the mixed layer is formed by allowing the below-mentioned first coating film 21 of the composition for the first functional layer to be half-cured and coating the surface of this half-cured first coating film 21 with the composition for the second functional layer, it is considered that a solvent of the composition for the second functional layer permeates the half-cured coating film, thereby withdrawing the half-cured component of the polymerizable compound into the coating film to form a mixed layer, although the reason is not clear.

In the mixed layer 14, the concentration of the component of the second functional layer 13 preferably exhibits a gradual decrease from the second functional layer 13 toward the first functional layer 12. The mixed layer 14 having such a concentration gradient makes it possible to ensure firm adhesion between the first functional layer 12 and the second functional layer 13. Such a concentration gradient can be verified by TOF-SIMS. The mixed layer 14 having such a concentration distribution can be formed by allowing a coating film of the composition for the first functional layer to be half-cured and coating the surface of this coating film with the composition for the second functional layer.

The ratio of the film thickness of the mixed layer 14 to the total film thickness of the first functional layer 12, the second functional layer 13, and the mixed layer 14 (the film thickness of the mixed layer 14/(the film thickness of the first functional layer 12+the film thickness of the second functional layer 13+the film thickness of the mixed layer 14)×100) is preferably 0.6% or more and 40% or less. With the ratio at 0.6% or more, the adhesion before an endurance test (initial adhesion) is favorable. On the other hand, the mixed layer is comparatively soft, and thus, the ratio, if too large, will undesirably soften the optical film. With the ratio at 40% or less, the surface hardness of the optical film 10 can be inhibited from decreasing. The minimum of the ratio is preferably 1% or more, 3% or more, 5% or more, or 10% or more in terms of enhancing not only the initial adhesion but also the adhesion after an endurance test, and the maximum of the film thickness ratio is preferably 35% or less, 30% or less, or 20% or less in terms of making the film promise to be thinner.

The mixed layer 14 preferably has a film thickness of 0.02 µm or more and 3 µm or less. The mixed layer 14 having a film thickness of 0.02 µm or more enables the initial adhesion to be favorable, and in addition, 3 µm or less enables the surface hardness of the optical film 10 to be inhibited from decreasing. The larger the film thickness of the mixed layer 14 is, the more enhanced the adhesion is. Accordingly, the minimum film thickness of the mixed layer 14 is preferably 0.1 µm or more, 0.2 µm or more, or 0.4 µm or more in terms of enhancing not only the initial adhesion but also the adhesion after an endurance test, and the maximum film thickness of the mixed layer 14 is more preferably 2 µm or less or 1 µm or less in terms of inhibiting the surface hardness of the optical film 10 from decreasing. The film thickness of the mixed layer 14 can be adjusted by adjusting the degree to which the first functional layer 12 is half-cured. That is, decreasing the degree to which the first functional layer 12 is half-cured increases the film thickness of the mixed layer 14, and increasing the degree of half-curing decreases the film thickness of the mixed layer 14.

<<Production Method of Optical Film>>

The optical film 10 can be produced, for example, as below-mentioned. First, a composition for the first functional layer is applied to one face 11A of the light-transmitting base material 11, and dried to form a first coating film 21, as depicted in FIG. 4(A). Next, the first coating film 21 is exposed to ionizing radiation such as ultraviolet light, as depicted in FIG. 4(B), to polymerize (cross-link) the polymerizable compound, thus half-curing the first coating film 21.

The term "half-cure" as used herein means that curing substantially proceeds upon further exposure to ionizing radiation.

Figure 5A:
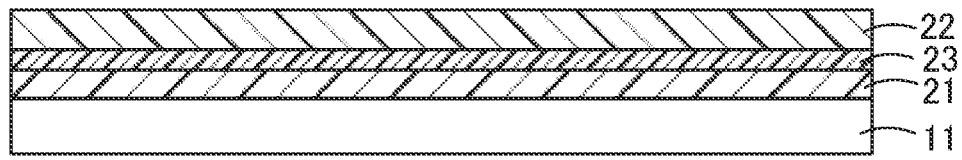
FIG. 5(A) and FIG. 5(B) schematically illustrate the production steps of an optical film according to the first embodiment.

After the first coating film 21 is half-cured, a composition for the second functional layer is applied to the surface of the first coating film 21, and dried, as depicted in FIG. 5(A), to form not only a second coating film 22 but also a mixed coating film 23 between the first coating film 21 and the second coating film 22, wherein the mixed coating film 23 contains a component of the first coating film 21 and a component of the second coating film 22.

Figure 5B:
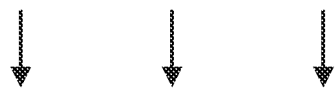
Figure 5B:
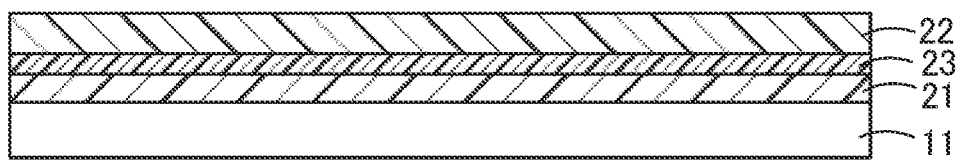

Then, as depicted in FIG. 5(B), the first coating film 21, the second coating film 22, and the mixed coating film 23 are exposed to ionizing radiation such as ultraviolet light to polymerize (cross-link) the polymerizable compound, thus curing (for example, completely curing) the first coating film 21, the second coating film 22, and the mixed coating film 23. The phrase "completely curing" as used herein means that curing substantially no more proceeds in spite of further exposure to ionizing radiation. This enables the first functional layer 12, the second functional layer 13, and the mixed layer 14 between the first functional layer 12 and the second functional layer 13 to be formed, thus affording the optical film 10.

According to the present embodiment, the total film thickness of the first functional layer 12, the second functional layer 13, and the mixed layer 14 is 1 μm or more and 10 μm or less, thus enabling the film to promise to thinner. Additionally, in cases where at least one of the first functional layer 12 and the second functional layer 13 contains an ultraviolet absorber, forming the mixed layer 14 between the first functional layer 12 and the second functional layer 13 makes it possible to inhibit the surface hardness from decreasing and to enhance adhesion between the first functional layer 12 and the second functional layer 13, wherein the mixed layer 14 is adjacent to the first functional layer 12 and the second functional layer 13, and wherein the ratio of the film thickness of the mixed layer 14 to the total film thickness of the first functional layer 12, the second functional layer 13, and the mixed layer 14 is 0.6% or more and 40% or less.

In cases where at least one of the first functional layer 12 and the second functional layer 13 contains an ultraviolet absorber in the present embodiment, forming the mixed layer 14 between the first functional layer 12 and the second functional layer 13 makes it possible to inhibit the surface hardness from decreasing and to enhance adhesion between the first functional layer 12 and the second functional layer 13, wherein the mixed layer 14 is adjacent to the first functional layer 12 and the second functional layer 13, and wherein the mixed layer 14 has a film thickness of 0.02 μm or more and 1 μm or less.

According to the present embodiment, the light-transmitting base material 11 contains a cellulose acetate resin, cycloolefin polymer resin, or (meth)acrylic resin, and thus, the light-transmitting base material 11 has an in-plane retardation Re of approximately 150 nm at the highest. This makes it possible to inhibit a decrease in the visibility of a displayed image observed through polarized sunglasses.

<<<Polarizing Plate>>>

Figure 6:
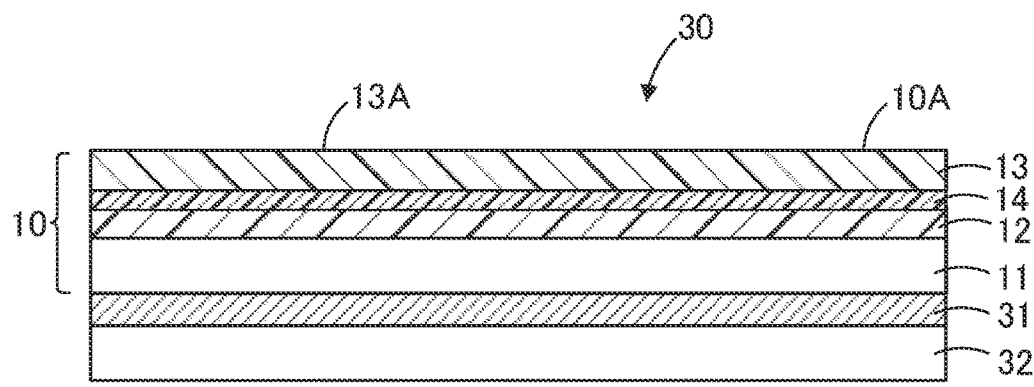
FIG. 6 depicts a schematic diagram of a polarizing plate according to the first embodiment.

The optical film 10 can be incorporated into a polarizing plate and then used. FIG. 6 is a schematic diagram of a polarizing plate according to the present embodiment. As depicted in FIG. 6, a polarizing plate 30 includes an optical film 10, a polarizer 31, and a protective film 32 in this order. Additionally, although the polarizer 31 in the polarizing plate 30 is provided on the light-transmitting base material 11 side of the optical film 10, the polarizer may be provided on the functional layer side of the optical film.

The optical film 10 and the polarizer 31 are, and the polarizer 31 and the protective film 32 are attached to each other, for example, via an aqueous bonding agent or an ultraviolet-curable bonding agent.

<<Polarizer>>

The polarizer 31 is provided on the opposite side of the light-transmitting base material 11 from the first functional layer 12 side. Examples of the polarizer 31 include uniaxially-stretched polyvinyl alcohol resin films stained with iodine or a dichromatic pigment. Examples of polyvinyl alcohol resins that can be used include saponified polyvinyl acetate resins. Examples of polyvinyl acetate resins include polyvinyl acetates as homopolymers of vinyl acetate, and copolymers of vinyl acetate and another monomer copolymerizable therewith. Examples of the another monomer copolymerizable with vinyl acetate include unsaturated carboxylic acids, olefins, vinyl ethers, unsaturated sulfonic acids, and acrylamides having an ammonium group. The polyvinyl alcohol resin may be modified. For example, polyvinyl formal modified with, or polyvinyl acetal modified with aldehyde can also be used.

<<Protective Film>>

Examples of the protective film 32 include cellulose triacetate films, (meth)acrylic resin films, and cycloolefin polymer films.

<<<Image Display Device>>>

Figure 7:
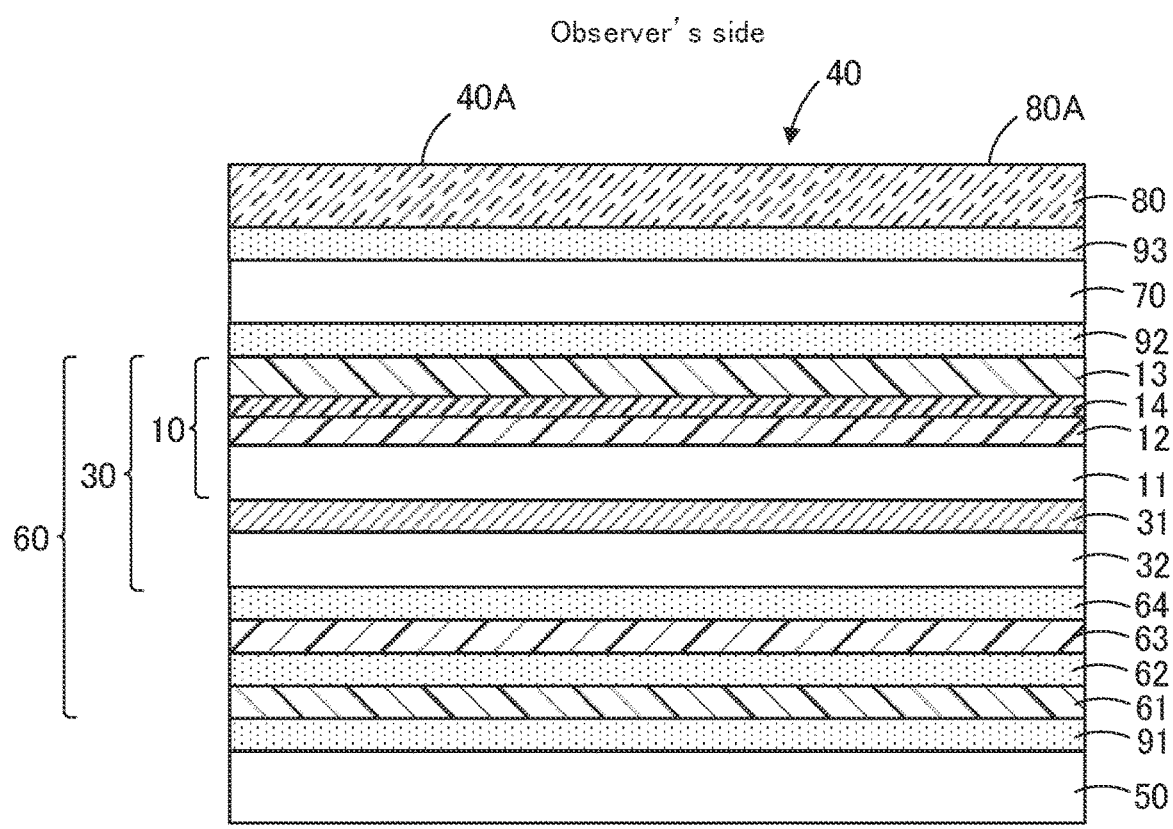
FIG. 7 depicts a schematic diagram of an image display device according to the first embodiment.

The optical film 10 or the polarizing plate 30 can be incorporated into an image display device, and be thus used. FIG. 7 is a schematic diagram of an image display device according to the present embodiment. The image display device 40 depicted in FIG. 7 includes a display element 50, a circularly polarizing plate 60, a touch sensor 70, and a cover member 80 in this order toward the observer's side. Adhesion is achieved via adhesion layers 91 to 93 between the display element 50 and the circularly polarizing plate 60, between the circularly polarizing plate 60 and the touch sensor 70, and between the touch sensor 70 and the cover member 80 respectively. As used herein, the term "adhesion" refers to a concept encompassing adhesiveness.

<<<Display Element>>>

Examples of the display element 50 include liquid crystal elements, organic light-emitting diode elements (hereinafter referred to as "OLED elements"), inorganic light-emitting diode elements, micro LEDs, and plasma elements. As the organic light-emitting diode element, a known organic light-emitting diode element can be used. In addition, the liquid crystal display element may be an in-cell touch panel liquid crystal display element including a touch panel function in the element.

<<<Circularly Polarizing Plate>>>

The circularly polarizing plate 60 having a function for inhibiting external light reflection, and thus, the circularly polarizing plate 60 is effective particularly in cases where an OLED element is used as a display element. The circularly polarizing plate 60 includes, for example, a first retardation film 61 (hereinafter simply referred to as a "retardation film 61"), an adhesion layer 62, a second retardation film 63 (hereinafter simply referred to as a "retardation film 63"), an adhesion layer 64, and the polarizing plate 30 in this order toward the observer's side.

In the circularly polarizing plate 60, the second functional layer 13 in the optical film 10 is located closer to the observer's side than the first functional layer 12. Arranging the polarizing plate 30 in such a manner makes it possible to obtain a desired pencil hardness and scratch resistance.

The circularly polarizing plate 60 preferably has a thickness of 100 μm or less in terms of making the film promise to be thinner. The circularly polarizing plate 60 preferably has a minimum thickness of 20 μm or more, 30 μm or more, or 50 μm or more in terms of processability due to a decrease in intensity. In addition, the circularly polarizing plate 60 more preferably has a maximum thickness of 95 μm or less, 90 μm or less, or 80 μm or less. The thickness of the circularly polarizing plate 60 can be determined by; imaging a cross-section of the circularly polarizing plate 60 using a scanning electron microscope (SEM); measuring the thickness of the circularly polarizing plate 60 at 10 different locations within the cross-section of the image; and calculating the arithmetic mean of the thickness values at the 10 locations.

The circularly polarizing plate 60 may be incorporated into an image display device using one of a chip-cutting method and a roll-to-panel method. A chip-cutting method is a method in which a circularly polarizing plate having a predetermined size according to the size of an image display device is cut out of a roll-shaped circularly polarizing plate, and attached via an adhesion layer to a cover member such as of glass. In addition, a roll-to-panel method is a method in which a roll-shaped circularly polarizing plate is cut while being sent out in a production line of an image display device, and attached via an adhesion layer to a cover member such as of glass.

<<First Retardation Film>>

As a retardation film 61, a positive C plate or a λ/4 retardation film can be used.

<Positive C Plate>

A positive C plate is a film which satisfies the relationship nx≈ny<nz, wherein nx and ny each represent a refractive index in the in-plane direction, and nz represents a refractive index in the thickness direction. Arranging a positive C plate makes it possible to improve the tint on a display screen observed in an oblique direction with respect to the normal direction of the display screen. Such a positive C plate may be constituted, for example, by a vertically aligned liquid crystal layer.

<λ/4 Retardation Film>

A λ/4 retardation film is a film characterized in that the in-plane retardation of the film is approximately ¼ with respect to a predetermined optical wavelength (usually in the visible light region). Arranging λ/4 retardation film makes it possible to convert linear polarization to circular polarization or convert circular polarization to linear polarization.

Examples of λ/4 retardation films include λ/4 retardation films having positive wavelength dispersion and λ/4 retardation films having negative wavelength dispersion. A λ/4 retardation film having positive wavelength dispersion is a film having a property by which the retardation is smaller at a longer wavelength, and a λ/4 retardation film having negative wavelength dispersion is a film having a property by which the retardation is larger at a longer wavelength.

Such a λ/4 retardation film having positive wavelength dispersion can be obtained by stretching a resin film with the stretch ratio being adjusted. Examples of a resin constituting a resin film for obtaining a λ/4 retardation film include cycloolefin resins and cellulose resins. Such a λ/4 retardation film having negative wavelength dispersion can be obtained, for example, with a polycarbonate resin or a resin having an aromatic structure.

<<Adhesion Layer>>

The adhesion layers 62 and 64 can each be constituted by a cured product of a liquid radiation-curable bonding agent (for example, OCR: Optically Clear Resin) containing a polymerizable compound or by an adhesive (for example, OCA: Optical Clear Adhesive). The adhesion layers 62 and 64 preferably have a film thickness of 0.5 μm or more and 50 μm or less.

<<Second Retardation Film>>

In cases where the retardation film 61 is a positive C plate, λ/4 retardation film having negative wavelength dispersion (reciprocal wavelength dispersion) can be used as the retardation film 63, and in cases where the retardation film 61 is a λ/4 retardation film, λ/2 retardation film can be used as the retardation film 63.

<λ/4 Retardation Film Having Negative Wavelength Dispersion>

The λ/4 retardation film having negative wavelength dispersion is the same λ/4 retardation film having negative wavelength dispersion as described in the section for the above-mentioned λ/4 retardation film, and thus, is not described here.

<λ/2 Retardation Film>

A λ/2 retardation film is a film characterized in that the in-plane retardation of the film is approximately ½ with respect to a predetermined optical wavelength (usually in the visible light region). Arranging λ/2 retardation film besides a λ/4 retardation film enables conversion to circular polarization in a wide wavelength band.

Such λ/2 retardation film can be obtained by stretching a resin film with the stretch ratio being adjusted. Examples of a resin constituting a resin film for obtaining a λ/2 retardation film include polycarbonate resins and cycloolefin polymer resins.

<<<Touch Sensor>>>

As the touch sensor 70, any known touch sensor can be used. The touch sensor 70 is not limited to any particular kind, and, for example, a capacitance type touch sensor can be used. Although the touch sensor 70 is arranged between the circularly polarizing plate 60 and the cover member 80, the touch sensor may be arranged between the display element 50 and the circularly polarizing plate 60.

<<<Cover Member>>>

The surface 80A of the cover member 80 is the surface 40A of the image display device 40. The cover member 80 may be a cover glass or a cover film made of a resin. In cases where the image display device 40 is bendable, the cover member 80 is preferably constituted by bendable glass or bendable resin. Examples of bendable resins include resins such as polyimide resins, polyamide-imide resins, polyamide resins, polyester resins (for example, polyethylene terephthalate resins and polyethylene naphthalate resins), and mixtures of two or more of these resins.

<<<Adhesion Layer>>>

The adhesion layers 91 and 93 can each be constituted by a cured product of a liquid radiation-curable bonding agent (for example, OCR: Optically Clear Resin) containing a polymerizable compound or by an adhesive (for example, OCA: Optical Clear Adhesive).

An OLED element will undesirably be deteriorated by external light or the like. Accordingly, it is currently desirable that, in cases where an OLED element is used in an image display device, the OLED element is inhibited from deteriorating. The OLED element emits light called blue light. Blue light has a wavelength of 380 nm to 500 nm and other properties similar to those of ultraviolet light, and the energy of blue light is so high that blue light not absorbed by the cornea and the crystalline lens but passing into the retina is considered as a cause of retinal damage, eye strain, sleep disorder, and the like. Thus, it is currently desirable that blue light is blocked. In cases where the display element 50 is an OLED element in the present embodiment, the first functional layer 12 containing an ultraviolet absorber is closer to the observer's side than the OLED element is, and thus, the first functional layer 12 can absorb ultraviolet light out of external light. This makes it possible that the OLED element is inhibited from being deteriorated by external light. In addition, ultraviolet light emitted from the OLED element can be absorbed, and thus, the blue light can be blocked.

In cases where the display element 50 is an OLED element in the present embodiment, the first functional layer 12 containing one of a sesamol-bound benzotriazole compound and an indole compound is provided closer to the observer's side than the OLED element is, and thus, the first functional layer 12 can absorb ultraviolet light out of external light. This makes it possible that the OLED element is inhibited from being deteriorated by external light and that blue light emitted from the OLED element is blocked.

According to the present embodiment, the first functional layer 12 containing an ultraviolet absorber which absorbs ultraviolet light is provided closer to the observer's side than the polarizer 31 is. Thus, in cases where the display element 50 is an OLED element, not only the OLED element but also the polarizer 31 can be inhibited from being deteriorated by external light.

Causing the adhesion layer to contain the above-mentioned ultraviolet absorber also makes it possible that the OLED element is inhibited from being deteriorated by external light and that the blue light is blocked, but causing the adhesion layer to contain the ultraviolet absorber is more likely to lead to a decrease in the adhesive force. Thus, it is more difficult to make the adhesion layer to promise to be thinner. In addition, the kind of the adhesion layer depends on the constituents of the circularly polarizing plate or the like in some cases, and thus, an ultraviolet absorber to be contained needs to be selected in accordance with the kind of the adhesion layer. Differently from this, causing the first functional layer 12 having an indentation hardness of 50 MPa or more and 600 MPa or less to contain an ultraviolet absorber in the present embodiment enables the first functional layer 12 to promise to be thinner. In addition, causing the first functional layer 12 to contain the ultraviolet absorber makes it possible that the first functional layer 12 varies with the kind of adhesion layer which varies depending on the constituents of the circularly polarizing plate 60 or the like.

Second Embodiment

Figure 8:
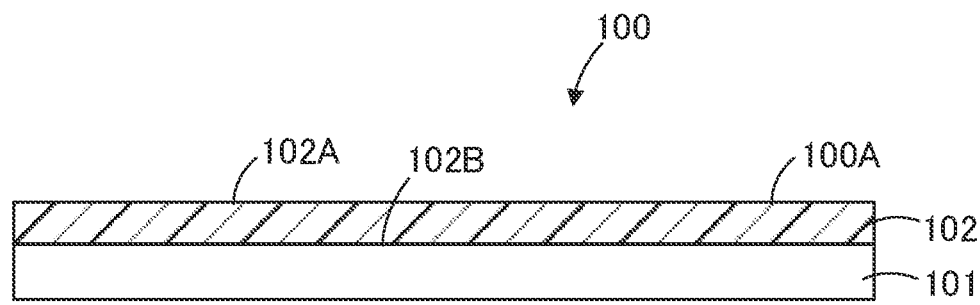
FIG. 8 depicts a schematic diagram of an optical film according to a second embodiment.
Figure 9:
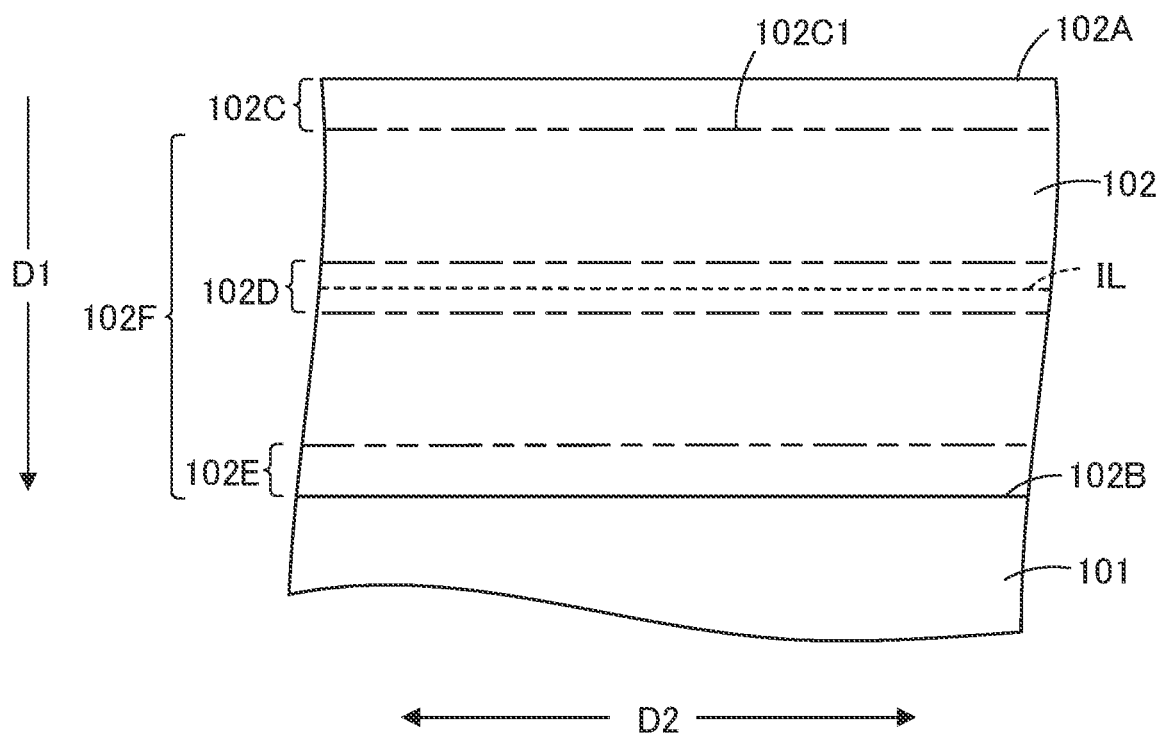
FIG. 9 is an enlarged view depicting a portion of the optical film depicted in FIG. 8.
Figure 10:
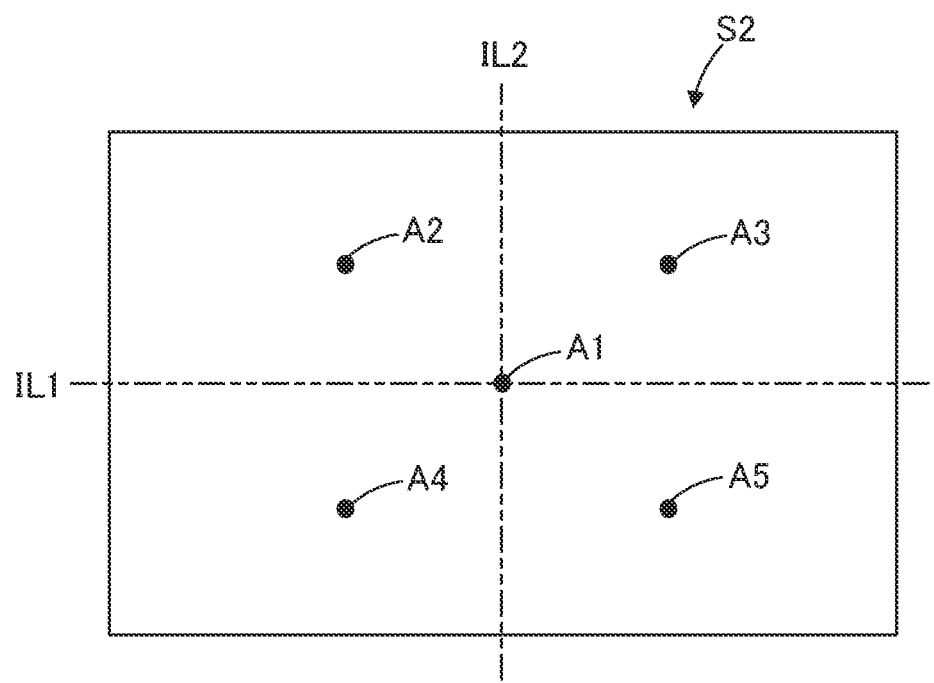
FIG. 10 is a top view of a sample for identifying measurement positions of in-plane retardation.
Figure 11A:
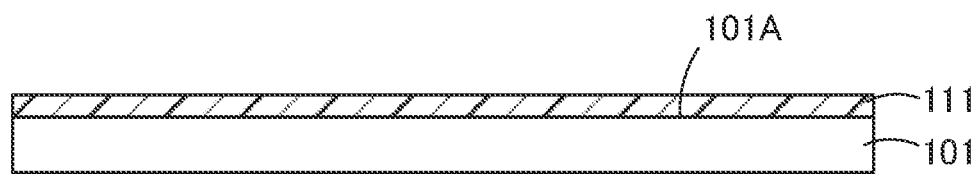
FIG. 11(A) and FIG. 11(B) schematically illustrate the production steps of an optical film according to the second embodiment.
Figure 11B:
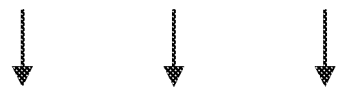
Figure 11B:
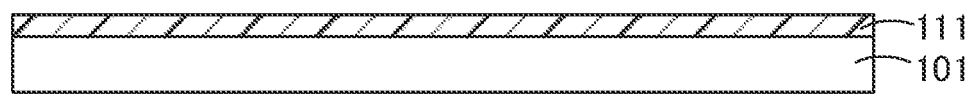

Below, an optical film and an image display device according to a second embodiment of the present invention will be described with reference to the drawings. FIG. 8 is a schematic diagram of an optical film according to the present embodiment. FIG. 9 is an enlarged view depicting a portion of the optical film in FIG. 8. FIG. 10 is a top view of a sample for identifying measurement positions of in-plane retardation. FIGS. 11 and 12 schematically illustrate the production steps of an optical film according to the present embodiment.

<<<<Optical Film>>>>

An optical film 100 depicted in FIG. 8 includes a light-transmitting base material 101 and a functional layer 102. The functional layer 102 contains an ultraviolet absorber containing a nitrogen atom. The functional layer 102 depicted in FIG. 8 is adjacent to the light-transmitting base material 101, and another functional layer may be provided between the light-transmitting base material 101 and the functional layer 102.

The surface 100A of the optical film 100 depicted in FIG. 8 is the surface 102A of the functional layer 102. However, in cases where another functional layer is formed on the surface of the functional layer, the surface of the optical film is the surface of the another functional layer. The "surface of the functional layer" as used herein refers to the opposite side of the functional layer from the light-transmitting base material side.

The property values of the optical film 100, such as the thickness (total thickness), spectral transmittance, yellow index, total light transmittance, haze value, and pencil hardness, the methods of measuring the values, the flexibility and evaluation method thereof, and the applications and size of the optical film 100 are the same as the property values of the optical film 10, such as the thickness, spectral transmittance, yellow index, total light transmittance, haze value, and pencil hardness, the methods of measuring the values, the flexibility and evaluation method thereof, and the applications and size of the optical film 10, and are not described here.

<<<Light-Transmitting Base Material>>>

The light-transmitting base material 101 is a base material having light-transmitting properties. In terms of enhancing adhesion between the light-transmitting base material 101 and the functional layer 102, the light-transmitting base material 101 may be, but is not limited particularly to, a permeable base material into which a component (for example, a polymerizable compound) of the functional layer 102 permeates when the functional layer 102 is formed.

Examples of constituent materials of the light-transmitting base material include, but are not limited particularly to: light-transmitting resins such as cellulose acetate resins, cycloolefin polymer resins, (meth)acrylic resins, polyester resins, polyolefin resins, polyethersulfone resins, polycarbonate resins, polyamide resins, polyimide resins, polyamide-imide resins, polyvinyl chloride resins, polyvinylidene chloride resins, polystyrene resins, polyvinyl alcohol resins, polyallylate resins, and polyphenylene sulfide resins; and mixtures thereof. As described in the first embodiment, cellulose acetate resins, cycloolefin polymer resins, or (meth)acrylic resins are preferable because these resins make it possible to inhibit a decrease in the visibility of a displayed image observed through polarized sunglasses. In addition, polyimide resins and polyamide resins are more preferable in terms of flexibility. The light-transmitting base material may also be supplemented, if necessary, with any of various additives such as plasticizers, ultraviolet absorbers, and lubricants.

Cellulose acetate resins, cycloolefin polymer resins, and (meth)acrylic resins are described above in the first embodiment, and are not described here.

Examples of polyester resins include resins and the like which contain at least one of polyethylene terephthalate (PET), polyethylene naphthalate (PEN), polybutylene terephthalate (PBT), and polybutylene naphthalate (PBN) as a component(s). It is understood that in cases where a polyester resin is used, the polyester resin is excited upon exposure to ultraviolet light and emits fluorescent light. Although such fluorescent light affects the tint of a display screen in some cases, the optical film 10 blocks most light in the wavelength range below 380 nm as described above and thus can appropriately prevent generation of fluorescent light, even if a polyester resin is used in the light-transmitting base material 11.

Examples of polyolefin resins include polyethylene and polypropylene. Examples of polycarbonate resins include aromatic polycarbonates based on a bisphenol (such as bisphenol A), and aliphatic polycarbonates such as diethylene glycol bis(allyl carbonate).

The polyimide resin may be an aliphatic polyimide resin, but is preferably an aromatic polyimide resin containing an aromatic ring. The aromatic polyimide resin is composed of a tetracarboxylic component and a diamine component, at least one of which is an aromatic ring-containing component.

The polyimide resin may partially contain a polyamide structure. Examples of the polyamide structure that may be contained include a polyamide-imide structure containing a tricarboxylic acid residue such as trimellitic anhydride, and a polyamide structure containing a dicarboxylic acid residue such as terephthalic acid. The concept of polyamide resin includes aromatic polyamides (aramids) as well as aliphatic polyamides.

The thickness of the light-transmitting base material 101 (encompassing the thickness of the light-transmitting base material 101 for cases where the optical film 100 needs flexibility), a method of measuring the thickness, and the surface treatment are the same as the thickness of the light-transmitting base material 11, a method of measuring the thickness, and the surface treatment, and thus, are not described here. In this regard, in cases where the light-transmitting base material 101 contains a polyester resin and in cases where the optical film 100 needs flexibility, the thickness of the light-transmitting base material 101 is the same as the thickness of the light-transmitting base material 11 containing a cycloolefin polymer resin.

In cases where the light-transmitting base material 101 contains a polyester resin, the more uniform the polymer is, the better flexibility the light-transmitting base material 101 has. In cases where the light-transmitting base material 101 contains a polyester resin, it is essential to stretch the material to obtain physical intensity, and thus, to make the polymer condition as uniform as possible, the material needs to be produced through sequential or simultaneous biaxial stretching at substantially the same stretch ratio between lengthwise and crosswise. This consequently makes it possible to obtain a light-transmitting base material containing a polyester resin, wherein the base material has a smaller in-plane retardation than a conventional light-transmitting base material containing a polyester resin. The "small in-plane retardation" of the light-transmitting base material containing a polyester resin means that the in-plane retardation is 1500 nm or less in the range of 10 μm or more and 90 μm or less as the thickness of the light-transmitting base material containing a polyester resin. The in-plane retardation is preferably 1200 nm or less, more preferably 1000 nm or less, still more preferably 800 nm or less. In order that the light-transmitting base material containing a biaxially-stretched polyester resin obtains favorable physical characteristics, the in-plane retardation is preferably not too small, and is preferably 200 nm or more, more preferably 400 nm or more.

In cases where the light-transmitting base material 101 contains a polyester resin, the in-plane retardation of the light-transmitting base material 101 is represented by the below-mentioned mathematical equation (4), wherein nx is a refractive index in the lagging axis direction which is the direction in which the refractive index is the largest in the plane of the light-transmitting base material, ny is a refractive index in the leading axis direction which is the direction perpendicular to the lagging axis direction in the above-mentioned plane, and t (nm) is the thickness of the light-transmitting base material. According to the below-mentioned mathematical equation (4), it is understood that a smaller in-plane retardation results in a low degree of alignment, and thus, tends to afford favorable bending resistance. The in-plane retardation (Re) can be measured, for example, with a product having a tradename "RETS-100" manufactured by Otsuka Electronics Co., Ltd., or a product having a tradename "KOBRA-WR" or "PAM-UHR100" manufactured by Oji Scientific Instruments Co., Ltd.

$$\text{in-plane retardation}(Re)=(nx-ny)\times t \qquad (4)$$

In cases where the above-mentioned Re is measured using RETS-100, the below-mentioned procedure can be used for the measurement. First, to stabilize the light source of the RETS-100, the light source is lit and then left to stand for 60 minutes or more. Then, the rotating-analyzer method is selected, and in addition, the θ mode (angular direction retardation measurement mode) is selected. With this θ mode selected, the stage works as a tilted rotation stage.

Then, the following measurement conditions are inputted into the RETS-100.

(Measurement Conditions)

Retardation measurement range: rotating-analyzer method

Measurement spot diameter: @ 5 mm

Tilt angle range: −40° to 40°

Measurement wavelength range: 400 nm to 800 nm

Mean refractive index of sample (polyethylene terephthalate): 1.617

Thickness: thickness measured separately using an SEM or an optical microscope

Then, background data are obtained with no sample placed in this device. The device is set up as a closed system. This is performed every time the light source is lit.

Then, a sample is placed on the stage in the device. The sample may have any shape, for example, a rectangular shape. The size of the sample may be 50 mm×50 mm. In cases where a plurality of samples are placed, all of them need to be set in the same direction. For example, all the samples are preferably marked preliminarily so as to be all placed in the same direction.

After the sample is placed, the stage is rotated 360° on the XY plane to measure the leading axis and the lagging axis in an environment at a temperature of 23±5° C. and a relative humidity of 50±20%. Upon termination of measurement, the lagging axis is selected. Then, a measurement is taken with the stage tilted about the lagging axis in a set angle range, and data (Re) are obtained at 10° intervals in a set tilt angle range and in a set wavelength range. The in-plane retardation Re is defined as a value measured at an angle of incidence of 0° and with light having a wavelength of 589 nm. The in-plane retardation Re is measured at five points located at different positions. Specifically, two virtual lines IL1 and IL2 perpendicular to each other are first drawn to pass the center A1 of the sample S2, as depicted in FIG. 10. The drawn virtual lines IL1 and IL2 divide the sample into four sections. Then, a total of four points A2 to A4 in the respective sections are set equidistantly from the center A1, and a measurement is taken at a total of five points including the center A1 and the points A2 to A4. Then, the in-plane retardation Re is defined as the arithmetic mean of three values obtained by excluding the largest and smallest values from the five measured values.

Additionally, to afford favorable physical characteristics, it is better to consider not only double refraction in the in-plane direction but also a balance with double refraction in the film thickness direction. An index for this is, for example, an Nz coefficient. The Nz coefficient is influenced by the crystallinity and alignment inside the light-transmitting base material, and thus, is related to the characteristics of the whole light-transmitting base material. For example, the Nz coefficient for polyethylene terephthalate is generally 2 to 4, but is preferably 5 or more, more preferably 8 or more, most preferably 10 or more, in the present invention. The maximum of the Nz coefficient is approximately 80, preferably 70 or less, most preferably 50 or less. The Nz coefficient is represented by the below-mentioned mathematical equation (5), wherein nz is a refractive index in the thickness direction of the light-transmitting base material. In this regard, nx and ny in the following mathematical equation (5) are the same as nx and ny in the above-mentioned mathematical equation (4).

$$Nz\ \text{coefficient} = (nz-nx)/(ny-nx) \qquad (5)$$

<<<Functional Layer>>>

The functional layer 102 depicted in FIG. 8 has a monolayer structure, but may have a multilayer structure composed of two or more layers. In addition, the functional layer 102 is a layer which functions as a hard coat layer. However, the functional layer 102 may be a layer having another function. The "hard coat layer" in the present embodiment refers to a layer the indentation hardness of which is larger than that of the light-transmitting base material.

The functional layer 102 has a film thickness of 1 μm or more and 10 μm or less. The functional layer 102 having a film thickness in this range makes it possible to make the film promise to be thinner. The maximum of this film thickness may be 9 μm or less, 8 μm or less, or 7 μm or less.

The interfacial boundary line between the light-transmitting base material and the functional layer can be recognized on the basis of the difference in contrast in the microscopic image. Thus, the "film thickness of the functional layer" in the present embodiment refers to a distance from this interfacial boundary line to the surface of the functional layer. The film thickness of the functional layer can be determined by: imaging a cross-section of the functional layer using a scanning electron microscope (SEM), transmission electron microscope (TEM), scanning transmission electron microscope (STEM), or the like; measuring the film thickness values of the functional layer at 10 different locations within the cross-section of the image; and calculating the arithmetic mean of film thickness values at the 10 different locations. A specific method of imaging such a cross-section is the same method of imaging the cross-section as described in the first embodiment, and thus, is not described here.

In cases where the functional layer 102 is subjected to time-of-flight secondary ion mass spectrometry (TOF-SIMS) to measure the intensity of secondary ions in the depth direction D1 of the functional layer 102, the ratio $(I_{U2}/I_{U1})$ of the intensity $I_{U2}$ of second secondary ions to the intensity $I_{U1}$ of first secondary ions is 1.1 or more and 4.0 or less, wherein the second secondary ions are derived from an ultraviolet absorber in a second region 102D (see FIG. 9) having a thickness of 0.3 μm and containing a bisector IL (see FIG. 9) which bisects the functional layer 102 in the depth direction D1 of the functional layer 102, and wherein the first secondary ions are derived from an ultraviolet absorber in a first region 102C (see FIG. 9) having a thickness of 0.3 μm and containing the surface 102A of the functional layer 102. In addition, the ratio $(I_{U3}/I_{U2})$ of the intensity $I_{U3}$ of third secondary ions to the intensity $I_{U2}$ of the second secondary ions is 1.2 or more and 4.0 or less, wherein the third secondary ions are derived from an ultraviolet absorber in a third region 102E (see FIG. 9) having a thickness of 0.3 μm and containing the back face 102B of the functional layer 102, and wherein the second secondary ions are derived from the ultraviolet absorber in the second region 102D. With $I_{U2}/I_{U1}$ at 1.1 or more, the ultraviolet absorber contained in the first region 102C is not too much, thus making it possible to further inhibit a decrease in the surface hardness and scratch resistance and to further inhibit the ultraviolet absorber from precipitating. With $I_{U2}/I_{U1}$ at 4.0 or less, an extreme difference is less likely to be caused in the concentration of the ultraviolet absorber between the first region 102C and the second region 102D, thus making it possible to inhibit the second region 102D containing a larger amount of ultraviolet absorber than the first region 102C from becoming too soft, to inhibit a decrease in the surface hardness, and to inhibit generation of cracks due to a difference in thermal shrinkage between the first region 102C and the second region 102D in an endurance test. With $I_{U3}/I_{U2}$ at 1.2 or more, the ultraviolet absorber contained in the second region 102D is not too much, thus making it possible to further inhibit the ultraviolet absorber from precipitating. With $I_{U3}/I_{U2}$ at 4.0 or less, an extreme difference is less likely to be caused in the concentration of the ultraviolet absorber between the second region 102D and the third region 102E, thus making it possible to inhibit the third region 102E containing a larger amount of ultraviolet absorber than the second region 102D from becoming too soft, to inhibit a decrease in the surface hardness, and to inhibit generation of cracks due to a difference in thermal shrinkage between the second region 102D and the third region 102E in an endurance test. It is more preferable that the minimum of $I_{U2}/I_{U1}$ is 1.2 or more, 1.3 or more, or 1.4 or more, and it is more preferable that the maximum is 3.5 or less, 3.0 or less, 2.5 or less, 2.0 or less, or 1.6 or less. In addition, it is more preferable that the minimum of luz/luz is 1.3 or more, 1.4 or more, 1.6 or more, or 2.0 or more, and it is more preferable that the maximum is 3.5 or less, 3.2 or less, 2.8 or less, 2.6 or less, or 2.5 or less.

The ratio $(I_{U3}/I_{U1})$ of the intensity $I_{U3}$ of the secondary ions derived from the ultraviolet absorber in the third region 102E to the intensity $I_{U1}$ of the secondary ions derived from the ultraviolet absorber in the first region 102C is preferably 1.5 or more and 6.5 or less. With $I_{U3}/I_{U1}$ at 1.5 or more, the ultraviolet absorber contained in the first region 102C is not too much, thus making it possible to further inhibit a decrease in the surface hardness and scratch resistance and to further inhibit the ultraviolet absorber from precipitating. Additionally, with $I_{U3}/I_{U1}$ at 6.5 or less, the third region 102E can be inhibited from becoming too soft, and the surface hardness can be inhibited from decreasing. It is more preferable that the minimum of $I_{U3}/I_{U1}$ is 1.8 or more, 2.0 or more, or 2.2 or more, and it is more preferable that the maximum is 6.2 or less, 6.0 or less, or 5.8 or less.

The abscissa of the depth profile of TOF-SIMS represents a depth, which is a depth converted from the rate of etching of the functional layer, and thus, the film thickness of the functional layer and the thickness of each region which are determined from the above-mentioned cross-sectional image do not necessarily agree with the film thickness of the functional layer and each region on the depth profile in some cases. The above-mentioned "bisector which bisects the functional layer in the depth direction of the functional layer" is a virtual line which bisects the film thickness of the functional layer in the depth direction of the functional layer, and is determined on the basis of the film thickness of the functional layer determined from the above-mentioned depth profile. In addition, the above-mentioned "back face of the functional layer" is regarded as corresponding to an intersection on the above-mentioned depth profile between the intensity of the secondary ions derived from the light-transmitting base material and the intensity of the secondary ions derived from the ultraviolet absorber. In addition, the "thickness of the first region", "thickness of the second region", and "thickness of the third region" are thicknesses determined from the above-mentioned depth profile. Additionally, unless otherwise specified, the "intensity of the secondary ions" as used herein is the arithmetic mean of the intensity values measured at at least three points different in depth in each region. In addition, the above-mentioned bisector IL extends in the direction D2 (see FIG. 9) perpendicular to the depth direction D1, and the second region 102D is set in such a manner that the above-mentioned bisector IL is centered in the second region 102D.

The secondary ion intensity can be measured using a time-of-flight secondary ion mass spectrometer (for example, TOF.SIMS5 manufactured by ION-TOF GmbH). Specifically, a piece having a size of 10 mm×10 mm cut out of the optical film is first placed in the sample chamber of the time-of-flight secondary ion mass spectrometer in such a manner that the surface of the functional layer is exposed to the primary ions. Then, the surface of the functional layer is exposed to the primary ions to measure the intensity of the secondary ions derived from the ultraviolet absorber in each of the first region, second region, and third region. In this regard, an ultraviolet absorber containing a nitrogen atom contains a nitrogen atom, and thus, $CN^-$ is detected as the secondary ions derived from the ultraviolet absorber. In cases where the ultraviolet absorber containing a nitrogen atom is a benzotriazole compound, $CN^-$ and $C_6H_4N_3^-$ are detected as the secondary ions derived from the ultraviolet absorber.

The intensity of secondary ions derived from an ultraviolet absorber can be measured using the above-mentioned TOF.SIMS5, for example, under the following measurement conditions. In this regard, an Ar gas cluster ion beam is used as an etching ion as described in the measurement conditions, and using an Ar gas cluster ion beam makes it possible that a structure of an organic substance is etched with small damage.

Secondary ion polarity: negative
Mass range (m/z): 0 to 3000
Cluster size: 200 μma
Number of scans: 1 scan/cycle
Number of pixels (one side): 128 pixels
Measured degree of vacuum (before introducing sample): $4×10^{-7}$ Pa or less
Charge neutralization: yes
Post acceleration: 10 KV
Primary ion: $Bi_3^{++}$
Primary ion accelerating voltage: 30 KV
Pulse width: 11.3 ns
Bunching: yes (high mass resolution measurement)
Etching ion: Ar gas cluster ion beam (Ar-GCIB)
Etching ion accelerating voltage: 20 KV
Ar cluster size (median value): approximately 1400

With the functional layer 102, it is preferable that the smallest intensity $I_{U1(min)}$ of the secondary ions derived from the ultraviolet absorber in the first region 102C is smaller than the smallest intensity $I_{U2(min)}$ of the secondary ions derived from the ultraviolet absorber in the second region 102D, and that the smallest intensity $I_{U2(min)}$ of the second-ary ions derived from the ultraviolet absorber in the second region 102D is smaller than the smallest intensity $I_{U3(min)}$ of the secondary ions derived from the ultraviolet absorber in the third region 102E. The functional layer 102 having such a relationship allows the amount of the ultraviolet absorber to exhibit a gradual increase from the surface 102A of the functional layer 102 toward the back face 102B, thus making it possible to inhibit an extreme difference from being caused in the concentration of the ultraviolet absorber, and to further inhibit generation of cracks in the functional layer 102 in an endurance test.

With the functional layer 102, it is preferable that the largest intensity $I_{U1(max)}$ of the secondary ions derived from the ultraviolet absorber in the first region 102C is smaller than the smallest intensity $I_{U2(min)}$ of the secondary ions derived from the ultraviolet absorber in the second region 102D, and that the largest intensity luz (max) of the secondary ions derived from the ultraviolet absorber in the second region 102D is smaller than the smallest intensity $I_{U3(min)}$ of the secondary ions derived from the ultraviolet absorber in the third region 102E. The functional layer 102 having such a relationship allows the amount of the ultraviolet absorber to exhibit a gradual increase from the surface 102A of the functional layer 102 toward the back face 102B, thus making it possible to inhibit an extreme difference from being caused in the concentration of the ultraviolet absorber, and to further inhibit generation of cracks in the functional layer 102 in an endurance test.

With the functional layer 102, it is preferable that the smallest intensity $I_{U1(min)}$ of the secondary ions derived from the ultraviolet absorber in the first region 102C is smaller than the smallest intensity $I_{U4(min)}$ of the secondary ions derived from the ultraviolet absorber in a fourth region 102F which is from the boundary 102C1 on the light-transmitting base material 11 side of the first region 102C to the back face 102B in the functional layer 102. The functional layer 102 having such a relationship allows the ultraviolet absorber to be the least in the first region 102C in the functional layer 102, thus making it possible to further inhibit precipitation of the ultraviolet absorber, a decrease in the surface hardness, and a decrease in the scratch resistance.

As below-mentioned, the functional layer 102 may contain a fluorine atom-containing compound. With the functional layer 102 containing a fluorine atom-containing compound, it is preferable that the intensity IF of secondary ions derived from the fluorine atom-containing compound in the first region 102C is larger than each of the intensities $I_{F2}$ and $I_{F3}$ of secondary ions derived from the fluorine atom-containing compound in the second region 102D and the third region 102E respectively, as measured by TOF-SIMS. That is, the fluorine atom-containing compound is distributed more toward the surface 102A side (first region 102C) of the functional layer 102. The above-mentioned intensity $I_{F1}$ being larger than each of the intensities $I_{F2}$ and $I_{F3}$ allows the fluorine atom-containing compound to be more in the first region 102C of the functional layer 102, thus making it possible to inhibit the ultraviolet absorber from precipitating on the surface 102A.

It is preferable that the ratios ($I_{F1}/I_{F2}$ and $I_{F1}/I_{F3}$) of the intensity $I_{F1}$ of the secondary ions derived from the fluorine atom-containing compound in the first region 102C to the intensities $I_{F2}$ and $I_{F3}$ of the secondary ions derived from the fluorine atom-containing compound in the second region 102D and the third region 102E respectively is 30 or more. With $I_{F1}/I_{F2}$ and $I_{F1}/I_{F3}$ at 30 or more each, the ultraviolet absorber can be more inhibited from precipitating on the surface 102A. It is more preferable that the minimum of each of $I_{F1}/I_{F2}$ and $I_{F1}/I_{F3}$ is 40 or more, 50 or more, 60 or more, or 70 or more.

As below-mentioned, the functional layer 102 may contain a silicon atom-containing compound. With the functional layer 102 containing a silicon atom-containing compound, it is preferable that the intensity $I_{S1}$ of secondary ions derived from the silicon atom-containing compound in the first region 102C is larger than each of the intensities $I_{S2}$ and $I_{S3}$ of secondary ions derived from the silicon atom-containing compound in the second region 102D and the third region 102E respectively, as measured by TOF-SIMS. That is, the silicon atom-containing compound is distributed more toward the surface 102A side (first region 102C) of the functional layer 102. The above-mentioned intensity $I_{S1}$ being larger than each of the intensities $I_{S2}$ and $I_{S3}$ allows the silicon atom-containing compound to be more in the first region 102C of the functional layer 102, thus making it possible to inhibit the ultraviolet absorber from precipitating on the surface 102A.

It is preferable that the ratios ($I_{S1}/I_{S2}$ and $I_{S1}/I_{S3}$) of the intensity $I_{S1}$ of the secondary ions derived from the silicon atom-containing compound in the first region 102C to the intensities $I_{S2}$ and $I_{S3}$ of the secondary ions derived from the silicon atom-containing compound in the second region 102D and the third region 102E respectively is 3 or more. With $I_{S1}/I_{S2}$ and $I_{S1}/I_{S3}$ at 3 or more each, the ultraviolet absorber can be more inhibited from precipitating on the surface 102A. It is more preferable that the minimum of each of $I_{S1}/I_{S2}$ and $I_{S1}/I_{S3}$ is 5 or more, 10 or more, or 15 or more.

The intensity of the secondary ions derived from the fluorine atom-containing compound and the intensity of the secondary ions derived from the silicon atom-containing compound can be measured by TOF-SIMS using the same method as the above-mentioned intensity of the secondary ions derived from the ultraviolet absorber. In this regard, the fluorine atom-containing compound contains a fluorine atom, and thus, $F^-$ is detected as the secondary ions derived from the fluorine atom-containing compound. In addition, the silicon atom-containing compound contains a silicon atom, and thus, $SiO_2^-$ is detected as the secondary ions derived from the silicon atom-containing compound.

The functional layer 102 preferably has an indentation hardness of 75 MPa or more and 1000 MPa or less. The functional layer 102 having an indentation hardness of 75 MPa or more makes it possible to obtain a desired pencil hardness, and 1000 MPa or less makes it possible to inhibit generation of cracks. It is more preferable that the functional layer 102 has a minimum indentation hardness of 100 MPa or more, 150 MPa or more, or 200 MPa or more. In addition, it is more preferable that the functional layer 102 has a maximum indentation hardness of 900 MPa or less, 750 MPa or less, or 600 MPa or less. The indentation hardness of the functional layer 102 should be measured by the method described in the first embodiment.

The functional layer 102 contains a resin and an ultraviolet absorber containing a nitrogen atom. The functional layer 102 may contain a fluorine atom-containing compound, a silicon atom-containing compound, and/or a polymerization initiator in addition to the resin and the ultraviolet absorber.

<Resin>

The resin contained in the functional layer 102 contains a polymer (cured product) of a polymerizable compound. The resin may contain an air-dry curable resin and/or a thermosetting compound, in addition to the polymer of a polymerizable compound. The polymerizable compound is the same polymerizable compound as described in the section for the second functional layer 13, and thus, is not described here. The air-dry curable resin and the thermosetting compound are the same air-dry curable resin and thermosetting compound as described in the section for the first functional layer 12, and thus, are not described here.

<Ultraviolet Absorber>

The ultraviolet absorber is the same ultraviolet absorber as described in the first embodiment, and thus, is not described here.

<Fluorine Atom-Containing Compound>

The fluorine atom-containing compound is not limited to any particular compound provided that the compound contains a fluorine atom. Examples of fluorine atom-containing compounds include fluorine leveling agents. Using a fluorine leveling agent affords high leveling properties, thus making it possible to provide smoothness and recoatability. Examples of commercially available fluorine leveling agents include F-555 (manufactured by DIC Corporation), F-568 (manufactured by DIC Corporation), and FTERGENT (registered trademark) 683 (manufactured by Neos Company Limited).

<Silicon Atom-Containing Compound>

The silicon atom-containing compound is not limited to any particular compound provided that the compound contains a silicon atom. Examples of silicon atom-containing compounds include silica particles and silicon leveling agents. Using silica particles makes it possible to impart lubricity to the functional layer 102.

The average particle diameter of the silica particles is preferably 1 nm or more and 1000 nm or less. The silica particles having an average particle diameter of 1 nm or more makes it possible to produce silica particles easily, and 1000 nm or less makes it possible to impart lubricity and to maintain high transparency. The average particle diameter of silica particles is determined by: imaging a cross-section of silica particles using a transmission electron microscope (TEM) or a scanning transmission electron microscope (STEM) at a magnification of 40,000 times to 200,000 times; measuring the particle diameters of 20 silica particles within the cross-section of the image; and calculating the arithmetic mean of the particle diameter values of the 20 silica particles.

The functional layer 102 may be formed using one kind of composition, or can be formed using two or more kinds of compositions. In cases where the functional layer 102 is formed using two or more kinds of compositions, the functional layer 102 may be formed, for example, using: such a first composition for the functional layer as contains a polymerizable compound and an ultraviolet absorber containing a nitrogen atom; and such a second composition for the functional layer as contains a polymerizable compound.

<First Composition for Functional Layer>

The first composition for the functional layer contains the above-mentioned polymerizable compound, ultraviolet absorber, and the like, and may additionally contain a polymerization initiator, a solvent, a leveling agent, and/or the like, if necessary. The polymerization initiator, solvent, and leveling agent are the same polymerization initiator, solvent, and leveling agent as described in the first embodiment, and thus, are not described here.

<Second Composition for Functional Layer>

The second composition for the functional layer contains the above-mentioned polymerizable compound and the like, and may additionally contain the above-mentioned fluorine atom-containing compound, the above-mentioned silicon atom-containing compound, the above-mentioned air-dry curable resin, the above-mentioned thermosetting compound, a polymerization initiator, a solvent, and the like. In addition, the second composition for the functional layer may contain any one of the below-mentioned various additives, if necessary, to the extent that the effects of the present invention are not compromised. Examples of such additives include anti-static agents, adhesion-improving agents, thixotropy enhancing agents, coupling agents, plasticizers, antifoam agents, bulking agents, coloring agents, and fillers.

The polymerization initiator in the second composition for the functional layer may be the same as, but is preferably different from, the polymerization initiator in the first composition for the functional layer. Allowing the polymerization initiator in the second composition for the functional layer to be different from the polymerization initiator in the first composition for the functional layer makes it possible to select a more easily half-curable polymerization initiator for the first composition for the functional layer and to select a very surface-curable polymerization initiator for the second composition for the functional layer.

<<Production Method of Optical Film>

The optical film 100 can be produced, for example, as below-mentioned. First, a first composition for the functional layer is applied to one face 101A of the light-transmitting base material 101, and dried to form a first coating film 111, as depicted in FIG. 11(A). Next, the first coating film 111 is exposed to ionizing radiation such as ultraviolet light, as depicted in FIG. 11(B), to polymerize (cross-link) the polymerizable compound, thus half-curing the first coating film 111.

Figure 12A:
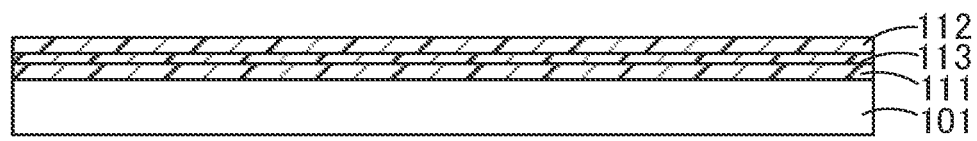
FIG. 12(A) and FIG. 12(B) schematically illustrate the production steps of an optical film according to the second embodiment.

After the first coating film 111 is half-cured, a second composition for the functional layer is applied to the surface of the first coating film 111, and dried, as depicted in FIG. 12(A), to form not only a second coating film 112 but also a mixed coating film 113 between the first coating film 111 and the second coating film 112, wherein the mixed coating film 23 contains a component of the first coating film 111 and a component of the second coating film 112. It is considered that a solvent of the second composition for the functional layer permeates the half-cured first coating film 111, thereby withdrawing a component of the polymerizable compound into the half-cured first coating film 111 to form the mixed coating film 113, although the reason is not clear.

Figure 12B:
Figure 12B:
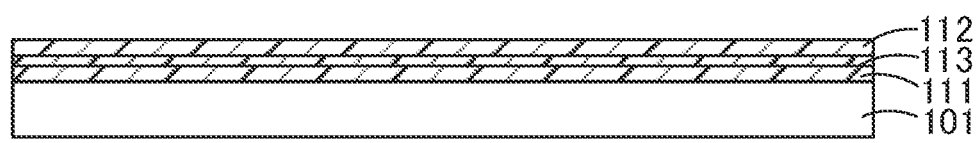

Then, as depicted in FIG. 12(B), the first coating film 111, the second coating film 112, and the mixed coating film 113 are exposed to ionizing radiation such as ultraviolet light to polymerize (cross-link) the polymerizable compound, thus curing (for example, completely curing) the first coating film 111, the second coating film 112, and the mixed coating film 113. Here, curing the first coating film 111, second coating film 112, and mixed coating film 113 causes each interfacial boundary therebetween to vanish, thus forming a monolayer functional layer 102.

With the optical film 100 according to the present embodiment in which the functional layer 102 has a film thickness of 1 μm or more and 10 μm or less and in which the functional layer 102 contains an ultraviolet absorber containing a nitrogen atom, the ratio ($I_{U2}/I_{U1}$) of the intensity $I_{U1}$ of the secondary ions derived from the ultraviolet absorber in the first region 102C to the intensity luz of the secondary ions derived from the ultraviolet absorber in the second region 102D is 1.1 or more and 4.0 or less, and thus, the ultraviolet absorber at and around the surface 102A of the functional layer 102 is less. In addition, the ratio ($I_{U3}/I_{U2}$) of the intensity $I_{U3}$ of the secondary ions derived from the ultraviolet absorber in the third region 102E to the intensity luz of the secondary ions derived from the ultraviolet absorber in the second region 102D is 1.2 or more and 4.0 or less, thus making it possible to inhibit an extreme difference in concentration from being caused in the ultraviolet absorber in the first region 102C to the third region 102E of the functional layer 102, and to inhibit generation of cracks in the functional layer 102 in an endurance test. This enables the film to promise to be thinner and, at the same time, makes it possible to obtain the optical film 100 having favorable surface hardness, favorable scratch resistance, and favorable endurance. In this regard, the "favorable surface hardness" as used herein refers to a surface hardness the degree of which allows no generation of scratches in the optical film 100 at least in processing, and the "favorable scratch resistance" refers to a scratch resistance the degree of which at least allows no generation of scratches in the optical film 100 at least in processing.

<<<Polarizing Plate and Image Display Device>>>

Figure 13:
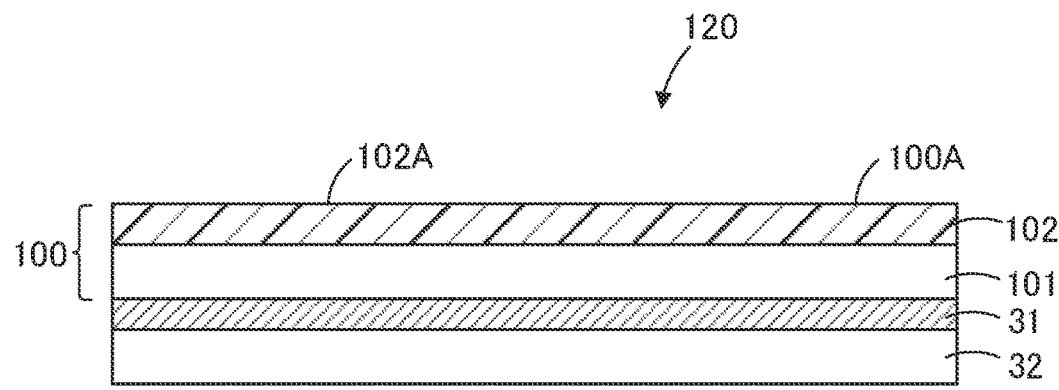
FIG. 13 is a schematic diagram of a polarizing plate according to the second embodiment.
Figure 14:
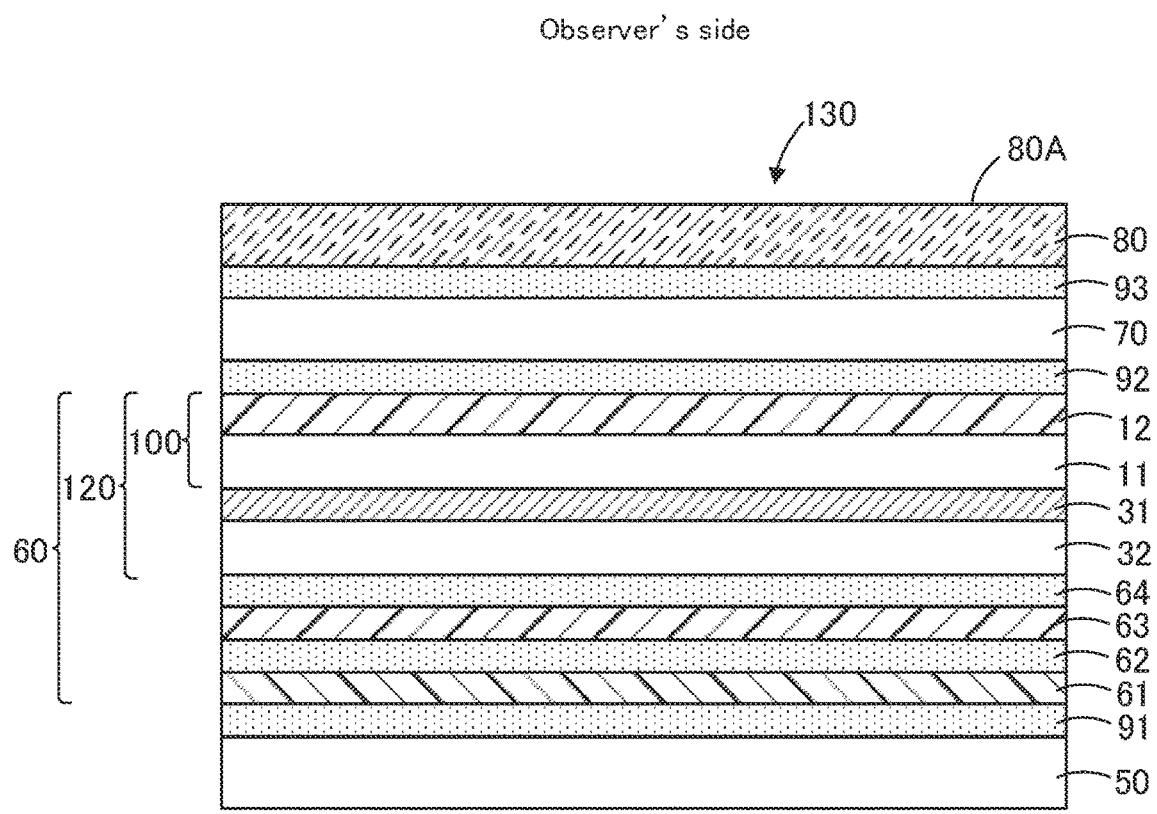
FIG. 14 is a schematic diagram of an image display device according to the second embodiment.

The optical film 100 can be incorporated into a polarizing plate or an image display device in the same manner as the optical film 10, and be thus used. FIG. 13 is a schematic diagram of a polarizing plate according to the present embodiment, and FIG. 14 is a schematic diagram of an image display device according to the present embodiment. The polarizing plate 120 depicted in FIG. 13 and the image display device 130 depicted in FIG. 14 each include an optical film 100. In FIG. 13 and FIG. 14, the elements indicated by the same reference numbers as in FIG. 6 and FIG. 7 are the same elements as indicated in FIG. 6 and FIG. 7, and are not described here.

Third Embodiment

Figure 16:
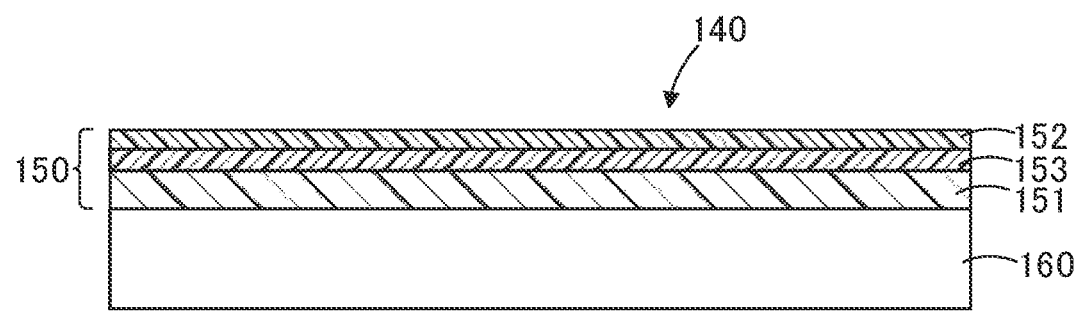
FIG. 16 is a schematic diagram of a polarizer protective film transferring member according to a third embodiment.
Figure 17A:
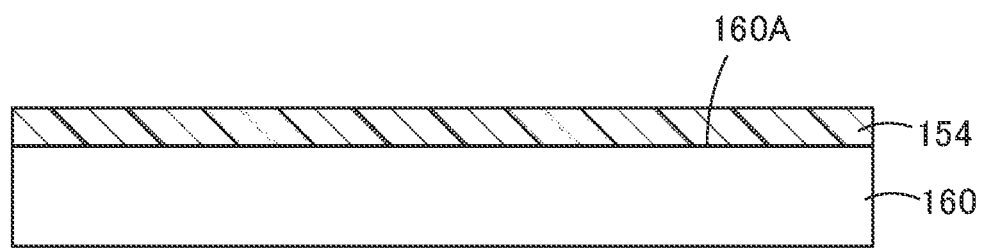
FIG. 17(A) and FIG. 17(B) schematically illustrate the production steps of a polarizer protective film transferring member according to the third embodiment.

Below, a polarizer protective film, a polarizer protective film transferring member, a polarizing plate, and an image display device according to a third embodiment of the present invention will be described with reference to the drawings. FIG. 16 is a schematic diagram of a polarizer protective film transferring member according to the present embodiment, and FIG. 17 to FIG. 19 schematically illustrate the production steps of a polarizer protective film transferring member according to the present embodiment. FIG. 20 is a schematic diagram of an image display device according to the present embodiment.

<<<<<Polarizer Protective Film and Polarizer Protective Film Transferring Member>>>>>

The polarizer protective film transferring member 140 depicted in FIG. 16 includes: a polarizer protective film 150 for protecting a polarizer; and a release film 160 laminated on the polarizer protective film 150.

<<<<Polarizer Protective Film>>>>

The polarizer protective film 150 does not include a base material, that is, a film having no base material. The "base material" in the present embodiment is a support for forming a polarizer protective film, and is also a film or sheet existing in the polarizer protective film in use of the polarizer protective film. Examples of base materials include: base materials described in the section for the light-transmitting base material 101; and glass base materials. In this regard, the release film 160 is removed when the polarizer protective film is used, and thus, is not regarded as a base material.

The polarizer protective film 150 preferably has a thickness of 20 μm or less in terms of making the film promise to be thinner. It is preferable that the polarizer protective film 150 has a minimum thickness of 1 μm or more, 2 μm or more, or 3 μm or more, in terms of low moisture permeability. In addition, it is preferable that the polarizer protective film 150 has a maximum thickness of 15 μm or less, 13 μm or less, or 10 μm or less, in terms of making the film promise to be even thinner. The thickness of the polarizer protective film 150 can be determined by: imaging a cross-section of the polarizer protective film 150 using a scanning electron microscope (SEM); measuring the thickness of the polarizer protective film 150 at 10 different locations within the cross-sectional image; and calculating the arithmetic mean of the thickness values measured at the 10 locations.

Specifically, the method of imaging the cross-section should be as below-mentioned. First of all, a piece having a size of 1 mm×10 mm is cut out of a polarizer protective film and embedded in an embedding resin to produce a block, and homogeneous sections having a thickness of approximately 70 nm to 300 nm and having no openings or the like are sliced from the block by a commonly used sectioning technique. For the production of sections, an "Ultramicrotome EM UC7" (Leica Microsystems GmbH) or the like is used. Then, the block remaining after slicing the homogeneous sections with no openings or the like is used as a measurement sample. Subsequently, cross-sections of the measurement sample are imaged using a scanning electron microscope (SEM) (product name "S-4800" manufactured by Hitachi High-Technologies Corporation). The cross-sections imaged using the S-4800, with the detector, accelerating voltage, and emission current set to "SE", "3 KV", and "10 μA" respectively, is observed. The focus, contrast, and brightness are suitably adjusted at a magnification of 100 to 100,000 times, preferably 1,000 to 10,000 times, depending on the film thickness of the polarizer protective film, in such a manner that each layer can be identified by observation. To reduce the deviation in measured thickness values, the observation at a magnification as low as possible is recommended for measuring the thickness of the polarizer protective film. Furthermore, the beam monitor aperture, the objective lens aperture, and the WD are set to "1," "2," and "8 mm" respectively.

The polarizer protective film 150 preferably has an in-plane retardation (Re) of 80 nm or more and 220 nm or less at a wavelength of 589 nm. With the polarizer protective film 150 having an in-plane retardation in the above-mentioned range at a wavelength of 589 nm, the polarizer protective film 150 functions as a λ/4 retardation film. This minimum in-plane retardation is more preferably 85 nm or more or 90 nm or more in terms of ensuring the intensity of transmitted light, and the maximum is more preferably 180 nm or less or 155 nm or less in terms of inhibiting rainbow unevenness. As used herein, the "in-plane retardation of a polarizer protective film" refers to the in-plane retardation of the whole polarizer protective film, and should be measured as that of the whole polarizer protective film.

The in-plane retardation of the polarizer protective film 150 can be measured in the following manner. First, an adhesive layer (product name "PANACLEAN (registered trademark) PD-S1" from Panac Co., Ltd.) is attached to a sheet of glass (30 mm in length×30 mm in width, and 1 mm in thickness) having optical isotropy, and a polarizer protective film transferring member is further attached to the resulting sheet in such a manner that the second resin layer comes in contact with the adhesive layer and does not generate any fold or wrinkle. Then, a release film is removed from the polarizer protective film, exposing the first resin layer, and thus, a measurement sample is obtained. Here, the piece to be used as a measurement sample of the polarizer protective film transferring member is cut to a size of 40 mm in length×40 mm in width out of the central portion of the polarizer protective film transferring member. Then, the in-plane retardation of this measurement sample is measured at a wavelength of 589 nm using a retardation measurement device (product name "KOBRA-WR" manufactured by Oji Scientific Instruments Co., Ltd.; measurement spot: 5 mm in diameter). The in-plane retardation is the arithmetic mean of three measurements obtained by measuring one piece of measurement sample.

In cases where the polarizer protective film 150 is incorporated in a circularly polarizing plate or an image display device, the polarizer protective film 150 is attached to another film via an adhesive layer or an adhesion layer. In this case, the above-mentioned in-plane retardation is measured with the another film removed. To remove the another film from the polarizer protective film 150, the blade of a cutter is first inserted at the edge of the film, and then, the another film is removed. In cases where the another film is not removed easily, the another film should not be removed forcibly but be brought to next step. Then, the step of immersing the resulting piece in hot water of 40° C. for 10 seconds and taking out the piece is repeated three times. Then, the easiness of removal of the adhesive layer or the adhesion layer is checked using a cutter or the like. Depending on the case, the step of immersing the resulting piece in hot water of 40° C. for 10 seconds and taking out the piece is repeated another three times. Then, the adhesive layer or the adhesion layer is slowly removed using such a tool (thin and flat but having no blade) as does not scratch the polarizer protective film. If the whole layer cannot be removed, a portion corresponding to a site to be measured needs only to be removed. In addition, the adhesive layer or the adhesion layer itself has a negligible level of in-plane retardation, and thus, may remain on the polarizer protective film 150 side.

The polarizer protective film 150 preferably has a water vapor transmission rate of 600 g/(m$^2$·24 h) or less. The polarizer protective film 150 having a water vapor transmission rate of 600 g/(m$^2$·24 h) or less makes it possible to inhibit the polarizer protective film 150 from swelling during an endurance test. As used herein, the "water vapor transmission rate" refers to the amount (g/(m$^2$·24 h)) of water vapor which passes through the polarizer protective film in 24 hours, wherein the amount is measured under an atmosphere at a temperature of 40° C. and a relative humidity of 90% using such a method as in accordance with the testing methods for determination of the water vapor transmission rate (dish method) which are described in JIS Z0208: 1976. The water vapor transmission rate is obtained as the arithmetic mean of three measured values. In this regard, the water vapor transmission rate of the polarizer protective film 150 is measured with the release film 160 removed. It is more preferable that the polarizer protective film 150 has a maximum water vapor transmission rate of 500 g/(m$^2$·24 h) or less, 400 g/(m$^2$·24 h) or less, or 300 g/(m$^2$·24 h) or less.

The polarizer protective film 150 preferably has a haze value (total haze value) of 1% or less. In cases where the haze value of the polarizer protective film 150 is 1% or less and where the polarizer protective film 150 is used in a mobile device, the screen of the device can be inhibited from turning white in color. The maximum haze value of the polarizer protective film 150 is more preferably 0.5% or less, 0.4% or less, 0.3% or less, or 0.2% or less in terms of further inhibiting such whitening.

The polarizer protective film 150 preferably has a spectral transmittance of less than 1% at a wavelength of 380 nm, a spectral transmittance of 0.5% or more and less than 30% at a wavelength of 410 nm, and a spectral transmittance of 35% or more at a wavelength of 440 nm. The polarizer protective film 150 having a spectral transmittance of less than 1% at a wavelength of 380 nm makes it possible to achieve an excellent blue light blocking rate. In addition, the polarizer protective film 150 having a spectral transmittance of 0.5% or more at a wavelength of 410 nm makes it possible to inhibit the yellow tint of the polarizer protective film 150, and a spectral transmittance of less than 30% at a wavelength of 410 nm makes it possible to achieve an excellent blue light blocking rate without adversely affecting the transmitted light. The polarizer protective film 150 having a spectral transmittance of 35% or more at a wavelength of 440 nm has a low yellow index, thus preventing the polarizer protective film 150 itself from being tinted yellow, and in addition, making it possible to inhibit a decrease in the transmittance of light in the visible light region. The polarizer protective film 150 more preferably has a minimum spectral transmittance of 1% or more at a wavelength of 410 nm in terms of further inhibiting the yellow tint of the polarizer protective film 150, and the maximum is more preferably 25% or less in terms of making it possible to achieve an excellent blue light blocking rate without adversely affecting the transmitted light. The polarizer protective film 150 more preferably has a minimum spectral transmittance of 40% or more or 45% or more at a wavelength of 440 nm in terms of further inhibiting the yellow tint of the polarizer protective film 150.

The polarizer protective film 150 preferably has a spectral transmittance of 5% or more and 25% or less at a wavelength of 420 nm. Having a spectral transmittance in this range at a wavelength of 420 nm makes it possible to attempt to exert the blue light blocking performance, inhibit a visibility decrease due to coloration, and ensure the transparency.

The polarizer protective film 150 preferably has a yellow index (YI) of 15 or less. The polarizer protective film 150 having a YI of 15 or less makes it possible to inhibit the yellow tint of the polarizer protective film 150 and can be used for applications that require transparency. It is normal that a minimum YI is more preferable in terms of ensuring high transparency, but the minimum YI is more preferably 1 or more, 2 or more, or 3 or more, also taking into consideration imparting blue light cutting performance. However, an excessively high YI in turn enhances the yellow tint in some cases. Because of this, the maximum YI is more preferably 10 or less, 7 or less, or 6 or less in terms of further inhibiting the yellow tint.

The methods of measuring the haze value, spectral transmittance, and yellow index of the polarizer protective film 150 are the same as the methods of measuring the haze value, spectral transmittance, and yellow index of the optical film 10, and thus, are not described here. These measurements are made with the release film 160 removed from the polarizer protective film.

When the polarizer protective film 150 is subjected to a mandrel test in accordance with JIS K5600-5-1:1999 (in the test, a sample is wound around a metal column which is 2 mm to 32 mm), it is preferable that the smallest column diameter which generates no crack (fissure) in the polarizer protective film 150 is 6 mm or less. The smallest diameter of 6 mm or less makes it possible to obtain excellent flexibility. The mandrel test to be performed should include: cutting a piece having a size of 50 mm×50 mm out of the polarizer protective film; removing the release film from the resulting piece; and winding the resulting piece around a column in such a manner that the first resin layer is inside.

In cases where the polarizer protective film 150 is incorporated in a circularly polarizing plate or an image display device, the polarizer protective film 150 is attached to another film via an adhesive layer or an adhesion layer, and in this case, the another film should be removed from the polarizer protective film 150 by the above-mentioned method before measuring the water vapor transmission rate, haze value, spectral transmittance, and YI and performing a mandrel test. Even if such a removal process is performed, the measurement of each item is not significantly affected.

The pencil hardness of the surface (surface of the first resin layer 151) of the polarizer protective film 150 having the release film 160 removed therefrom and the method of measuring the pencil hardness are the same as the pencil hardness of the optical film 10 and the method of measuring the pencil hardness, and thus, are not described here.

The applications and size of the polarizer protective film 150 are the same as the applications and size of the optical film 10, and thus, are not described here.

The polarizer protective film 150 includes a first resin layer 151 and a second resin layer 152 arranged on one face of the first resin layer 151. The polarizer protective film 150 further include a third resin layer 153 between the first resin layer 151 and the second resin layer 152, or does not need to include the third resin layer 153.

<<<First Resin Layer>>>

The first resin layer 151 contains a cured product of a first ionizing radiation-curable resin composition. The first resin layer 151 functions as a hard coat layer.

The first resin layer 151 preferably has an absorption start wavelength in the wavelength range of 360 nm or more and 430 nm or less. Using an ultraviolet absorber having an absorption start wavelength in this wavelength range makes it possible to inhibit absorption of blue light emitted from the below-mentioned light-emitting element and to inhibit the second resin layer 152 from being deteriorated by ultraviolet light. The first resin layer 151 having an absorption start wavelength in the above-mentioned wavelength range can be obtained by allowing the first resin layer 151 to contain the above-mentioned ultraviolet absorber.

The first resin layer 151 preferably has a larger indentation hardness than the second resin layer 152. The first resin layer 151 having a larger indentation hardness than the second resin layer 152 makes it possible to attempt to achieve both foldability and impact resistance which causes the members inside a display device to be less susceptible to damage.

The first resin layer 151 preferably has an indentation hardness of 100 MPa or more and 600 MPa or less. The first resin layer 151 having an indentation hardness of 100 MPa or more makes it possible to obtain a desired hardness and to inhibit a decrease in scratch resistance, and in addition, 600 MPa or less enables the first resin layer 151 to have excellent flexibility. The minimum indentation hardness of the first resin layer 151 is preferably 150 MPa or more in terms of obtaining higher hardness, and the maximum is preferably 500 MPa or less in terms of obtaining better flexibility. The indentation hardness of the first resin layer 151 should be measured by the method described in the first embodiment.

The first resin layer 151 preferably has a film thickness of 0.5 μm or more and 15 μm or less. The first resin layer 151 having a film thickness of 0.5 μm or more makes it possible to obtain a hardness which can prevent scratching in production processes, and 15 μm or less makes it possible to inhibit cracks from being generated by folding or curving. It is more preferable that the minimum film thickness of the first resin layer 151 is 1 μm or more, 2 μm or more, or 3 μm or more, in terms of further enhancing the hardness, and it is more preferable that the maximum is 18 µm or less, 15 µm or less, or 10 µm or less, in terms of further inhibiting generation of cracks.

The film thickness of the first resin layer 151 should be measured by the same method as the film thickness of the first functional layer 12. For the measurement of the film thickness of the first resin layer, it is important that the contrast at the interfacial boundary between the first resin layer and another layer (for example, a third resin layer) can be observed as clearly as possible when the cross-section is observed. In cases where the interfacial boundary is hardly observed owing to lack of contrast, a staining process may be applied because interfacial boundaries between organic layers become easily observed by application of the staining procedure with osmium tetraoxide, ruthenium tetraoxide, phosphotungstic acid, or the like. In some cases, higher magnification makes it more difficult to find the contrast at the interfacial boundary. In such a case, observation is also performed with low magnification. For example, the first functional layer is observed at two different magnifications including a higher magnification, such as 25,000 or 50,000 times, and a lower magnification, such as 50,000 or 100,000 times, to determine the above-mentioned arithmetic means at both the magnifications, which are further averaged to determine the film thickness of the first resin layer.

<<First Ionizing Radiation-Curable Resin Composition>>

A first ionizing radiation-curable resin composition is a resin composition curable by ionizing radiation, and contains at least a radiation-polymerizable compound which constitutes a resin contained in a cured product. The radiation-curable resin composition may contain, in addition to a radiation-polymerizable compound, an ultraviolet absorber, air-dry curable resin, thermosetting compound, polymerization initiator, solvent, and/or the like.

The ratio of raw material (solid) contained in the first ionizing radiation-curable resin composition is not limited to a particular value, and is preferably 5% by mass or more and 70% by mass or less, more preferably 25% by mass or more and 60% by mass or less.

The first ionizing radiation-curable resin composition may be supplemented with, for example, any conventionally known dispersing agent, surfactant, anti-static agent, silane coupling agent, thickener, coloring inhibitor, coloring agent (pigment and dye), antifoam agent, leveling agent, flame retardant, adhesion promoter, polymerization inhibitor, antioxidant, surface modifier, and/or lubricant for the purpose of, for example, increasing the hardness, reducing cure shrinkage, controlling the refractive index, and/or providing antiglare properties.

A method of preparing the first ionizing radiation-curable resin composition and ionizing radiation used for curing are the same as the method of preparing a composition for the first functional layer and ionizing radiation used for curing.

<Radiation-Polymerizable Compound>

The radiation-polymerizable compound refers to a molecule having at least one radiation-polymerizable group. Examples of radiation-polymerizable compounds include radiation-polymerizable monomers, radiation-polymerizable oligomers, and radiation-polymerizable prepolymers, and these compounds can be prepared as appropriate for use. A combination of a radiation-polymerizable monomer and a radiation-polymerizable oligomer or radiation-polymerizable prepolymer is preferred as the radiation-polymerizable compound.

(Radiation-Polymerizable Monomer)

The ionizing radiation-polymerizable monomer is preferably a polyfunctional monomer having two or more radiation-polymerizable functional (that is, bifunctional or more polyfunctional) groups. Examples of radiation-polymerizable monomers include radiation-polymerizable monomers having a modifying group introduced therein for alkylene oxide modification, urethane modification, epoxy modification, or alkoxy modification. Among these, an alkylene oxide-modified (meth)acrylate is preferable in terms of obtaining a protective film having favorable removability from a release film, tackiness, and high mechanical intensity. Examples of alkylene oxides include methylene oxides, ethylene oxides, propylene oxides, and butylene oxides.

Among these, ethylene oxide-modified acrylates (EO-modified acrylates) and propylene oxide-modified acrylates (PO-modified acrylates) are more preferable in terms of obtaining favorable removability and scratch resistance. Furthermore among these, PO-modified acrylates are particularly preferable in terms of a favorable balance between removability and scratch resistance.

(Radiation-Polymerizable Oligomer)

Examples of radiation-polymerizable oligomers include oligomers such as urethane (meth)acrylates, polyester (meth)acrylates, epoxy (meth)acrylates, melamine (meth)acrylates, polyfluoroalkyl (meth)acrylates, and silicone (meth)acrylate.

(Radiation-Polymerizable Prepolymer)

The radiation-polymerizable prepolymer preferably has a molecular weight of 10,000 or more and 80,000 or less, more preferably 10,000 or more and 40,000 or less. Having a weight average molecular weight of more than 80,000 results in high viscosity, and thus, will undesirably decrease the coating suitability and degrade the appearance of the obtained polarizer protective film. Examples of radiation-polymerizable prepolymers include prepolymers such as urethane (meth)acrylates, polyester (meth)acrylates, epoxy (meth)acrylates, melamine (meth)acrylates, polyfluoroalkyl (meth)acrylates, and silicone (meth)acrylate. Among these, urethane acrylate prepolymers are preferable in terms of enhancing interlayer adhesion between the second resin layer 152 and the third resin layer 153.

In a suitable combination of a radiation-polymerizable monomer and a radiation-polymerizable prepolymer, the radiation-polymerizable monomer is an EO-modified acrylate, and the radiation-polymerizable prepolymer is a urethane acrylate prepolymer.

The radiation-polymerizable monomer and the radiation-polymerizable prepolymer are contained preferably at 90:10 to 70:30 in the first ionizing radiation-curable resin composition. Allowing the first ionizing radiation-curable resin composition to contain a radiation-polymerizable monomer and a radiation-polymerizable prepolymer in this range makes it possible to enhance the flexibility and toughness without decreasing the hardness.

<Ultraviolet Absorber>

Provided that the ultraviolet absorber absorbs ultraviolet light, the ultraviolet absorber is not limited to any particular material, and preferably has an absorption start wavelength in the wavelength range of 360 nm or more and 430 nm or less for the above-mentioned reasons. The ultraviolet absorber preferably has a maximum absorbance of 0.5 or more in the wavelength range of 360 nm or more and 430 nm or less. Examples of ultraviolet absorbers include the same ultraviolet absorbers as described in the first embodiment.

<Air-Dry Curable Resin, Thermosetting Compound, Polymerization Initiator, and Solvent>

The air-dry curable resin, the thermosetting compound, the polymerization initiator, and the solvent are the same as the air-dry curable resin, the thermosetting compound, the polymerization initiator, and the solvent described in the section for the first embodiment, and thus, are not described here.

<<<Second Resin Layer>>>

The second resin layer 152 contains a cured product of a second ionizing radiation-curable resin composition. The second resin layer 152 functions as λ/4 retardation layer.

The film thickness of the second resin layer 152 can be suitably adjusted in the range of 0.1 μm or more and 10 μm or less, considering imparted in-plane retardation. As understood from the above-mentioned mathematical equation (4) for determining an in-plane retardation, the in-plane retardation tends to be smaller as the thickness of the second resin layer 152 is smaller. The film thickness of the second resin layer is defined as the arithmetic mean of thickness values measured at 10 different locations, where a cross-section of the second resin layer is imaged using a scanning transmission electron microscope (STEM) or a transmission electron microscope (TEM), and the thickness of the second resin layer is measured at the 10 locations within the image of the cross-section.

The second resin layer 152 preferably has an in-plane retardation (Re) of 80 nm or more and 220 nm or less at a wavelength of 589 nm. With the second resin layer 152 having an in-plane retardation in the above-mentioned range at a wavelength of 589 nm, the second resin layer 152 functions as a λ/4 retardation layer. This minimum in-plane retardation is more preferably 85 nm or more or 90 nm or more in terms of ensuring the intensity of transmitted light, and the maximum is more preferably 180 nm or less or 155 nm or less in terms of inhibiting rainbow unevenness. The in-plane retardation of the second resin layer can be determined from the above-mentioned mathematical equation (4), wherein nx is a refractive index in the lagging axis direction in the plane of the second resin layer, ny is a refractive index in the direction perpendicular to nx in the plane of the second resin layer, and t (nm) is the film thickness of the second resin layer.

The second resin layer 152 may be a layer which exhibits inverse dispersion, but preferably be a layer which exhibits normal dispersion because the latter layer is less likely to be deteriorated by ultraviolet light than the former layer which exhibits inverse dispersion. In this regard, inverse dispersion is characterized in that the retardation given to transmitted light becomes larger as the wavelength of the transmitted light becomes longer, and characterized specifically in that the relationship is Re450<Re550 between the in-plane retardation (Re450) at a wavelength of 450 nm and the in-plane retardation (Re550) at a wavelength of 550 nm. In contrast, normal dispersion is characterized by Re450>Re550.

<<Second Ionizing Radiation-Curable Resin Composition>>

A second ionizing radiation-curable resin composition is a resin composition curable by ionizing radiation, and contains at least a liquid crystal compound and a radiation-polymerizable compound which constitutes a resin contained in a cured product. However, the radiation-polymerizable compound may be the below-mentioned radiation-polymerizable liquid crystal. In cases where the liquid crystal compound is not a radiation-polymerizable liquid crystal compound, the second ionizing radiation-curable resin composition needs to further contain a radiation-polymerizable compound, but in cases where the liquid crystal compound is a radiation-polymerizable liquid crystal compound, the second ionizing radiation-curable resin composition may further contain, or does not need to contain, a radiation-polymerizable compound. The second ionizing radiation-curable resin composition may contain a polymerization initiator, surfactant, and/or solvent besides a radiation-polymerizable compound.

<Liquid Crystal Compound>

Examples of liquid crystal compounds include: calamitic liquid crystal compounds such as nematic liquid crystal compounds and smectic liquid crystal compounds; cholesteric liquid crystal compounds; and discotic liquid crystal compounds. Among these, calamitic liquid crystal compounds and discotic liquid crystal compounds are preferable.

In addition, the liquid crystal compound is preferably a radiation-polymerizable liquid crystal compound. The liquid crystal compound which is a radiation-polymerizable liquid crystal compound makes it possible to fix the liquid crystal compound in the second resin layer. The radiation-polymerizable liquid crystal compound is a liquid crystal compound having a radiation-polymerizable group. Examples of radiation-polymerizable liquid crystal compounds include monofunctional liquid crystal compounds having one radiation-polymerizable group and polyfunctional liquid crystal compounds having two or more polymerizable groups. Among these, polyfunctional liquid crystal compounds are preferable, polyfunctional liquid crystal compounds having two or three polymerizable groups are more preferable, and polyfunctional liquid crystal compounds having two polymerizable groups are still more preferable.

In the second resin layer 152, the liquid crystal compound is preferably fixed in any one of the states of alignment: vertical alignment, horizontal alignment, hybrid alignment, and tilt alignment. For example, it is preferable that the long axis of the calamitic liquid crystal compound is substantially horizontal to the surface of the retardation layer. In addition, it is preferable that the disc face of the discotic liquid crystal compound is substantially vertical to the film face (optically anisotropic layer face).

That the calamitic liquid crystal compound is substantially horizontal means that the angle made on the acute angle side between the surface of the retardation layer and the director of the calamitic liquid crystal compound is in the range of 0° or more and 20° or less. This angle is more preferably in the range of 0° or more and 10° or less, still more preferably in the range of 0° or more and 5° or less, in terms of obtaining a desired retardation. In addition, that the discotic liquid crystal compound is substantially vertical means that the average angle made on the acute angle side between the surface of the retardation layer and the disc face of the discotic liquid crystal compound is in the range of 70° or more and 90° or less. This angle is more preferably in the range of 80° or more and 90° or less, still more preferably in the range of 85° or more and 90° or less, in terms of obtaining a desired retardation.

Examples of calamitic liquid crystal compounds that are preferably used include azomethines, azoxiess, cyanobiphenyls, cyanophenyl esters, benzoates, cyclohexanecarboxylic phenyl esters, cyanophenyl cyclohexanes, cyano-substituted phenyl pyrimidines, alkoxy-substituted phenyl pyrimidines, phenyldioxanes, tolans, alkenylcyclohexyl benzonitriles, and mixtures thereof. Examples of calamitic liquid crystal compounds that can be used include not only these low-molecular-weight liquid crystal compounds but also high-molecular-weight liquid crystal compounds. In addition, the calamitic liquid crystal compound is preferably has a polymerizable group in terms of binding to a resin to fix the calamitic liquid crystal compound in the resin. The number of polymerizable groups in one molecule of the calamitic liquid crystal compound is preferably 2 to 3, more preferably 2. Having two or more polymerizable groups makes it possible to inhibit a decrease in retardation in a high-temperature environment, and three or less affords favorable alignment. In addition, having two or three polymerizable groups makes it possible to obtain favorable physical characteristics and to impart flexibility.
Specific examples of calamitic liquid crystal compounds include compounds represented by the following chemical formulae (1) to (17).
[Chem. 3]
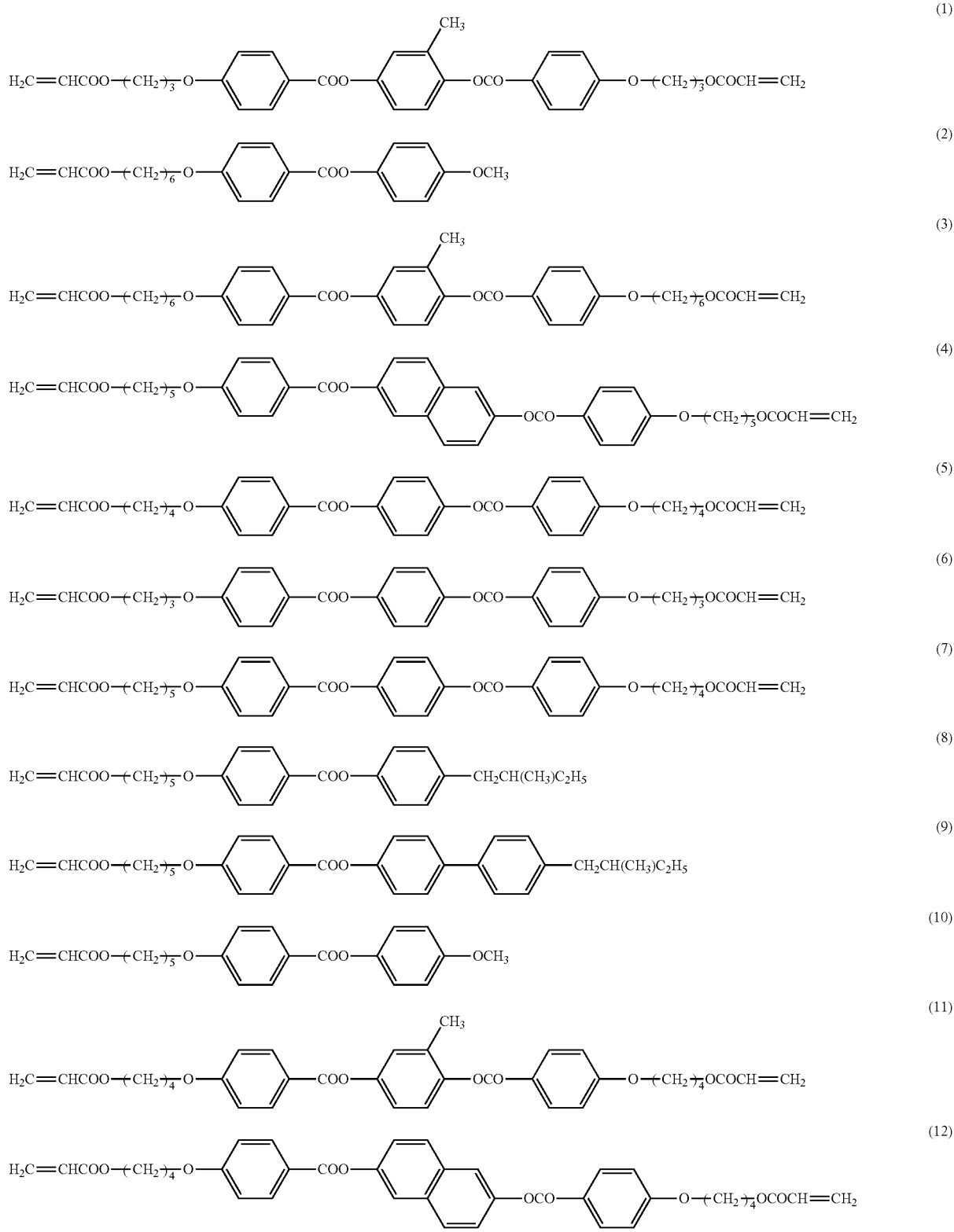

-continued

(13)
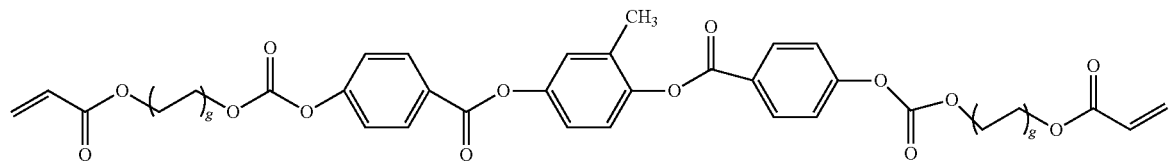

(g is an integer of 2 to 5)

[Chem. 4]

(14)
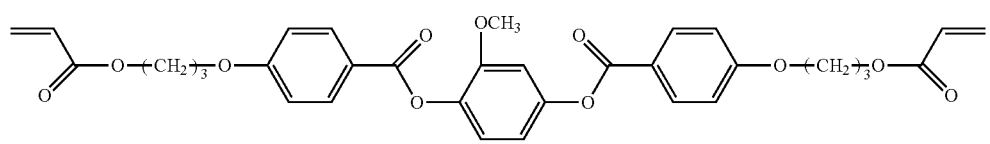

(15)
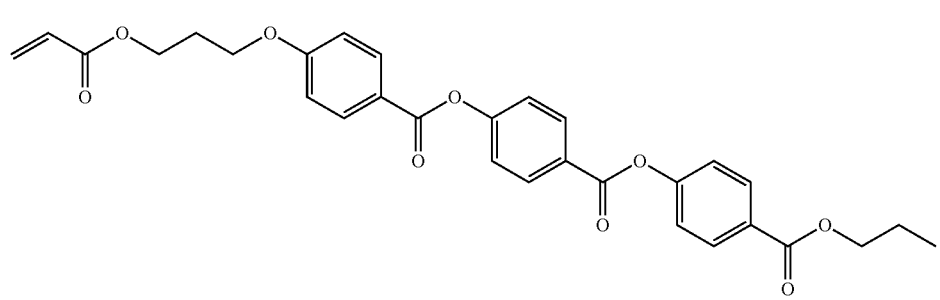

(16)
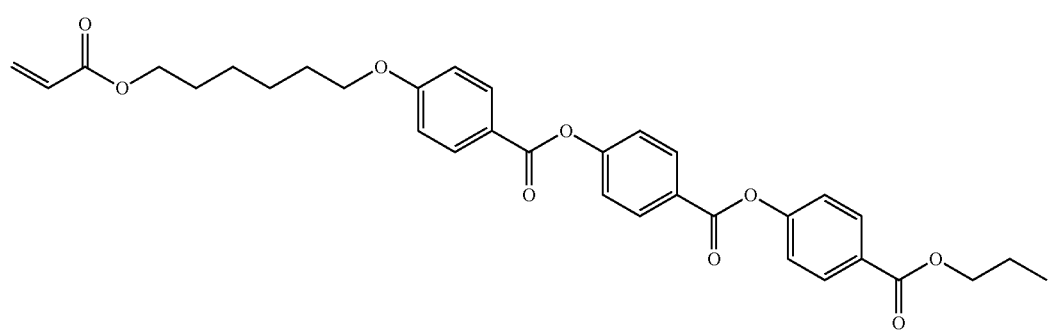

(17)
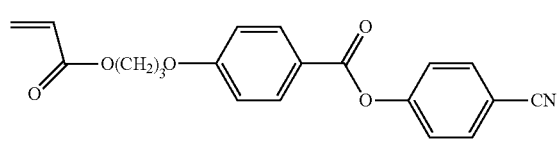

Discotic liquid crystal compounds are described in various literature (C. Destrade et al., *Mol. Crysr. Liq. Cryst.*, 1981, vol. 71, p 111; Chapter 5 and Chapter 10, Section 2, In *Ekisho-no Kagaku*, Kikan Kagaku Sosetsu No. 22, The Chemical Society of Japan, 1994; B. Kohne et al., *Angew. Chem. Soc. Chem. Comm.*, 1985, p 1794; J. Zhang et al., *J. Am. Chem. Soc.*, 1994, vol. 116, p 2655). Polymerization of a discotic liquid crystal compound is described in JPH08-27284A.

The discotic liquid crystal compound preferably has a radiation-polymerizable group. For example, one conceivable structure is such that a radiation-polymerizable group as a substituent is bound to the disc core of a discotic liquid crystal compound, but allowing a radiation-polymerizable group to be directly bound to the disc core makes it difficult to maintain the aligned state in polymerization reaction. In view of this, a preferable structure has a linking group between the disc core and the radiation-polymerizable group. That is, the discotic liquid crystal compound having a polymerizable group is preferably a compound represented by the following formula.

$$D(-L-P)_n$$

In the formula, D is a disc core, L is a divalent linking group, P is a radiation-polymerizable group, and n is an integer of 1 to 12. Specific preferable examples of the disc core (D), the divalent linking group (L), and the radiation-polymerizable group (P) in the formula include (D1) to (D15), (L1) to (L25), and (P1) to (P18) respectively described in JP2001-4837A, and the contents described in the patent document can be preferably used. In this regard, the phase transition temperature of the discotic liquid crystal compound is preferably 30° C. or more and 300° C. or less, still more preferably 30° C. or more and 170° C. or less. The phase transition temperature of 30° C. or more makes it less likely that the solvent used for coating remains, and in addition, 170° C. or less makes it possible to prevent the release film from melting.

In addition, examples of liquid crystalline compounds which exhibit inverse dispersion include compounds and mixtures thereof described in each of published applications such as JP2010-537954A, JP2010-537955A, JP2010-522892A, JP2010-522893A, and JP2013-509458A and patent gazettes such as JP5892158B2, JP5979136B2, JP5994777B2, JP6015655B2, and JP6055569B1. For example, JP6055569B1 discloses a mixture of a polymerizable liquid crystal compound represented by the below-mentioned chemical formula (18) and a polymerizable liquid crystal compound represented by the below-mentioned chemical formula (19).

[Chem. 5]

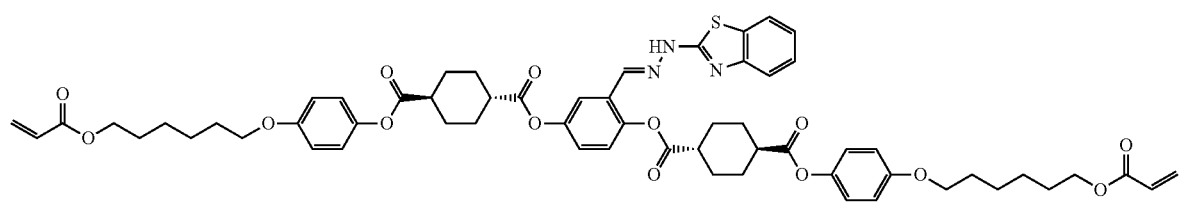

(18)

[Chem. 6]

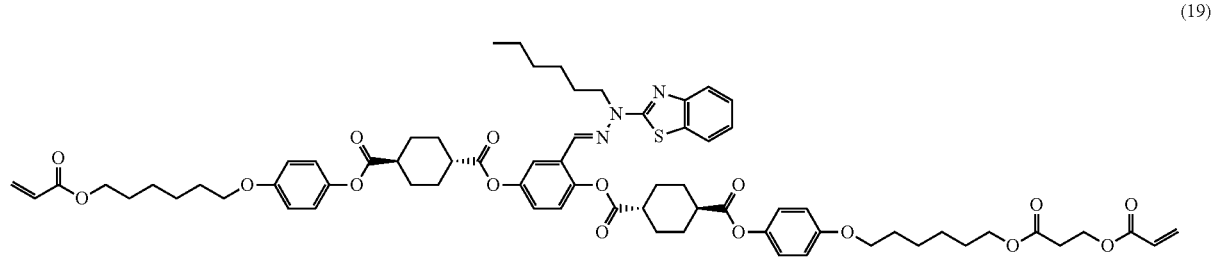

(19)

Such liquid crystal compounds can be used individually or in combination of two or more kinds thereof. In cases where the liquid crystal compound is used individually, the liquid crystal compound is preferably a polymerizable liquid crystal compound in terms of being fixed in a resin. In cases where the liquid crystal compounds are used in combination of two or more kinds thereof, preferably at least one, more preferably all, of the kinds is/are a radiation-polymerizable liquid crystal compound(s) in terms of being fixed in a resin.

The amount of the radiation-polymerizable liquid crystal compound contained in the first ionizing radiation-curable resin composition is preferably 60% by mass or more and 99.9% by mass or less, more preferably 65% by mass or more and 98% by mass or less, with respect to all of the solids in the first ionizing radiation-curable resin composition. Containing the radiation-polymerizable liquid crystal compound in an amount of 60% by mass or more makes it possible to obtain favorable alignment, and 98% by mass or less allows the first ionizing radiation-curable resin composition to have a sufficient amount of polymerization initiator, thus making it possible to obtain favorable reactivity.

<Radiation-Polymerizable Compound>

A radiation-polymerizable compound that can be used is the same radiation-polymerizable compound as described in the section for the first ionizing radiation-curable resin composition, and is not described here.

<Polymerization Initiator>

A polymerization initiator that can be used is the same polymerization initiator as described in the section for the first ionizing radiation-curable resin composition.

The amount of the polymerization initiator is preferably 0.01% by mass or more and 20% by mass or less, more preferably 0.5% by mass or more and 5% by mass or less, with respect to all of the solids in the first ionizing radiation-curable resin composition, in terms of ensuring the curability in the thickness direction.

<Surfactant 22

A surfactant that is preferably used is one or more selected from fluorine surfactants having a radiation-polymerizable group and silicon surfactants having a radiation-polymerizable group.

The amount of the surfactant is preferably 0.01% by mass or more and 2.0% by mass or less, more preferably 0.1% by mass or more and 1.0% by mass or less, with respect to all of the solids in the second ionizing radiation-curable resin composition, in terms of obtaining favorable leveling properties and alignment.

<Solvent>

The solvent is the same solvent as described in the section for the second ionizing radiation-curable resin composition, and is not described here.

The amount of the solvent contained in the second ionizing radiation-curable resin composition is preferably 50% by mass or more and 90% by mass or less, more preferably 70% by mass or more and 80% by mass or less, in the second ionizing radiation-curable resin composition, in terms of the stability of the second ionizing radiation-curable resin composition.

<<<Third Resin Layer>>>

A third resin layer 153 functions as an alignment layer for aligning the liquid crystal compound in a predetermined direction in the second ionizing radiation-curable resin composition when the second resin layer 152 is formed. After the second resin layer 152 is formed, the third resin layer 153 may function as an optical adjustment layer. In cases where the third resin layer 153 functions as an optical adjustment layer, the refractive index of the third resin layer 153 is adjusted so as to be between the refractive index of the first resin layer 151 and the refractive index of the second resin layer 152. Forming the third resin layer 153 having such a refractive index makes it possible to decrease reflection generated at the interfacial boundary between the first resin layer 151 and the second resin layer 152 and to decrease the haze.

The third resin layer 153 can be formed as an alignment layer by applying a composition for the third resin layer to the first resin layer 151 to impart an alignment restraining force. A composition that can be used for the third resin layer is suitably selected from conventionally known materials such as photodimerization type materials. A means for imparting an alignment restraining force to the third resin layer 153 can be a conventionally known one, and examples of such a means include a rubbing method, photo-alignment method, and a shaping method.

The third resin layer 153 preferably has a film thickness of 1 nm or more and 1000 nm or less. With a film thickness of 1 nm or more, the third resin layer 153 can be formed as a layer, and with 1000 nm or less, the flexibility is favorable. It is more preferable that the minimum film thickness of the third resin layer 153 is 5 nm or more, 10 nm or more, or 100 nm or more, in terms of making it possible to ensure the layer formation, and it is more preferable that the maximum is 900 nm or less, 800 nm or less, or 500 nm or less, in terms of obtaining excellent flexibility. The film thickness of the third resin layer is defined as the arithmetic mean of thickness values measured at 10 different locations, where a cross-section of the third resin layer is imaged using a scanning transmission electron microscope (STEM) or a transmission electron microscope (TEM), and the thickness of the third resin layer is measured at the 10 locations within the image of the cross-section.

<<<Release Film>>>

The release film 160 is used in such a manner that the release film 160 is removed from the polarizer protective film 150 so that the polarizer protective film 150 can be transferred to the below-mentioned polarizer. After the polarizer protective film 150 is transferred to the polarizer, the release film 160 is removed, and thus, the release film 160 may be light-transmitting, or does not need to be light-transmitting.

The thickness of the release film 160 is not limited to any particular value but is preferably 25 μm or more and 100 μm or less. The release film 160 having a thickness of 25 μm or more makes it possible that, when the second ionizing radiation-curable resin composition is cured by ionizing radiation, the cure shrinkage of the first resin layer 151 has a smaller influence, thus inhibiting the release film 160 from generating wrinkles. In addition, the release film 160 having a thickness of 100 μm or less makes it possible to inhibit the production cost from increasing.

The release film 160 is preferably, but not limited particularly to, a polyethylene terephthalate (PET) film. The third resin layer 153 is heated to approximately 100° C. when formed, and thus, using a polyethylene film as the release film will undesirably cause thermal shrinkage, but a PET film has excellent heat resistance, and thus, will not cause thermal shrinkage during the formation of the third resin layer 153. In addition, a PET film has excellent smoothness.

Among PET films, a PET film at least one face of which is untreated is suitably used. In this case, the untreated face of such a PET film is used as a removal face. A PET film at least one face of which is untreated is excellently releasable from the first resin layer 151, and besides, inexpensive, thus making it possible to control the production cost of the polarizer protective film transferring member 140 at a low level. For example, in cases where a release film coated with, for example, a Si-based release agent containing a silicon atom is used as the above-mentioned release film, the release film has favorable removability, but at the same time, a component of the release agent migrates to the first resin layer side during the transfer of the polarizer protective film, whereby the roughness of the surface of the second resin layer will undesirably increase. In contrast with this, using, as the release film 160, a PET film at least one face of which is untreated involves no component being transferred to the first resin layer 151 during the transfer of the polarizer protective film 150, thus causing the roughness of the surface of the first resin layer 151 to be small, and causing the contact angle of water to be less likely to change on the surface of the first resin layer 151 after the transfer. As used herein, the "polyethylene terephthalate film at least one face of which is untreated" refers to a PET film having a face which is not surface-treated. Accordingly, no release agent for enhancing removability exists on the untreated face(s) of a PET film having at least one such untreated face.

The release film 160 is more preferably a PET film one face of which is untreated and the other face of which has an underlayer thereon. Such a PET film not only has an effect caused by the absence of the above-mentioned release agent, but also allows the underlayer to function as a blocking prevention layer, thus making it possible that, when the polarizer protective film transferring member 140 is wound in roll shape, portions of the polarizer protective film transferring member 140 are inhibited from sticking to each other.

<<<<Method of Producing Polarizer Protective Film and Polarizer Protective Film Transferring Member>>>>

The polarizer protective film transferring member 140 and the polarizer protective film 150 can be produced, for example, as below-mentioned. First, the first ionizing radiation-curable resin composition is applied to one face 160A of the release film 160, and dried to form a coating film 154 of the first ionizing radiation-curable resin composition, as depicted in FIG. 17(A).

Figure 17B:
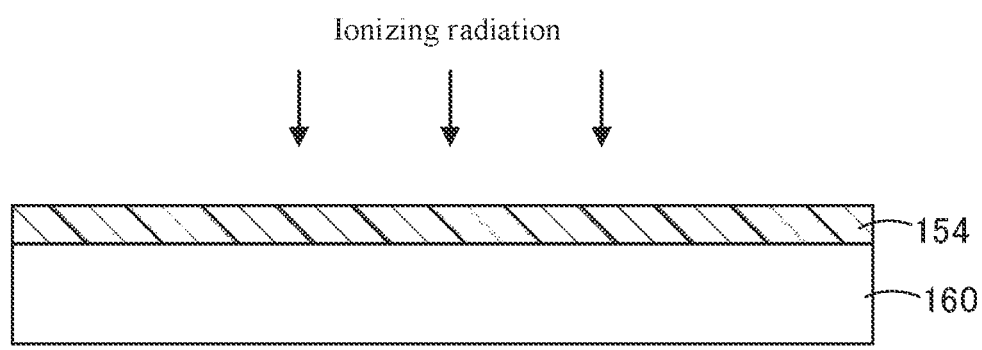

Next, the coating film 24 is exposed to ionizing radiation such as ultraviolet light, as depicted in FIG. 17(B), to cure the first ionizing radiation-curable resin composition, thereby curing the coating film 154. Thus, a first resin layer 151 is formed.

Figure 18A:
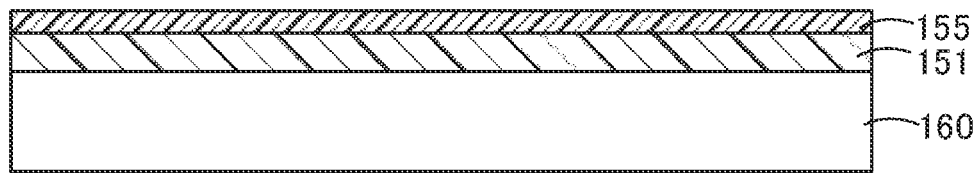
FIG. 18(A) and FIG. 18(B) schematically illustrate the production steps of a polarizer protective film transferring member according to the third embodiment.

After the first resin layer 151 is formed, a composition for a third resin layer is applied to the surface of the first resin layer 151 and dried to form a coating film 155 of the composition for the third resin layer, as depicted in FIG. 18(A).

Figure 18B:
Figure 18B:
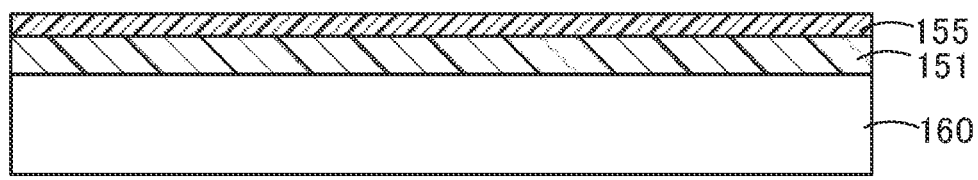

Then, as depicted in FIG. 18(B), the coating film 155 is heated at a temperature of 60° C. or more and 150° C. or less to cure the coating film 155. Thus, a third resin layer 153 is formed.

Figure 19A:
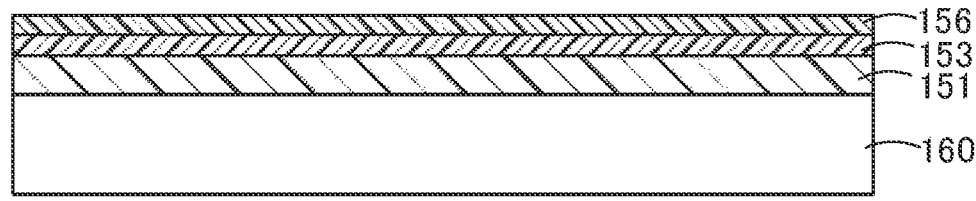
FIG. 19(A) to FIG. 19(C) schematically illustrate the production steps of a polarizer protective film transferring member according to the third embodiment.
Figure 20:
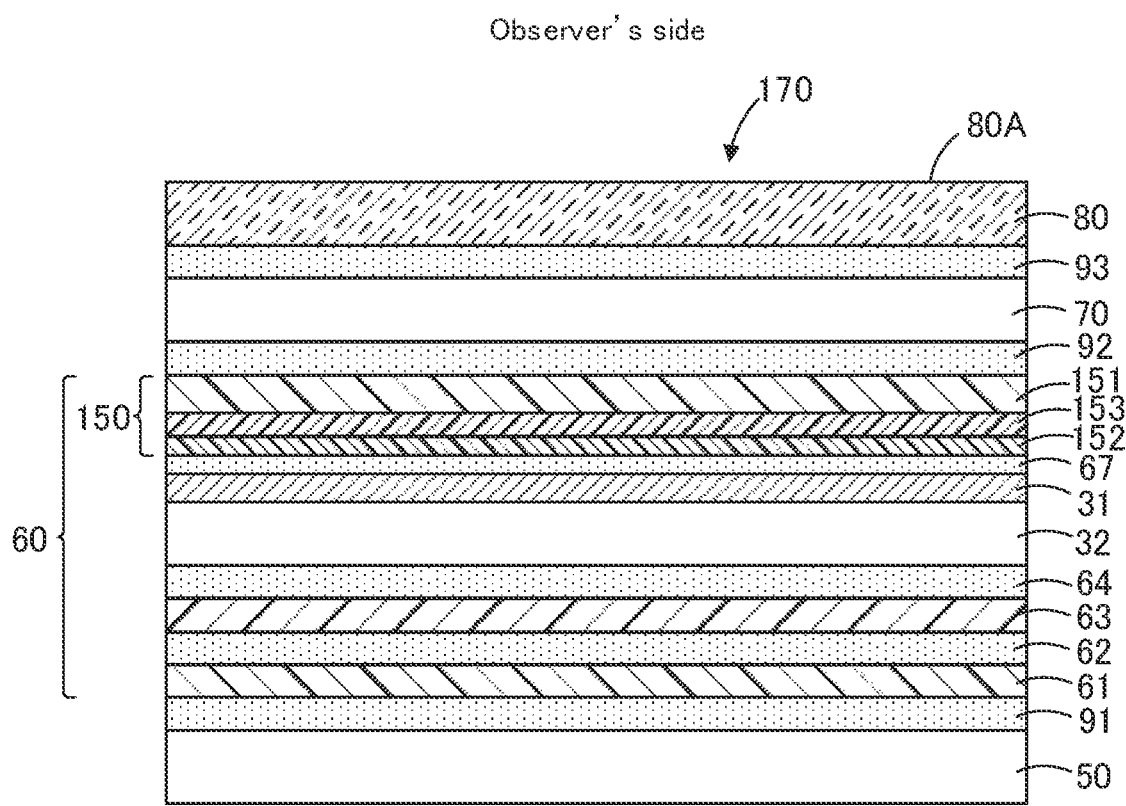
FIG. 20 is a schematic diagram of an image display device according to the third embodiment.

After the third resin layer 153 is formed, a second ionizing radiation-curable resin composition is applied to the surface of the third resin layer 153 and dried to form a coating film 156 of the second ionizing radiation-curable resin composition, as depicted in FIG. 19(A).

Figure 19B:
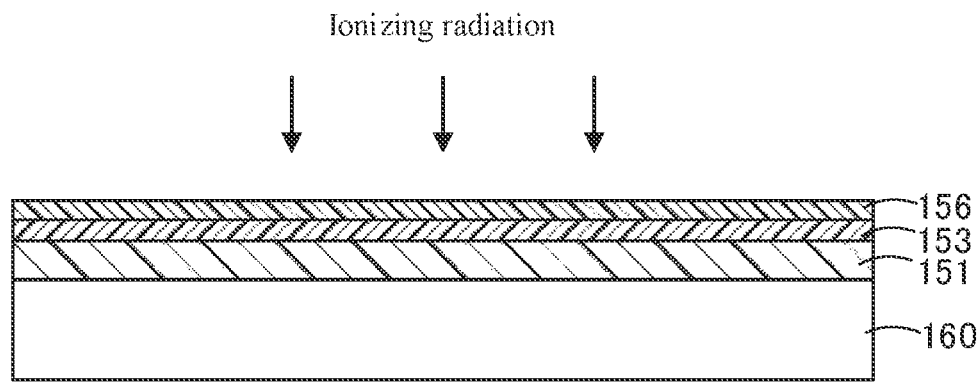

Next, the coating film 156 is exposed to ionizing radiation such as ultraviolet light, as depicted in FIG. 19(B), to cure the second ionizing radiation-curable resin composition, thereby curing the coating film 156. Thus, the second resin layer 152 is formed to obtain the polarizer protective film transferring member 140 as depicted in FIG. 16.

Figure 19C:
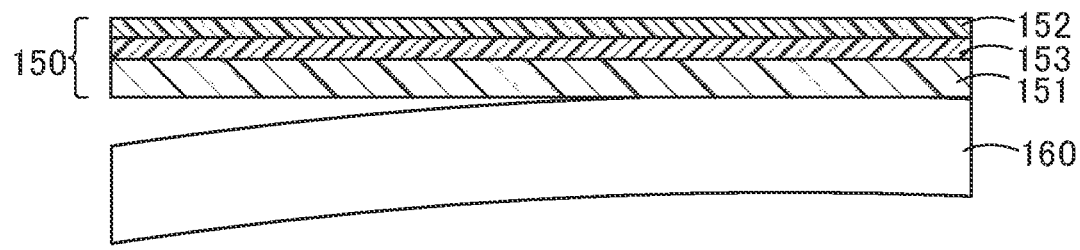

In cases where the polarizer protective film 150 alone is obtained from the polarizer protective film transferring member 140, the release film 160 is removed from the polarizer protective film 150, as depicted in FIG. 19(C). It is preferable that the release film 160 is removed with the polarizer protective film transferring member 140 attached to the polarizer.

<<<<Polarizing Plate and Image Display Device>>>>

The polarizer protective film 150 can be incorporated into an image display device in the same manner as the optical film 10, and be thus used. An image display device 170 depicted in FIG. 20 includes a polarizer protective film 150. In FIG. 20, the elements indicated by the same reference numbers as in FIG. 7 are the same elements as indicated in FIG. 7, and are not described here.

In cases where the display element 50 is a light-emitting element which emits blue light, such as an OLED element, the relationship $\lambda 1 > \lambda 2 > \lambda 3$ is preferably satisfied, wherein $\lambda 1$ is the light-emitting peak wavelength of the blue light emitted from the light-emitting element, $\lambda 2$ is the absorption start wavelength of the first resin layer 151, and $\lambda 3$ is the absorption start wavelength of the second resin layer 152. The image display device 170 satisfying the relationship makes it possible to inhibit absorption of blue light emitted from the light-emitting element and to inhibit the second resin layer 152 from being deteriorated by ultraviolet light.

The light-emitting wavelength A1 of the display element 50 can be measured using a spectroradiometer (product name "CS2000" manufactured by Konica Minolta, Inc.) under conditions at a measurement angle of 1°. In addition, to determine the absorption start wavelength $\lambda 2$ of the first resin layer 151 and the absorption start wavelength $\lambda 3$ of the second resin layer 152, a color filter spectral inspection system (device name "LCF-100MA-SF" manufactured by Otsuka Electronics Co., Ltd.) is first used to measure the transmittance spectrum of each layer in the wavelength range of 380 nm or more and 480 nm or less using a spot diameter of 2 μm and using a halogen lamp as the light source, and to determine the slope of the transmittance spectrum at wavelength intervals of 10 nm. Then, a wavelength at which the slope sharply decreases as seen overall on the data of the slope is found, and the wavelength is regarded as the absorption start wavelength.

In the circularly polarizing plate 60, the second resin layer 152 of the polarizer protective film 150 is located closer to the polarizer 31 than the first resin layer 151 is. Arranging the polarizer protective film 150 in such a manner makes it possible that the first resin layer 151 inhibits the second resin layer 152 from being deteriorated by ultraviolet light.

The spectral transmittance, yellow index, smallest diameter with which no crack is generated during a mandrel test, and methods of measuring these for the circularly polarizing plate 60 are the same as the spectral transmittance, yellow index, smallest diameter with which no crack is generated during a mandrel test, and methods of measuring these for the polarizer protective film 150.

In cases where the circularly polarizing plate 60 is attached to another film via an adhesive layer or an adhesion layer, the another film should be removed by the same method as the method described in the section for the polarizer protective film 150 before measuring the spectral transmittance and the yellow index and performing a mandrel test. Even if such a removal process is performed, the measurement of each item is not significantly affected.

<<Polarizer>>

The polarizer 31 is arranged between the polarizer protective film 150 and the protective film 32. The polarizer protective film 150 is preferably arranged in such a manner that the angle made between the lagging axis of the polarizer protective film 150 and the absorption axis of the polarizer 31 is 30° or more and 60° or less. Arranging the polarizer protective film 150 at such an angle makes it possible to obtain high light transmittance at any angle which polarized sunglasses make with the display screen of the image display device 170. In terms of obtaining higher light transmittance, it is more preferable that the angle made between the lagging axis of the polarizer protective film 150 and the absorption axis of the polarizer 31 is 40° or more and 50° or less.

When the polarizer protective film 150 is transferred to the polarizer 31, for example, the polarizer 31 is first attached to the polarizer protective film 65, and then, the polarizer protective film transferring member 140 is attached to the polarizer 31 via a radiation-curable bonding agent. Then, the release film 160 is removed.

According to the present embodiment, the polarizer protective film 150 includes no base material, thus enabling the film to promise to be thinner.

In cases where the image display device includes a polarizer, outgoing light from the image display device is linearly polarized light. Accordingly, when the observer observes the display screen of the image display device through polarized sunglasses, the display screen will undesirably be markedly dark, and decrease in visibility, depending on the angle at which the display screen is observed. According to the present embodiment, however, the second resin layer 152 contains a liquid crystal compound, thus enabling the second resin layer 152 to function as a λ/4 retardation layer. This enables the linearly polarized light transmitted through the polarizer 31 to be circularly polarized light, making it possible to inhibit a decrease in the visibility of the displayed image even observed through polarized sunglasses.

EXAMPLES

Below, the present invention will be described in more detail with reference to Examples, and the present invention is not limited to the description of these Examples. Unless otherwise specified, "parts" and "%" as used herein are units expressed on a mass basis.

Examples A and Comparative Examples A

Example A1

Preparation of Underlayer Composition 1

Into a 200-mL four-neck flask equipped with a bulb condenser, a mercury thermometer, and an agitator, 4.0 g (0.013 mol) of 6-[5-(2-hydroxyethyl)-2H-benzotriazol-2-yl]benzo[1,3]dioxol-5-ol, 40 mL of toluene, 1.8 g (0.021 mol) of methacrylic acid, and 0.4 g (0.004 mol) of methanesulfonic acid were added, and the resulting mixture was dehydrated under reflux at 110 to 115° C. for four hours. Then, 30 mL of water and 0.6 g (0.006 mol) of sodium carbonate were added to the mixture, and the resulting mixture was left to stand to separate and remove the lower aqueous layer. To the remaining mixture, 0.2 g of activated charcoal was added, and the resulting mixture was refluxed with stirring to decolorize the mixture. After the resulting mixture was filtrated, 40 mL of toluene was removed under reduced pressure from the filtrate, to which 100 mL of isopropyl alcohol was subsequently added to precipitate crystals. The crystals were filtrated, and washed with 40 mL of isopropyl alcohol. Then, the resulting product was dried under reduced pressure at 40° C. to give 4.2 g of yellow crystals. The 4.2 g of yellow crystals were washed with isopropyl alcohol by repulping washing, and then dried under reduced pressure at 40° C. Thus, 3.4 g of 2-[2-(6-hydroxybenzo[1,3]dioxol-5-yl)-2H-benzotriazol-5-yl]ethylmethacrylate was obtained as a sesamol-bound benzotriazole compound.

Then, into a four-neck flask equipped with a Dimroth condenser, a mercury thermometer, a nitrogen gas inlet tube, and an agitator, 16 parts by mass of the synthesized 2-[2-(6-hydroxybenzo[1,3]dioxol-5-yl)-2H-benzotriazol-5-yl]ethylmethacrylate, 24 parts by mass of methyl methacrylate (MMA) as another monomer, 20 parts by mass of toluene and 20 parts by mass of methyl ethyl ketone as solvents, and 0.6 parts by mass of 1,1'-azobis(cyclohexane-1-carbonitrile) as a polymerization initiator were added. After the flask was purged for one hour with nitrogen gas at a flow rate of 10 mL/min with the resulting mixture being stirred, the reaction mixture was refluxed at a temperature of 90 to 96° C. to for 10 hours perform a polymerization reaction.

After completion of the polymerization reaction, 10 parts by mass of toluene and 10 parts by mass of methyl ethyl ketone (MEK) were added to the reaction mixture to give 100.6 parts by mass of a solution of an acrylic polymer 1 (ultraviolet absorber 1) in which the sesamol-bound benzotriazole compound was bound with MMA through reaction.

The acrylic polymer 1 and tricyclodecane dimethanol diacrylate (product name "A-DCP" manufactured by Shin-Nakamura Chemical Co., Ltd.) were mixed at a solid mass ratio of 60:40. To the resulting mixture, 4 parts by mass of polymerization initiator (Omnirad 184 manufactured by IGM Resins B.V. and IRGACURE (registered trademark) OXE01 manufactured by BASF Japan Ltd., at a mass ratio of 50:50) and 0.2 parts by mass of leveling agent (product name "F-568" manufactured by DIC Corporation) were added, and the resulting mixture was stirred to prepare an underlayer composition 1.

Preparation of Hard Coat Layer Composition 1

The acrylic polymer 1 was mixed with a mixture (product name "KAYARAD DPHA" manufactured by Nippon Kayaku Co., Ltd.) of dipentaerythritol hexaacrylate and dipentaerythritol pentaacrylate at a solid mass ratio of 45:55. To the resulting mixture, 4 parts by mass of polymerization initiator (Omnirad 184 manufactured by IGM Resins B.V. and ESACURE ONE manufactured by DKSH Japan Co., Ltd., at a mass ratio of 50:50) and 0.2 parts by mass of leveling agent (product name "F-568" manufactured by DIC Corporation) were added, and the resulting mixture was stirred to prepare a hard coat layer composition 1.
(Production of Optical Film)

The obtained underlayer composition 1 was applied, using a Mayer bar, to the surface of a cycloolefin polymer base material (product name "ZEONOR Film (registered trademark) ZF14-050" manufactured by Zeon Corporation) having a size of 210 mm×297 mm (A4 size) and a thickness of 50 µm to form a first coating film. Then, dry air at 50° C. was blown at a flow rate of 0.5 m/s over the formed first coating film for 30 seconds to evaporate the solvent from the first coating film, and the resulting first coating film was half-cured by exposure to ultraviolet light to a cumulative light dose of 120 mJ/cm$^2$.

After the half-cured first coating film is formed, the hard coat layer composition 1 was applied, using a Mayer bar, to the surface of the first coating film to form a second coating film. Then, dry air at 70° C. was blown at a flow rate of 0.5 m/s over the formed second coating film for 30 seconds to evaporate the solvent from the second coating film, and the resulting first coating film and second coating film were cured by exposure to ultraviolet light to a cumulative light dose of 200 mJ/cm$^2$ under a nitrogen atmosphere (having an oxygen concentration of 200 ppm or less) to form an underlayer having a film thickness of 1 µm as a first functional layer, a mixed layer having a film thickness of 0.4 µm, and a hard coat layer having a film thickness of 3 µm as a second functional layer. This afforded an optical film including an underlayer, a mixed layer, and a hard coat layer provided in this order on a cycloolefin polymer base material.

The film thickness of the underlayer was defined as the arithmetic mean of 10 film thickness values measured at 10 different locations, wherein a cross-section of the underlayer was imaged using a scanning transmission electron microscope (STEM), and the film thickness of the underlayer was measured at the 10 locations within the image of the cross-section. Specifically, the method of imaging a cross-section was as below-mentioned. First of all, a piece having a size of 1 mm×10 mm was cut out of an optical film and embedded in an embedding resin to produce a block, and homogeneous sections having a thickness of approximately 70 nm to 300 nm and having no openings or the like were sliced out of the block according to a commonly used sectioning technique. For the production of sections, an "Ultramicrotome EM UC7" (Leica Microsystems GmbH) and the like was used. Then, these homogeneous sections having no openings or the like were used as measurement samples. Then, cross-sections of the measurement sample were imaged using a scanning transmission electron microscope (STEM) (product name "S-4800" manufactured by Hitachi High-Technologies Corporation). The cross-section imaged using the S-4800, with the detector, accelerating voltage, and emission current set to "TE", "30 KV", and "10 µA" respectively, was observed. The focus, contrast, and brightness were suitably adjusted at a magnification in the range of from 10,000 to 100,000 times depending on the film thickness of the underlayer, in such a manner that each layer was able to be identified by observation. Furthermore, the condensing lens of "5.0" was used, and W.D. was "8.9 mm". In addition, the film thicknesses of the mixed layer and the hard coat layer were measured by the same method as the film thickness of the underlayer. In this regard, the film thicknesses of the underlayer, the mixed layer, and the hard coat layer were measured in Examples A2 to A16 and Comparative Examples A1 to A6 by the same method as in Example A1.

Example A2

An optical film was obtained in Example A2 in the same manner as in Example A1 except that the first coating film was exposed to ultraviolet light to a cumulative light dose of 200 mJ/cm$^2$ under a nitrogen atmosphere (having an oxygen concentration of 200 ppm or less) to half-cure the first coating film, thereby forming a mixed layer having a film thickness of 0.04 µm.

Example A3

An optical film was obtained in Example A3 in the same manner as in Example A1 except that the first coating film was exposed to ultraviolet light to a cumulative light dose of 200 mJ/cm² to half-cure the first coating film, thereby forming a mixed layer having a film thickness of 0.2 µm.

Example A4

An optical film was obtained in Example A4 in the same manner as in Example A1 except that the film thickness of the underlayer was 1.2 µm, and that the first coating film was exposed to ultraviolet light to a cumulative light dose of 70 mJ/cm² to half-cure the first coating film, thereby forming a mixed layer having a film thickness of 1 µm, and that the film thickness of the hard coat layer was 3.1 µm.

Example A5

An optical film was obtained in Example A5 in the same manner as in Example A1 except that the first coating film was exposed to ultraviolet light to a cumulative light dose of 100 mJ/cm² to half-cure the first coating film, thereby forming a mixed layer having a film thickness of 0.5 µm, and that the film thickness of the hard coat layer was 8 µm.

Example A6

An optical film was obtained in Example A6 in the same manner as in Example A1 except that the first coating film was exposed to ultraviolet light to a cumulative light dose of 70 mJ/cm² to half-cure the first coating film, thereby forming a mixed layer having a film thickness of 1 µm, and that the film thickness of the hard coat layer was 0.5 µm.

Example A7

An optical film was obtained in Example A7 in the same manner as in Example A1 except that an underlayer composition 2 was used in place of the underlayer composition 1, and that a hard coat layer composition 2 was used in place of the hard coat layer composition 1. The underlayer composition 2 and the hard coat layer composition 2 were prepared in the below-mentioned manner.

Preparation of Underlayer Composition 2

The acrylic polymer 1 and dicyclopentenyl acrylate (product name "FA-511AS" manufactured by Hitachi Chemical Co., Ltd.) were mixed at a solid mass ratio of 60:40. To the resulting mixture, 4 parts by mass of polymerization initiator (Omnirad 184 and Omnirad 819 manufactured by IGM Resins B.V., at a mass ratio of 50:50) and 0.2 parts by mass of leveling agent (product name "F-568" manufactured by DIC Corporation) were added, and the resulting mixture was stirred to prepare an underlayer composition 2.

Preparation of Hard Coat Layer Composition 2

The acrylic polymer 1 and urethane acrylate (product name "BEAMSET 577" manufactured by Arakawa Chemical Industries, Ltd.) were mixed at a solid mass ratio of 45:55. To the resulting mixture, 4 parts by mass of polymerization initiator (Omnirad 184 and Omnirad 819 manufactured by IGM Resins B.V., at a mass ratio of 50:50) and 0.2 parts by mass of leveling agent (product name "F-568" manufactured by DIC Corporation) were added, and the resulting mixture was stirred to prepare a hard coat layer composition 2.

Example A8

An optical film was obtained in Example A8 in the same manner as in Example A2 except that a mixed layer having a film thickness of 0.04 µm was formed using the underlayer composition 2 in place of the underlayer composition 1 and using the hard coat layer composition 2 in place of the hard coat layer composition 1.

Example A9

An optical film was obtained in Example A9 in the same manner as in Example A3 except that a mixed layer having a film thickness of 0.2 µm was formed using the underlayer composition 2 in place of the underlayer composition 1 and using the hard coat layer composition 2 in place of the hard coat layer composition 1.

Example A10

An optical film was obtained in Example A10 in the same manner as in Example A1 except that an underlayer composition 3 was used in place of the underlayer composition 1. The underlayer composition 3 was prepared in the below-mentioned manner.

Preparation of Underlayer Composition 3

An indole compound (product name "BONASORB UA-3912" manufactured by Orient Chemical Industries Co., Ltd.) (ultraviolet absorber 2) was mixed with dicyclopentenyl acrylate (product name "FA-511AS" manufactured by Hitachi Chemical Co., Ltd.) at a solid mass ratio of 10:90. To the resulting mixture, 4 parts by mass of polymerization initiator (Omnirad 184 and Omnirad 819 manufactured by IGM Resins B.V., at a mass ratio of 50:50) and 0.2 parts by mass of leveling agent (product name "F-568" manufactured by DIC Corporation) were added, and the resulting mixture was stirred to prepare an underlayer composition 3.

Example A11

An optical film was obtained in Example A11 in the same manner as in Example A1 except that an underlayer composition 4 was used in place of the underlayer composition 1. The underlayer composition 4 was prepared in the below-mentioned manner.

Preparation of Underlayer Composition 4

A hydroxyphenyltriazine ultraviolet absorber (product name "Tinuvin 479" manufactured by BASF SE) (ultraviolet absorber 3) was mixed with dicyclopentenyl acrylate (product name "FA-511AS" manufactured by Hitachi Chemical Co., Ltd.) at a solid mass ratio of 30:70. To the resulting mixture, 4 parts by mass of polymerization initiator (Omnirad 184 and Omnirad 819 manufactured by IGM Resins B.V., at a mass ratio of 50:50) and 0.2 parts by mass of leveling agent (product name "F-568" manufactured by DIC Corporation) were added, and the resulting mixture was stirred to prepare an underlayer composition 4.

Example A12

An optical film was obtained in Example A12 in the same manner as in Example A1 except that a cycloolefin polymer base material having a thickness of 25 µm, which was produced by stretching a cycloolefin polymer base material (product name "ZEONOR Film (registered trademark) ZF14-050" manufactured by Zeon Corporation) having a thickness of 50 µm at 150° C. so as to have an in-plane retardation of 100 nm, was used in place of the cycloolefin polymer base material (product name "ZEONOR Film (registered trademark) ZF14-050" manufactured by Zeon Corporation) having a thickness of 50 μm.

Example A13

An optical film was obtained in Example A13 in the same manner as in Example A1 except that a cellulose triacetate base material (product name "FUJITAC TD60UL" manufactured by Fuji Film Co., Ltd.) having a thickness of 60 μm was used in place of the cycloolefin polymer base material.

Example A14

An optical film was obtained in Example A14 in the same manner as in Example A1 except that a cellulose triacetate base material (product name "FUJITAC TJ25UL" manufactured by Fuji Film Co., Ltd.) having a thickness of 25 μm was used in place of the cycloolefin polymer base material.

Example A15

An optical film was obtained in Example A15 in the same manner as in Example A1 except that an acrylic resin base material (product name "OXIS (registered trademark)-ZU (40 μm)" manufactured by Okura Industrial Co., Ltd.) having a thickness of 40 μm was used in place of the cycloolefin polymer base material.

Example A16

An optical film was obtained in Example A16 in the same manner as in Example A1 except that an acrylic resin base material (product name "OXIS (registered trademark)-ZU (30 μm)" manufactured by Okura Industrial Co., Ltd.) having a thickness of 30 μm was used in place of the cycloolefin polymer base material.

Comparative Example A1

The underlayer composition 1 was applied, using a Mayer bar, to the surface of a cycloolefin polymer base material (product name "ZEONOR Film (registered trademark) ZF14-050" manufactured by Zeon Corporation) having a size of 210 mm×297 mm (A4 size) and a thickness of 50 μm to form a coating film. Then, dry air at 50° C. was blown at a flow rate of 0.5 m/s over the formed coating film for 30 seconds to evaporate the solvent from the first coating film, and the resulting first coating film was completed by exposure to ultraviolet light to a cumulative light dose of 400 mJ/cm$^2$ under a nitrogen atmosphere (having an oxygen concentration of 200 ppm or less). Thus, an underlayer having a film thickness of 1 μm was formed.

After the completely cured first coating film is formed, the hard coat layer composition 1 was applied, using a Mayer bar, to the surface of the first coating film to form a second coating film. Then, dry air at 70° C. was blown at a flow rate of 0.5 m/s over the formed coating film for 30 seconds to evaporate the solvent from the coating film, and the resulting coating film was cured by exposure to ultraviolet light to a cumulative light dose of 200 mJ/cm$^2$ under a nitrogen atmosphere (having an oxygen concentration of 200 ppm or less) to form a hard coat layer having a film thickness of 3 μm. This afforded an optical film including an underlayer and a hard coat layer provided in this order on a cycloolefin polymer base material. Here, no mixed layer was formed in the optical film in Comparative Example A1.

Comparative Example A2

An optical film was obtained in Comparative Example A2 in the same manner as in Example A1 except that the film thickness of the underlayer was 1.2 μm, and that the first coating film was exposed to ultraviolet light to a cumulative light dose of 300 mJ/cm$^2$ under a nitrogen atmosphere (having an oxygen concentration of 200 ppm or less) to half-cure the first coating film, thereby forming a mixed layer having a film thickness of 0.01 μm.

Comparative Example A3

An optical film was obtained in Comparative Example A3 in the same manner as in Example A1 except that the film thickness of the underlayer was 1.2 μm, that the first coating film was exposed to ultraviolet light to a cumulative light dose of 200 m J/cm$^2$ under a nitrogen atmosphere (having an oxygen concentration of 200 ppm or less) to half-cure the first coating film, thereby forming a mixed layer having a film thickness of 0.05 μm, and that the film thickness of the hard coat layer was 8 μm.

Comparative Example A4

An optical film was obtained in Comparative Example A4 in the same manner as in Example A1 except that the first coating film was exposed to ultraviolet light to a cumulative light dose of 50 mJ/cm$^2$ to half-cure the first coating film, thereby forming a mixed layer having a film thickness of 2.0 μm, and that the film thickness of the hard coat layer was 1.0 μm.

Comparative Example A5

An optical film was obtained in Comparative Example A5 in the same manner as in Comparative Example A1 except that the underlayer composition 2 was used in place of the underlayer composition 1, and that the hard coat layer composition 2 was used in place of the hard coat layer composition 1.

«Comparative Example A6»

An optical film was obtained in Comparative Example A6 in the same manner as in Example A1 except that a polyethylene terephthalate base material (product name "COSMO SHINE (registered trademark) A4100" manufactured by Toyobo Co., Ltd.) having a thickness of 50 μm was used in place of the cycloolefin polymer base material.

<Maximum Absorption Wavelength and Absorbance at Wavelength of 380 nm to 500 nm>

The maximum absorption wavelength λmax of the ultraviolet absorber 1 (acrylic polymer 1) and the absorbance thereof at a wavelength of 380 nm to 500 nm were measured using a spectrophotometer (product name "UV-2450" manufactured by Shimadzu Corporation; light source: tungsten lamp and deuterium lamp). The measurement of the maximum absorption wavelength λmax of the ultraviolet absorber 1 and the absorbance thereof was performed on a chloroform solution having, at a concentration of 40 ppm, a product resulting from allowing the obtained solution containing the ultraviolet absorber 1 to be dried under reduced pressure for removal of the solvent. The measurement of the maximum absorption wavelength λmax of the ultraviolet absorbers 2 and 3 and the absorbance thereof was performed on a chloroform solution having the ultraviolet absorbers 2 and 3 respectively at a concentration of 40 ppm. The results were as below-mentioned.

TABLE 1

|  | $\lambda_{max}$ (nm) | Absorbance | | | | |
|---|---|---|---|---|---|---|
|  |  | 380 nm | 390 nm | 400 nm | 440 nm | 500 nm |
| Ultraviolet Absorber 1 | 365 | 0.6 | 0.5 | 0.3 | 0.1 | 0.0 |
| Ultraviolet Absorber 2 | 390 | 0.7 | 0.9 | 0.7 | 0.1 | 0.0 |
| Ultraviolet Absorber 3 | 320 | 0.0 | 0.0 | 0.0 | 0.0 | 0.0 |

<Adhesion>

The optical films according to Examples A1 to A16 and Comparative Examples A1 to A6 were subjected to an endurance test, and the adhesion was evaluated before and after the endurance test. Specifically, a piece having a size of 100 mm×100 mm cut out of the optical film was arranged in an endurance test device (product name "Temperature & Humidity Chamber PL-1KP" manufactured by ESPEC Corp.) and left to stand in an endurance test under conditions at a temperature of 85° C. and a relative humidity of 85% for 240 hours. The optical film arranged in the endurance test device had no fault (no contamination of any extraneous substance), no crack, no wrinkle, and no fouling deposition, and also was in a flat configuration without any curling.

Then, the adhesion was evaluated before and after the endurance test in an environment at a temperature of 23° C. and a relative humidity of 50%. Specifically, the optical film according to each of Examples A1 to A16 and Comparative Examples A1 to A5 was first incised, using a cutter knife, with a grid in such a manner that the grid had 10 cells×10 cells, 1 mm square each, incised with lines perpendicular to each other. The incisions were made deeply sufficient to pass through the hard coat layer and the underlayer and reach the cycloolefin polymer base material. An adhesive tape (model number "No. 405" manufactured by Nichiban Co., Ltd.; width: 24 mm) was attached to the surface of the cured hard coat layer having the grid formed thereon, so as to cover all of the grid, and one end of the attached adhesive tape was grasped, held in the generally vertical direction from the surface of the hard coat layer, and peeled off instantaneously, whereby the adhesion was evaluated. The evaluation criteria were as below-mentioned. The result that the number of pieces which remained undetached was 100, i.e., the peeling caused no detachment, was denoted by 100/100, and the result that all of the pieces underwent detachment was denoted by 0/100.

A: 100/100
   B: 99/100 to 50/100
   C: 0/100 to 49/100

<Pencil Hardness>

The pencil hardness of the surface of the optical film according to each of Example A1 to A16 and Comparative Example A to A6 (the surface of the hard coat layer) was measured. The pencil hardness was measured by: cutting a sample having a size of 50 mm×100 mm out of an optical film; fixing the sample on a glass plate with Cello-tape (registered trademark), manufactured by Nichiban Co., Ltd., so as to generate no fold or wrinkle in the sample; and moving a pencil (product name "uni" manufactured by Mitsubishi Pencil Co., Ltd.) on the sample under a load of 300 g at a speed of 3 mm/second using a pencil hardness testing machine (product name "Pencil Scratch Hardness Tester (electric type)" manufactured by Toyo Seiki Seisaku-sho, Ltd.) in an environment at a temperature of 23° C. and a relative humidity of 50% or less. The pencil hardness of the sample was defined as the grade of the hardest pencil that did not scratch the surface of the sample during the pencil hardness test. A plural number of pencils having different hardnesses were used for the measurement of pencil hardness, and the pencil hardness test was repeated five times for each pencil. In cases where no scratch was visually recognized on the surface of the sample in four or more out of the five replicates when the surface of the sample was observed under transmitting fluorescent light, the pencil having the hardness was judged as having made no scratch on the surface of the sample.

<Evaluation of Visibility>

The visibility was evaluated using the optical film according to each of Examples A1 to A16 and Comparative Examples A1 to A6. Specifically, a piece having a size of 50 mm×50 mm cut out of an optical film was arranged in an OLED display device (product name "Galaxy SII" manufactured by Samsung Electronics Co., Ltd.); the device was lit as it was; the displayed image was observed through polarized sunglasses in a dark place and a bright place (with the illuminance at 400 lux around the OLED display device); and the image was evaluated for rainbow unevenness in accordance with the following criteria. Ten persons made an observation, and the evaluation determined by the most persons was regarded as the observation result.

A: no rainbow unevenness was observed through polarized sunglasses, and the visibility was favorable.
   B: a little rainbow unevenness was observed through polarized sunglasses, but the visibility was favorable.
   C: some rainbow unevenness was strongly observed through polarized sunglasses, and the visibility was poor.

<Spectral Transmittance>

The spectral transmittance of the optical film according to each of Examples A1 to A11, A13, and A15 was measured at a wavelength of 380 nm, 400 nm, 410 nm, and 440 nm in an environment at a temperature of 23° C. and a relative humidity of 50%. Specifically, a piece having a size of 50 mm×50 mm was cut out of each optical film and arranged in a spectrophotometer capable of measuring the transmittance in units of 0.5 nm (product name "UV-2450" manufactured by Shimadzu Corporation; light source: tungsten and deuterium lamps) in such a manner that the base material of the optical film faced toward the light source. The above-mentioned optical film, which had no fault (no contamination of any extraneous substance), no crack, no wrinkle, and no fouling deposition, and was in a flat configuration without any curling, was held in the spectrophotometer. In this configuration, the transmittance was measured at minimally five points which were each within 1 nm centered at each wavelength of 380 nm, 400 nm, 410 nm, and 440 nm under the following measurement conditions, and the mean of the values was calculated to determine the spectral transmittance at a wavelength of 380 nm, 400 nm, 410 nm, and 440 nm. The arithmetic mean of three measurements each at a wavelength of 380 nm, 400 nm, 410 nm, and 440 nm was regarded as the spectral transmittance at each wavelength.

(Measurement Conditions)
   Wavelength range: 300 nm to 780 nm
   Scan speed: high
   Slit width: 2.0

Sampling interval: Auto (0.5-nm intervals)
Illumination: C
Light source: D2 and WI
Visual field: 2° Light source switching wavelength: 360 nm
S/R switching: standard
Detector: PM
Auto-zero: performed at 550 nm after baseline scan
<Yellow Index (YI)>

The yellow index of the optical film according to each of Examples A1 to A11, A13, and A15 was measured. Specifically, a piece having a size of 50 mm×50 mm was first cut out of the optical film and arranged in a spectrophotometer (product name "UV-2450" manufactured by Shimadzu Corporation; light source: tungsten and deuterium lamps) in an environment at a temperature of 23° C. and a relative humidity of 50% in such a manner that the base material of the optical film faced toward the light source. The optical film was held in the spectrophotometer, having no fault (no contamination of any extraneous substance), no crack, no wrinkle, and no fouling deposition, and also in a flat configuration without any curling. In this configuration, the transmittance was measured in the wavelength range of from 300 nm to 780 nm. Then, the measurement data of the above-mentioned transmittance was read on a PC connected to the UV-2450, and the "YI" in the calculation menu was checked to obtain a YI value. The conditions for measuring the transmittance in the wavelength range of from 300 nm to 780 nm were the same as the above-mentioned conditions for measuring the spectral transmittance at a wavelength of 380 nm and so on.

<Measurement of Total Light Transmittance>

The total light transmittance of the optical film according to each of Examples A1 to A11, A13, and A15 was measured using a haze meter (product name "HM-150" manufactured by Murakami Color Research Laboratory Co., Ltd.) in accordance with JIS K7361: 1997 in an environment at a temperature of 23° C. and a relative humidity of 50%. The total light transmittance was defined as the arithmetic mean of three measurement values obtained from one optical film, wherein a piece having a size of 50 mm×50 mm was cut out of the optical film, and the piece without curl or wrinkle and without any dirt such as fingerprints or grime was then placed in the haze meter in such a manner that the light-transmitting base material faced toward the light source.

<Measurement of Haze>

The haze value (total haze value) of the optical film according to each of Examples A1 to A11, A13, and A15 was measured using a haze meter (product name "HM-150" manufactured by Murakami Color Research Laboratory Co., Ltd.) in accordance with JIS K7136: 2000 in an environment at a temperature of 23° C. and a relative humidity of 50%. The haze value was defined as the arithmetic mean of three measurement values obtained from one optical film, wherein a piece having a size of 50 mm×50 mm was cut out of the optical film, and the piece without curl or wrinkle and without any dirt such as fingerprints or grime was then placed in the haze meter in such a manner that the light-transmitting base material faced toward the light source.

<Blue Light Cut-Off (Blocking) Rate>

The blue light cut-off rate (BL cut-off rate) of the optical film according to each of Examples A1 to A11, A13, and A15 was measured. Specifically, a piece having a size of 50 mm×50 mm was first cut out of the optical film and arranged in a spectrophotometer capable of measuring the transmittance in units of 0.5 nm (product name "UV-2450" manufactured by Shimadzu Corporation; light source: tungsten and deuterium lamps) in such a manner that the base material of the optical film faced toward the light source. The cut-out optical film was held in the spectrophotometer, having no fault (no contamination of any extraneous substance), no crack, no wrinkle, and no fouling deposition, and also in a flat configuration without any curling. In this configuration, the transmittance was measured at minimally five points which were each within 1 nm centered at a wavelength in the range of from 300 nm to 780 nm under the same conditions as the measurement conditions for the spectral transmittance. Then, the blue light cut-off rate was determined in accordance with the above-mentioned mathematical equation (1). The arithmetic mean of three measurements was regarded as the blue light cut-off rate.

<Light Resistance Test>

The optical film according to each of Examples A1 to A11, A13, and A15 was attached to an OLED display device via an adhesive layer, and subjected to a light resistance test. The brightness before and after the light resistance test was measured to verify whether the OLED display device was deteriorated. First, a piece having a size of 50 mm×50 mm cut out of the optical film was attached to an OLED display device (product name "Galaxy SII" manufactured by Samsung Electronics Co., Ltd.) via an adhesive layer (product name "PANACLEAN (registered trademark) PD-S1" manufactured by Panac Co., Ltd.). Here, the optical film was attached in such a manner that the hard coat layer was closer to the observer's side than the light-transmitting base material was. Thus, an image display device in which an OLED display device, an adhesive layer, and an optical film were laminated in this order toward the observer was obtained.

Then, the OLED display device was lit to measure the brightness before the light resistance test. The brightness of light emitted from the surface of the image display device (the surface of the optical film) was measured in the thickness direction of the image display device using a spectroradiometer (product name "CS2000" manufactured by Konica Minolta, Inc.) under conditions at a measurement angle of 1°. Then, a light stability testing device (product name "UV Fade Meter U48AU" manufactured by Suga Test Instruments Co., Ltd.) was used to perform a light resistance test, in which the image display device was exposed to light from a carbon arc lamp in an environment at 42° C. and a relative humidity of 50% for 50 hours. Then, the image display device after the light resistance test was lit to measure the brightness under the same conditions as for the measurement of the brightness of the image display device before the light resistance test. In the same manner, a light stability testing device (product name "UV Fade Meter U48AU" manufactured by Suga Test Instruments Co., Ltd.) was used to perform a light resistance test, in which the image display device was exposed to light from a carbon arc lamp in an environment at 42° C. and a relative humidity of 50% for 100 hours. Then, the image display device after the light resistance test was lit to measure the brightness under the same conditions as for the measurement of the brightness of the image display device before the light resistance test.

The brightness maintenance rate as the ratio of the brightness after the light resistance test to the brightness before the light resistance test was determined from these measured brightness values. The brightness maintenance rate was determined in accordance with the below-mentioned equation, wherein D is the brightness maintenance rate (%), E is the brightness of the surface of the lighted image display device before the light resistance test, and F is the brightness of the surface of the lighted image display device after the light resistance test.

$$D = F/E \times 100$$

Then, whether the OLED display device was deteriorated by the light resistance test was verified from the obtained brightness maintenance rate. Specifically, a brightness maintenance rate of less than 60% was judged as indicating that the OLED display device was deteriorated and a brightness maintenance rate of 60% or more was judged as indicating that the OLED display device was not deteriorated. The evaluation criteria were as below-mentioned.

A: no deterioration of the OLED display device was found.

B: deterioration of the OLED display device was found.

<Indentation Hardness ($H_{IT}$) of Layer Containing Ultraviolet Absorber>

The indentation hardness of the layer containing an ultraviolet absorber and included in the optical film according to each of Examples A1 to A11, A13, and A15 was measured. That is, the indentation hardness of the hard coat layer containing the ultraviolet absorber 1 was measured in each of Examples A1 to A11, A13, and A15. The indentation hardness ($H_{IT}$) was measured using a TI950 TriboIndenter manufactured by Hysitron, Inc. Specifically, a piece having a size of 1 mm×10 mm was first cut out of each optical film and embedded in an embedding resin to produce a block, from which measurement samples suitable for the hardness measurement by the nanoindentation technique were produced. For the production of measurement samples, a "Ultramicrotome EM UC7" (Leica Microsystems GmbH) was used. Then, the measurement sample was fixed on the stage of a TI950 TriboIndenter manufactured by Hysitron, Inc., in such a manner that the surface of the measurement sample to which an indenter was to be pressed was arranged parallel to the top surface of the stage. Then, a Berkovich indenter was pressed into the central flat portion of the cross-section of the hard coat layer containing the ultraviolet absorber using a load control method at a rate of 10 µN/second under a load applied for 30 seconds starting at 0 µN and ending at 300 µN in such a manner that the maximum indentation load became 300 µN. Then, the portion was held under 300 µN for five seconds, and then, unloaded from 300 µN to 0 µN in 30 seconds. Then, an indentation depth h (nm) corresponding to an indentation load F(N) thus obtained was continuously measured to prepare a load-displacement curve. From the prepared load-displacement curve, an indentation hardness $H_{IT}$ was determined in accordance with the above-mentioned equation (2) using a value obtained by dividing the maximum indentation load $F_{max}$(N) by a projection area $A_p$ (mm²) over which the indenter and the layer containing the ultraviolet absorber were in contact with each other. The arithmetic mean of the measurements at 10 different locations was regarded as the indentation hardness. Here, $A_p$ was a value determined in accordance with the above-mentioned equation (3).

<Scratch Resistance Test>

The surface of the optical film according to each of Examples A1 to A11, A13, and A15 was subjected to a scratch resistance test. Specifically, a piece having a size of 50 mm×50 mm was first cut out of the optical film, and the back face of the piece was attached to an acrylic plate (product name "COMOGLAS DFA502K" manufactured by Kuraray Co., Ltd.) having a size of 100 mm×100 mm and a thickness of 2 mm via a transparent adhesive layer having a film thickness of 50 µm (refractive index: 1.55; product name "PANACLEAN (registered trademark) PD-S1" manufactured by Panac Co., Ltd.). Then, a scratch resistance test was performed, in which the surface of the optical film piece was scrubbed to and fro 10 times under a load of 100 g/cm² using steel wool of grade #0000 (product name "Bonstar" manufactured by Nihon Steel Wool Co., Ltd.). A check was made by visual observation on whether any scratch was found on the surface of the optical film piece. The evaluation results were based on the following evaluation criteria.

A: no scratch was found.

B: a few scratch(es) was/were found, but at a level which was not problematic for practical use.

C: a scratch(es) was/were clearly found.

<Evaluation of Flexibility>

(1) Evaluation of Crack and Break after Folding Test

The optical film according to each of Examples A1 and A12 to A16 was subjected to a folding test to be evaluated for any crack or break. Specifically, a rectangular sample having a size of 125 mm×50 mm was first cut out of each optical film. After the sample was cut out, the sample was mounted on a tension free U-shape folding test machine (product name "DLDMLH-FS" manufactured by Yuasa System Co., Ltd.) as a folding endurance testing machine, by fixing the short edges (50 mm) of the sample to the fixing members, as depicted in FIG. 2(C), in such a manner that the minimum gap distance between the two opposing edges was 6 mm (the outer diameter of a bent part: 6 mm), and was tested under the following conditions by repeating the folding test 100,000 times, in each of which the hard coat layer in the sample was folded 180° back inward (the hard coat layer was folded inward, and the base material was folded outward).

(Folding Conditions)

Reciprocating speed: 80 rpm (revolutions per minute)

Test stroke: 60 mm

Bend angle: 180°

Then, whether any crack or break was formed at the bent part was examined. The evaluation criteria were as below-mentioned. When a prospective bent part of each optical film was observed before the folding test, no crack or break was found. The evaluation criteria were as below-mentioned.

(Foldability)

A: no crack or break at the bent part was found after the folding test.

B: a few cracks were found at the bent part after the folding test, but at a level which was not problematic for practical use.

C: some cracks and/or breaks were found at the bent part after the folding test.

In addition, the same sample as described above was newly produced from the optical film according to each of Examples A1 and A12 to A16, and the sample was mounted on the machine by fixing the short edges of the sample to the fixing members in such a manner that the minimum gap distance q between the two opposing edges was 6 mm (the outer diameter of a bent part: 6 mm), and was tested by repeating the folding test 200,000 times, in each of which the hard coat layer in the sample was folded 180° back inward, and the sample subjected to the folding test was observed to find any crack or break, and was evaluated based on the above-mentioned criteria, in the same manner as above-mentioned. Furthermore, the same sample as described above was newly produced from the optical film according to each of Examples A1 and A12 to A16, and the sample was mounted on the machine by fixing the short edges of the sample to the fixing members in such a manner that the minimum gap distance φ between the two opposing edges was 4 mm, and was tested by repeating the folding test 200,000 times, in each of which the hard coat layer in the sample was folded 180° back inward, and the sample subjected to the folding test was observed to find any crack or break, and was evaluated based on the above-mentioned criteria, in the same manner as above-mentioned.

(2) Evaluation of Crease after Folding Test

The appearance of the optical film according to each of Examples A1 and A12 to A16 was observed after the folding test, and the bent part of the optical film was evaluated for any crease generated. The folding test was performed by the same three methods ((1) smallest gap distance φ: 6 mm; folding: 100,000 times; (2) smallest gap distance φ: 6 mm; folding: 200,000 times; and (3) smallest gap distance φ: 4 mm; folding: 200,000 times) as described in the section for the evaluation of crack and break after the above-mentioned folding test. The creases were visually observed in an environment at a temperature of 23° C. and a relative humidity of 50%. The creases were observed by thoroughly observing both the inner and outer surfaces at the bent part under unfolded conditions in transmitted light and reflected light at a room under a white color illumination (at 800 lux to 2,000 lux). For observation of the creases, marks were drawn on both the edges perpendicular to the folding direction in the bent part, with a permanent marker, to indicate the position of the bent part for ease of finding the position of an area to be observed, as depicted in FIG. 3, when each sample that had not been subjected to a folding test was fixed to fixing members of the tension free U-shape folding test machine and was folded once. In addition, each sample was dismounted from the tension free U-shape folding test machine after the folding test, and lines connecting the marks on both the edges of the bent part were drawn with a permanent marker. Then, the entire region of the bent part formed by the marks on both the edges of the bent part and by the lines connecting the marks was visually observed to find creases. When a prospective bent part of each optical film was observed before the folding test, no crease was found. The evaluation criteria were as below-mentioned.

A: no crease was detected in the optical film after the folding test.
B: a slight crease(s) was/were detected in the optical film after the folding test, but at a level which was not problematic for practical use.
C: a crease(s) was/were detected in the optical film after the folding test.

(3) Evaluation of Microcrack after Folding Test

The appearance of the optical film according to each of Examples A1 and A12 to A16 was observed after the folding test, and the bent part of each optical film was evaluated for any microcrack generated. The folding test was performed by the same method (smallest gap distance φ: 6 mm; folding: 100,000 times) as described in the section for the evaluation of crack and break after the above-mentioned folding test. The microcracks were observed using a digital microscope (product name "VHX-5000" manufactured by Keyence Corporation) in an environment at a temperature of 23° C. and a relative humidity of 50%. Specifically, each sample subjected to the folding test was first slowly unfolded and was fixed on a stage of the microscope by means of a tape. When the creases were tight, an area to be observed was made as smooth as possible. However, the area to be observed (at the bent part) at and around the center of the sample was not touched by hand and was protected from any excessive force. Then, the area on both the inner and outer surfaces were observed under unfolded conditions. The microcracks were observed at a magnification of 200 times in reflected light under darkfield conditions using a ring light selected as the light source for the digital microscope. For observation of the microcracks, marks were drawn on both the edges perpendicular to the folding direction in the bent part, with a permanent marker, to indicate the position of the bent part for ease of finding the position of an area to be observed, as depicted in FIG. 3, when each sample that had not been subjected to a folding test was fixed to fixing members of the tension free U-shape folding test machine and was folded once. In addition, each sample was dismounted from the tension free U-shape folding test machine after the folding test, and lines connecting the marks on both the edges of the bent part were drawn with a permanent marker. Furthermore, for observation of microcracks, the microscope was positioned such that the center of the bent part was in alignment of the center of the field of view of the microscope. When a prospective bent part of each optical film was observed before the folding test, no microcrack was found. The evaluation criteria were as below-mentioned.

(Microcrack)
A: no microcrack was detected in the optical film after the folding test.
B: a small microcrack(s) was/were detected in the optical film after the folding test, but at a level which was not problematic for practical use.
C: a microcrack(s) was/were detected in the optical film after the folding test.

The results are seen in Table 2 to Table 5 below.

TABLE 2

| | Base Material | | Film Thickness (μm) | | | Film Thickness | Adhesion | | Pencil Hardness | Evaluation of Visibility |
| | | | | | | | Before | After | | |
| | Type | Thickness (μm) | Underlayer | Mixed Layer | HC Layer | Total | Ratio of Mixed Layer (%) | Endurance Test | Endurance Test | | |
| --- | --- | --- | --- | --- | --- | --- | --- | --- | --- | --- | --- |
| Example A1 | COP | 50 | 1.0 | 0.4 | 3.0 | 4.40 | 9.09 | A | A | B | A |
| Example A2 | COP | 50 | 1.0 | 0.04 | 3.0 | 4.04 | 0.99 | A | B | B | A |
| Example A3 | COP | 50 | 1.0 | 0.2 | 3.0 | 4.20 | 4.76 | A | A | B | A |
| Example A4 | COP | 50 | 1.0 | 1.0 | 3.1 | 5.30 | 18.9 | A | A | B | A |
| Example A5 | COP | 50 | 1.0 | 0.5 | 8.0 | 9.50 | 5.26 | A | A | F | A |
| Example A6 | COP | 50 | 1.0 | 1.0 | 0.5 | 2.50 | 40.0 | A | A | 3B | A |
| Example A7 | COP | 50 | 1.0 | 0.4 | 3.0 | 4.40 | 9.09 | A | A | B | A |
| Example A8 | COP | 50 | 1.0 | 0.04 | 3.0 | 4.04 | 0.99 | A | B | B | A |
| Example A9 | COP | 50 | 1.0 | 0.2 | 3.0 | 4.20 | 4.76 | A | A | B | A |
| Example A10 | COP | 50 | 1.0 | 0.4 | 3.0 | 4.40 | 9.09 | A | A | B | A |
| Example A11 | COP | 50 | 1.0 | 0.4 | 3.0 | 4.40 | 9.09 | A | A | B | A |
| Example A12 | COP | 25 | 1.0 | 0.4 | 3.0 | 4.40 | 9.09 | A | A | B | A |
| Example A13 | TAC | 60 | 1.0 | 0.4 | 3.0 | 4.40 | 9.09 | A | A | 2H | A |
| Example A14 | TAC | 25 | 1.0 | 0.4 | 3.0 | 4.40 | 9.09 | A | A | F | A |
| Example A15 | Acryl | 40 | 1.0 | 0.4 | 3.0 | 4.40 | 9.09 | A | A | H | A |

TABLE 2-continued

| | Base Material | | Film Thickness (μm) | | | Film Thickness | Adhesion | | Pencil | Evaluation |
| | Type | Thickness (μm) | Underlayer | Mixed Layer | HC Layer | Total | Ratio of Mixed Layer (%) | Before Endurance Test | After Endurance Test | Hardness | of Visibility |
|---|---|---|---|---|---|---|---|---|---|---|---|
| Example A16 | Acryl | 30 | 1.0 | 0.4 | 3.0 | 4.40 | 9.09 | A | A | H | A |
| Comparative Example A1 | COP | 50 | 1.0 | 0 | 3.0 | 4.00 | 0 | C | C | B | A |
| Comparative Example A2 | COP | 50 | 1.2 | 0.01 | 3.0 | 4.21 | 0.24 | B | C | B | A |
| Comparative Example A3 | COP | 50 | 1.2 | 0.05 | 8.0 | 9.25 | 0.54 | A | C | B | A |
| Comparative Example A4 | COP | 50 | 1.0 | 2.0 | 1.0 | 4.00 | 50.0 | A | A | 5B | A |
| Comparative Example A5 | COP | 50 | 1.0 | 0 | 3.0 | 4.00 | 0 | C | C | B | A |
| Comparative Example A6 | PET | 50 | 1.0 | 0.4 | 3.0 | 4.40 | 9.09 | A | A | H | C |

TABLE 3

| | Spectral Transmittance (%) | | | | | Total Light Transmittance (%) | Haze Value (%) |
|---|---|---|---|---|---|---|---|
| | 380 nm | 400 nm | 410 nm | 440 nm | YI | | |
| Example A1 | 0.0 | 0.2 | 5.1 | 86.9 | 8.8 | 91.1 | 0.2 |
| Example A2 | 0.0 | 0.2 | 5.9 | 87.5 | 8.4 | 91.2 | 0.2 |
| Example A3 | 0.0 | 0.3 | 5.5 | 86.0 | 9.4 | 91.1 | 0.2 |
| Example A4 | 0.0 | 0.1 | 2.2 | 86.3 | 9.8 | 91.0 | 0.2 |
| Example A5 | 0.0 | 0.0 | 0.1 | 82.2 | 13.0 | 90.8 | 0.2 |
| Example A6 | 0.0 | 4.7 | 24.4 | 88.9 | 5.4 | 91.2 | 0.2 |
| Example A7 | 0.0 | 0.1 | 4.0 | 85.5 | 9.8 | 91.0 | 0.2 |
| Example A8 | 0.0 | 0.2 | 4.3 | 85.5 | 9.7 | 91.0 | 0.2 |
| Example A9 | 0.0 | 0.1 | 4.2 | 85.9 | 9.6 | 91.0 | 0.2 |
| Example A10 | 0.0 | 1.6 | 12.6 | 87.5 | 7.2 | 91.0 | 0.2 |
| Example A11 | 0.0 | 1.7 | 18.3 | 87.9 | 6.6 | 91.0 | 0.2 |
| Example A13 | 0.0 | 0.2 | 5.3 | 86.7 | 8.5 | 91.8 | 0.5 |
| Example A15 | 0.0 | 0.3 | 6.4 | 86.8 | 8.6 | 90.5 | 0.5 |

TABLE 4

| | BL Cut-off Rate (%) | $H_{IT}$ (MPa) | Light Resistance Test 50 hours | Light Resistance Test 100 hours | Scratch Resistance Test |
|---|---|---|---|---|---|
| Example A1 | 36 | 210 | A | A | A |
| Example A2 | 36 | 250 | A | A | A |
| Example A3 | 37 | 200 | A | A | A |
| Example A4 | 38 | 185 | A | A | A |
| Example A5 | 41 | 380 | A | A | A |
| Example A6 | 31 | 65 | A | A | B |
| Example A7 | 37 | 75 | A | A | A |
| Example A8 | 37 | 110 | A | A | A |
| Example A9 | 37 | 75 | A | A | A |
| Example A10 | 34 | 360 | A | A | A |
| Example A11 | 33 | 585 | A | A | A |
| Example A13 | 36 | 220 | A | A | A |
| Example A15 | 36 | 250 | A | A | A |

TABLE 5

| | Base Material | | Flexibility | | | | | | | |
| | | | 6 mm in diameter, 100,000 times | | | 6 mm in diameter, 200,000 times | | | 4 mm in diameter, 200,000 times | | |
| | Type | Thickness (μm) | Crack and Break | Crease | Micro-crack | Crack and Break | Crease | Micro-crack | Crack and Break | Crease | Micro-crack |
|---|---|---|---|---|---|---|---|---|---|---|---|
| Example A1 | COP | 50 | A | A | A | A | B | A | A | B | A |
| Example A12 | COP | 25 | A | A | A | A | A | A | A | A | A |
| Example A13 | TAC | 60 | A | B | A | A | B | B | A | C | C |
| Example A14 | TAC | 25 | A | A | A | A | B | A | A | B | B |
| Example A15 | Acryl | 40 | A | B | A | B | B | B | B | C | C |
| Example A16 | Acryl | 30 | A | A | A | B | B | A | B | B | B |

As seen in Table 2, the adhesion (initial adhesion) in the optical film according to each of Comparative Examples A1, A2, and A5 was poor even before the endurance test because detachment took place at the interfacial boundary between the underlayer and the hard coat layer before the endurance test. Additionally, in the optical film according to Comparative Example A3, the initial adhesion was favorable, but the adhesion after the endurance test was poor. Furthermore, the pencil hardness of the optical film according to Comparative Example A4 was poor, and the visibility of the optical film according to Comparative Example A6 was rated as poor. In contrast with this, the adhesion (initial adhesion) in the optical film according to each of Examples A1 to A16 was favorable before the endurance test. This is conceivably because the mixed layer containing a component of the underlayer and a component of the hard coat layer was formed between the underlayer and the hard coat layer, and because the ratio of the film thickness of the mixed layer to the total film thickness of the underlayer, the mixed layer, and the hard coat layer was 0.6% or more. In addition, the adhesion in the optical film according to each of Examples A1, A3 to A7, and A9 to A16 was favorable not only before the endurance test but also after the endurance test. This is conceivably because the ratio of the film thickness of the mixed layer to the total film thickness of the underlayer, the mixed layer, and the hard coat layer was 1% or more. In addition, the optical film according to each of Examples A1 to A16 had excellent pencil hardness. This is conceivably because the ratio of the film thickness of the mixed layer to the total film thickness of the underlayer, the mixed layer, and the hard coat layer was 40% or less. In addition, the visibility of the optical film according to each of Examples A1 to A16 was rated as excellent. This is conceivably because a cycloolefin polymer base material, a cellulose triacetate base material, or an acrylic resin base material was used as the light-transmitting base material.

Examples B and Comparative Examples B

Example B1

Preparation of Hard Coat Layer Composition 3

A mixture (product name "KAYARAD PET-30" manufactured by Nippon Kayaku Co., Ltd.) of pentaerythritol triacrylate and pentaerythritol tetraacrylate was mixed with the above-mentioned acrylic polymer 1 described in the section for Example A1 at a solid mass ratio of 20:80, and the resulting mixture was diluted to a solid content of 25% with a solvent (a mixture of methyl ethyl ketone and toluene at a mass ratio of 80:20) to prepare a resin composition. Then, 160 parts by mass of the obtained resin composition was mixed with 4 parts by mass of polymerization initiator (a mixture of Omnirad 184 and Omnirad 819 manufactured by IGM Resins B.V. at a mass ratio of 50:50) and 0.2 parts by mass of leveling agent (product name "F568" manufactured by DIC Corporation), and the resulting mixture was well stirred to prepare a hard coat layer composition 3.

Preparation of Hard Coat Layer Composition 4

A urethane acrylate resin (product name "BEAMSET 577" manufactured by Arakawa Chemical Industries, Ltd.) was diluted to a solid content of 50% with a solvent (a mixture of methyl ethyl ketone and methyl isobutyl ketone at a mass ratio of 50:50) to prepare a resin composition. Then, 200 parts by mass of the obtained resin composition was mixed with 4 parts by mass of polymerization initiator (Omnirad 184 manufactured by IGM Resins B.V.), 0.2 Corporation), and 3 parts by mass of silica nanoparticles (product name "SIRMIBK-E65" manufactured by CIK NanoTek Corporation), and the resulting mixture was well stirred to prepare a hard coat layer composition 4.

(Production of Optical Film)

The hard coat layer composition 3 was applied, using a Mayer bar, to the surface of a cellulose triacetate base material (product name "FUJITAC TJ25UL" manufactured by Fuji Film Co., Ltd.) having a size of 210 mm×297 mm (A4 size) and a thickness of 25 µm to form a first coating film. Then, dry air at 50° C. was blown at a flow rate of 0.5 m/s over the formed coating film for 30 seconds to evaporate the solvent from the first coating film, and the resulting first coating film was half-cured by exposure to ultraviolet light to a cumulative light dose of 120 mJ/cm².

After the half-cured first coating film was formed, the hard coat layer composition 4 was applied, using a Mayer bar, to the surface of the first coating film to form a second coating film. Then, dry air at 70° C. was blown at a flow rate of 0.5 m/s over the formed second coating film for 30 seconds to evaporate the solvent from the coating film, and the first coating film and the second coating film were cured by exposure to ultraviolet light to a cumulative light dose of 200 mJ/cm² under a nitrogen atmosphere (having an oxygen concentration of 200 ppm or less) to form a hard coat layer having a film thickness of 6 µm and composed of the cured first coating film having a film thickness of 3 µm and the cured second coating film having a film thickness of 3 µm. Thus, an optical film including a hard coat layer on a cellulose triacetate base material was obtained.

The film thickness of the hard coat layer should be measured by the same method as the film thickness of the underlayer described in the section for Example A1. In this regard, the film thickness of the hard coat layer was measured in Examples B2 to B11 and Comparative Examples B1 to B6 by the same method as in Example B1.

Example B2

An optical film was obtained in Example B2 in the same manner as in Example B1 except that a hard coat layer composition 5 was used in place of the hard coat layer composition 3.

(Hard Coat Layer Composition 5)

Dicyclopentenyl acrylate (product name "FA-511AS" manufactured by Hitachi Chemical Co., Ltd.) and the above-mentioned acrylic polymer 1 were mixed at a solid mass ratio of 20:80, and the resulting mixture was diluted to a solid content of 25% with a solvent (a mixture of methyl ethyl ketone and toluene at a mass ratio of 80:20) to prepare a resin composition. Then, 160 parts by mass of the obtained resin composition was mixed with 4 parts by mass of polymerization initiator (a mixture of Omnirad 184 and Omnirad 819 manufactured by IGM Resins B.V. at a mass ratio of 50:50) and 0.2 parts by mass of leveling agent (product name "F568" manufactured by DIC Corporation), and the resulting mixture was well stirred to prepare a hard coat layer composition 5.

Example B3

An optical film was obtained in Example B3 in the same manner as in Example B1 except that a hard coat layer having a film thickness of 2 µm and composed of a cured first coating film having a film thickness of 1 µm and a cured second coating film having a film thickness of 1 μm was formed in place of the hard coat layer having a film thickness of 6 μm.

Example B4

An optical film was obtained in Example B4 in the same manner as in Example B1 except that a hard coat layer having a film thickness of 10 μm and composed of a cured first coating film having a film thickness of 5 μm and a cured second coating film having a film thickness of 5 μm was formed in place of the hard coat layer having a film thickness of 6 μm.

Example B5

An optical film was obtained in Example B5 in the same manner as in Example B1 except that a cellulose triacetate base material (product name "FUJITAC TD60UL" manufactured by Fuji Film Co., Ltd.) having a thickness of 60 μm was used in place of the cellulose triacetate base material (product name "FUJITAC TJ25UL" manufactured by Fuji Film Co., Ltd.) having a thickness of 25 μm.

Example B6

An optical film was obtained in Example B6 in the same manner as in Example B1 except that a cycloolefin polymer base material having a thickness of 25 μm, which was produced by stretching a cycloolefin polymer base material (product name "ZEONOR Film (registered trademark) ZF14-050" manufactured by Zeon Corporation) having a thickness of 50 μm at 150° C. so as to have an in-plane retardation of 100 nm, was used in place of the cellulose triacetate base material.

Example B7

An optical film was obtained in Example B7 in the same manner as in Example B1 except that a cycloolefin polymer base material (product name "ZEONOR Film (registered trademark) ZF14-050" manufactured by Zeon Corporation) having a thickness of 50 μm was used in place of the cellulose triacetate base material.

Example B8

An optical film was obtained in Example B8 in the same manner as in Example B1 except that an acrylic resin base material (product name "OXIS (registered trademark)-ZU (30 μm)" manufactured by Okura Industrial Co., Ltd.) having a thickness of 30 μm was used in place of the cellulose triacetate base material.

Example B9

An optical film was obtained in Example B9 in the same manner as in Example B1 except that an acrylic resin base material (product name "OXIS (registered trademark)-ZU (40 μm)" manufactured by Okura Industrial Co., Ltd.) having a thickness of 40 μm was used in place of the cellulose triacetate base material.

Example B10

An optical film was obtained in Example B10 in the same manner as in Example B1 except that a polyethylene terephthalate base material (PET base material; in-plane retardation Re: 600 nm; Nz coefficient: 20) having a thickness of 40 μm and produced by the below-mentioned method was used in place of the cellulose triacetate base material.

(Production of PET Base Material)

First, 1 kg of PET (melting point, 258° C.; absorption center wavelength, 320 nm) and 0.1 kg of ultraviolet absorber (2,2'-(1,4-phenylene)bis(4H-3,1-benzoxyazinone-4-one) were melt-mixed at 280° C. using a kneader to produce pellets containing an ultraviolet absorber. The pellets and a PET having a melting point of 258° C. were poured into a single screw extruder, and the resulting mixture was melt-kneaded at 280° C., extruded through the T-die, and casted on the casting drum the surface temperature of which was controlled to 25° C. Thus, a casting film was obtained. The amount of ultraviolet absorber in the casting film was 1 part by mass with respect to 100 parts by mass of the PET.

The obtained casting film was heated with a group of rolls set to 95° C. Then, the film was stretched at a stretch ratio of 3.5 in the flow direction while heated with a radiation heater used so as to generate turbulence from both faces of the film in such a manner that the film temperature became 103° C. at the point of 150 mm in the 400 mm stretch section (in which the starting point was a stretching roll A, the end point was a stretching roll B, and the stretching rolls A and B each had two nip rolls). Then, the film was once cooled.

Subsequently, both faces of this uniaxially-stretched film was subjected to corona discharge treatment in the air, so that the wet tension of the base material film was 55 mN/m. Both of the corona discharge-treated faces of the film were subjected to in-line coating with a polyester resin having a glass transition temperature of 18° C., a polyester resin having a glass transition temperature of 82° C., and a lubricious layer coating liquid containing silica particles having an average particle diameter of 100 nm. Thus, a lubricious layer was formed.

Then, the uniaxially-stretched film was introduced into a tenter, preheated with hot air at 95° C., and then, stretched at a stretch ratio of 3.8 in the film width direction at a temperature of 105° C. in the first stage and 140° C. in the second stage. Here, the film was stretched in two stages in such a manner that, assuming that the transversely stretching section was divided into halves, the amount of stretch of the film (film width at measurement point-film width before stretching) at the midpoint of the transversely stretching section was 80% of the amount of stretch of the film at the termination of the transversely stretching section. The transversely stretched film was directly heat-treated with hot air at a heat-treatment temperature of 245° C. reached stepwise from 180° C. in the tenter, then relaxed by 1% in the width direction under the same temperature conditions, then rapidly cooled to 100° C., relaxed by 1% in the width direction, and then, wound up to afford a biaxially-stretched PET base material.

Example B11

An optical film was obtained in Example B11 in the same manner as in Example B1 except that a polyethylene terephthalate base material (product name "COSMO SHINE (registered trademark) A4100" manufactured by Toyobo Co., Ltd.) having a thickness of 100 μm was used in place of the cellulose triacetate base material.

Comparative Example B1

The hard coat layer composition 3 was applied, using a Mayer bar, to the surface of a cellulose triacetate base material (product name "FUJITAC TJ25UL" manufactured by Fuji Film Co., Ltd.) having a size of 210 mm×297 mm (A4 size) and a thickness of 25 μm to form a coating film. Then, dry air at 50° C. was blown at a flow rate of 0.5 m/s over the formed coating film for 30 seconds to evaporate the solvent from the coating film, and the resulting coating film was cured by exposure to ultraviolet light to a cumulative light dose of 500 mJ/cm² under a nitrogen atmosphere (having an oxygen concentration of 200 ppm or less). Thus, an optical film including a hard coat layer having a film thickness of 6 μm provided on a cellulose triacetate base material was obtained.

Comparative Example B2

An optical film was obtained in Comparative Example B2 in the same manner as in Comparative Example B1 except that the hard coat layer composition 5 was used in place of the hard coat layer composition 3.

Comparative Example B3

An optical film was obtained in Comparative Example B3 in the same manner as in Example B1 except that the hard coat layer composition 4 was used in place of the hard coat layer composition 3, and that the hard coat layer composition 3 was used in place of the hard coat layer composition 4.

Comparative Example B4

An optical film was obtained in Comparative Example B4 in the same manner as in Example B1 except that the first coating film was cured by exposure to ultraviolet light to a cumulative light dose of 400 mJ/cm² under a nitrogen atmosphere (having an oxygen concentration of 200 ppm or less).

Comparative Example B5

An optical film was obtained in Comparative Example B5 in the same manner as in Example B1 except that the hard coat layer composition 4 was used in place of the hard coat layer composition 3, and that the hard coat layer composition 5 was used in place of the hard coat layer composition 4.

Comparative Example B6

First, the below-mentioned hard coat layer composition 6 was prepared.
(Hard Coat Layer Composition 6)
Tricyclodecane dimethanol diacrylate (product name "A-DCP" manufactured by Shin-Nakamura Chemical Co., Ltd.) and the above-mentioned acrylic polymer 1 were mixed at a solid mass ratio of 20:80, and the resulting mixture was diluted to a solid content of 25% with a solvent (a mixture of methyl ethyl ketone and toluene at a mass ratio of 80:20) to prepare a resin composition. Then, to 160 parts by mass of the obtained resin composition, 4 parts by mass of polymerization initiator (Omnirad 184 manufactured by IGM Resins B.V. and IRGACURE (registered trademark) OXE01 manufactured by BASF Japan Ltd. at a mass ratio of 50:50), and 0.2 parts by mass of leveling agent (product name "F-568" manufactured by DIC Corporation) were added, and the resulting mixture was well stirred to prepare a hard coat layer composition 6.

After the hard coat layer composition 6 was prepared, the hard coat layer composition 6 was applied, using a Mayer bar, to the surface of a cellulose triacetate base material (product name "FUJITAC TJ25UL" manufactured by Fuji Film Co., Ltd.) having a size of 210 mm×297 mm (A4 size) and a thickness of 25 μm to form a coating film. Then, dry air at 50° C. was blown at a flow rate of 0.5 m/s over the formed coating film for 30 seconds to evaporate the solvent from the coating film, and the resulting coating film was cured by exposure to ultraviolet light to a cumulative light dose of 400 mJ/cm² under a nitrogen atmosphere (having an oxygen concentration of 200 ppm or less) to form a cured first coating film having a film thickness of 3 μm.

After the cured first coating film was formed, the hard coat layer composition 4 was applied to the surface of the first coating film to form a second coating film. Then, dry air at 50° C. was blown at a flow rate of 0.5 m/s over the formed second coating film for 30 seconds to evaporate the solvent from the second coating film, and the resulting coating film was cured by exposure to ultraviolet light to a cumulative light dose of 200 mJ/cm² under a nitrogen atmosphere (having an oxygen concentration of 200 ppm or less) to form a cured second coating film having a film thickness of 3 μm. Thus, an optical film including a hard coat layer having a film thickness of 6 μm and composed of the cured first coating film and the cured second coating film on a cellulose triacetate base material was obtained. Here, using a scanning transmission electron microscope (STEM) to observe where an interfacial boundary existed in the hard coat layer found an interfacial boundary between the first hard coat layer and a second hard coat layer.

<Measurement of Intensity of Component in Hard Coat Layer by TOF-SIMS>

A time-of-flight secondary ion mass spectrometry device (product name "TOF.SIMS5" manufactured by ION-TOF GmbH) was used to measure the intensity of secondary ions derived from each component of the hard coat layer in the optical film according to each of Examples B1 to B11 and Comparative Examples B1 to B6. Specifically, a piece having a size of 10 mm×10 mm cut out of the optical film was first placed in the sample chamber of the time-of-flight secondary ion mass spectrometer in such a manner that the surface of the hard coat layer was exposed to the primary ions. Then, the intensity of secondary ions derived from each component was measured under the below-mentioned measurement conditions to obtain a depth profile. Then, from this depth profile, a bisector and the back face of the hard coat layer were identified, wherein the bisector bisected the hard coat layer in the depth direction of the hard coat layer. In addition, a first region, a second region, a third region, and a fourth region were determined, wherein the first region had a thickness of 0.3 μm and contained the surface of the hard coat layer, the second region had a thickness of 0.3 μm and contained the bisector which bisected the hard coat layer in the depth direction of the hard coat layer, the third region had a thickness of 0.3 μm and contained the back face of the hard coat layer, and the fourth region was from the boundary on the cellulose triacetate base material side of the first region to the back face of the hard coat layer. Then, the intensities $I_{U1}$, $I_{U2}$, and $I_{U3}$ of the secondary ions derived from the ultraviolet absorber 1, the intensities $I_{F1}$, $I_{F2}$, and $I_{F3}$ of the secondary ions derived from a fluorine-containing compound, and the intensities $I_{S1}$, $I_{S2}$, and $I_{S3}$ of the secondary ions derived from a silicon-containing compound in the first region to third region respectively were determined, and the intensity ratios Iuz/$I_{U1}$, $I_{U3}/I_{U2}$, $I_{U3}/I_{U1}$, $I_{F1}/I_{F2}$, $I_{F1}/I_{F3}$, $I_{S1}/I_{S2}$, and $I_{S1}/I_{S3}$ were determined. In this regard, the secondary ion derived from the ultraviolet absorber 1 was $C_6H_4N_3^-$, the secondary ion derived from the acrylate or acetic acid compound was $C_2H_3O_2^-$, the secondary ion derived from the fluorine-containing compound was $F^-$, and the secondary ion derived from the silicon-containing compound was $SiO_2^-$. In addition, the intensity of $CN^-$ was measured as the secondary ion derived from the nitrogen-containing organic substance. In addition, the back face of the hard coat layer was regarded as corresponding to the position of the intersection between $C_2H_3O_2^-$ which was the secondary ion derived from the acrylate or acetic acid compound in the depth profile and $C_6H_4N_3^-$ which was the secondary ion derived from the ultraviolet absorber 1 in the profile. In addition, the second region was set in such a manner that the bisector was located in the center of the second region.

(Measurement Conditions)

Secondary ion polarity: negative

Mass range (m/z): 0 to 3000

Cluster size: 200 μm□

Number of scans: 1 scan/cycle

Number of pixels (one side): 128 pixels

Measured degree of vacuum (before introducing sample): $4 \times 10^{-7}$ Pa or less Charge neutralization: yes Post acceleration: 10 KV Primary ion: $Bi_3^{++}$ Primary ion accelerating voltage: 30 kV Pulse width: 11.3 ns Bunching: yes (high mass resolution measurement)

Etching ion: Ar gas cluster ion beam (Ar-GCIB)

Etching ion accelerating voltage: 20 KV

Ar cluster size (median value): approximately 1400

<Pencil Hardness Test>

The pencil hardness of the surface of the optical film according to each of Examples B1 to B11 and Comparative Examples B1 to B6 (the surface of the hard coat layer) was measured. The pencil hardness test should be performed by: cutting a piece having a size of 50 mm×100 mm out of the optical film; and moving a pencil (product name "uni" manufactured by Mitsubishi Pencil Co., Ltd.) on the surface of the piece under a load of 300 g at a speed of 3 mm/second using a pencil hardness testing machine (product name "Pencil Scratch Hardness Tester (electric type)" manufactured by Toyo Seiki Seisaku-sho, Ltd.) in an environment at a temperature of 23° C. and a relative humidity of 50% or less. The grade of the hardest pencil that did not scratch the surface of the optical film 10 during the pencil hardness test was regarded as the pencil hardness of the optical film. A plural number of pencils having different hardnesses were used for the measurement of pencil hardness, and the pencil hardness test was repeated five times for each pencil. In cases where no scratch was made on the surface of the optical film with a pencil with a specific hardness in four or more out of the five replicates, the pencil with the hardness was determined to be one which had made no scratch on the surface of the optical film.

<Scratch Resistance Test>

The surface of the optical film (the surface of the hard coat layer) according to each of Examples B1 to B11 and Comparative Examples B1 to B6 was subjected to a scratch resistance test in an environment at a temperature of 23° C. and a relative humidity of 50%. Specifically, a scratch resistance test was performed, in which the surface of a piece having a size of 50 mm×50 mm cut out of the optical film was scrubbed to and fro 10 times under a load of 100 g/cm² using steel wool a grade of #0000 (product name "Bonstar" manufactured by Nihon Steel Wool Co., Ltd.). A check was made by visual observation on whether any scratch was found on the surface of the optical film piece. The evaluation results were based on the following evaluation criteria:

A: no scratch was found.

B: a few scratch(es) was/were found, but at a level which was not problematic for practical use.

C: a scratch(es) was/were clearly found.

<Endurance Test>

The optical film according to each of Examples B1 to B11 and Comparative Examples B1 to B6 was subjected to an endurance test. Specifically, a piece having a size of 100 mm×100 mm cut out of the optical film was arranged in an endurance test device (product name "Temperature & Humidity Chamber PL-1KP" manufactured by ESPEC Corp.) and left to stand in an endurance test under conditions at a temperature of 85° C. and a relative humidity of 85% for 240 hours. The optical film arranged in the endurance test device had no fault (no contamination of any extraneous substance), no crack, no wrinkle, and no fouling deposition, and also was in a flat configuration without any curling.

After the endurance test, an evaluation was made of whether any precipitate was found on the surface of the hard coat layer, and whether any crack was generated on the hard coat layer, in an environment at a temperature of 23° C. and a relative humidity of 50%. The evaluation criteria were as below-mentioned.

A: neither any precipitate nor any crack was found.

B: either any precipitate or any crack was found.

C: both any precipitate and any crack was found.

<Spectral Transmittance>

The spectral transmittance of the optical film according to each of Examples B1 to B4, B6, B8, and B10 was measured at a wavelength of 380 nm, 400 nm, 410 nm, and 440 nm in an environment at a temperature of 23° C. and a relative humidity of 50% by the same method and under the same measurement conditions as the spectral transmittance described in the sections for Examples A.

<Yellow Index (YI)>

The yellow index of the optical film according to each of Examples B1 to B4, B6, B8, and B10 was measured by the same method and under the same measurement conditions as the yellow index described in the sections for Examples A.

<Measurement of Total Light Transmittance>

The total light transmittance of the optical film according to each of Examples B1 to B4, B6, B8, and B10 was measured using a haze meter (product name "HM-150" manufactured by Murakami Color Research Laboratory Co., Ltd.) in accordance with JIS K7361: 1997 in an environment at a temperature of 23° C. and a relative humidity of 50%. Specifically, the total light transmittance was measured by the same method and under the same measurement conditions as the total light transmittance described in the sections for Examples A.

<Measurement of Haze>

The haze value (total haze value) of the optical film according to each of Examples B1 to B4, B6, B8, and B10 was measured using a haze meter (product name "HM-150" manufactured by Murakami Color Research Laboratory Co., Ltd.) in accordance with JIS K7136: 2000 in an environment at a temperature of 23° C. and a relative humidity of 50%. Specifically, the total light transmittance was measured by the same method and under the same measurement conditions as the haze value described in the sections for Examples A.

<Evaluation of Visibility>

The visibility of the optical film according to each of Examples B1 to B4, B6, B8, and B10 was evaluated. Specifically, the visibility was evaluated by the same method and on the same criteria as the visibility described in the sections for Examples A.

<Evaluation of Flexibility>

(1) Evaluation of Crack and Break after Folding Test

The optical film according to each of Examples B1 and B5 to B11 was subjected to a folding test to be evaluated for any crack or break. Specifically, the folding test was performed by the same method and under the same measurement conditions as the folding test described in the section for the evaluation of crack and break after the folding test in Examples A. In addition, the evaluation of crack and break was performed by the same evaluation method and on the same criteria as described in the section for the evaluation of crack and break after the folding test in Examples A.

(2) Evaluation of Crease after Folding Test

The appearance of the optical film according to each of Examples B1 and B5 to B11 was observed after the folding test, and the bent part of each optical film was evaluated for any crease generated. Specifically, the folding test was performed by the same method and under the same measurement conditions as the folding test described in the section for the evaluation of crease after the folding test in Examples A. Specifically, the evaluation of crease was performed by the same evaluation method and on the same criteria as described in the section for the evaluation of crease after the folding test in Examples A.

(3) Evaluation of Microcrack after Folding Test

The appearance of the optical film according to each of Examples B1 and B5 to B11 was observed after the folding test, and the bent part of each optical film was evaluated for any microcrack generated. Specifically, the folding test was performed by the same method and under the same measurement conditions as the folding test described in the section for the evaluation of microcrack after the folding test in Examples A. Specifically, the evaluation of microcrack was performed by the same evaluation method and on the same criteria as described in the section for the evaluation of microcrack after the folding test in Examples A.

Figure 15:
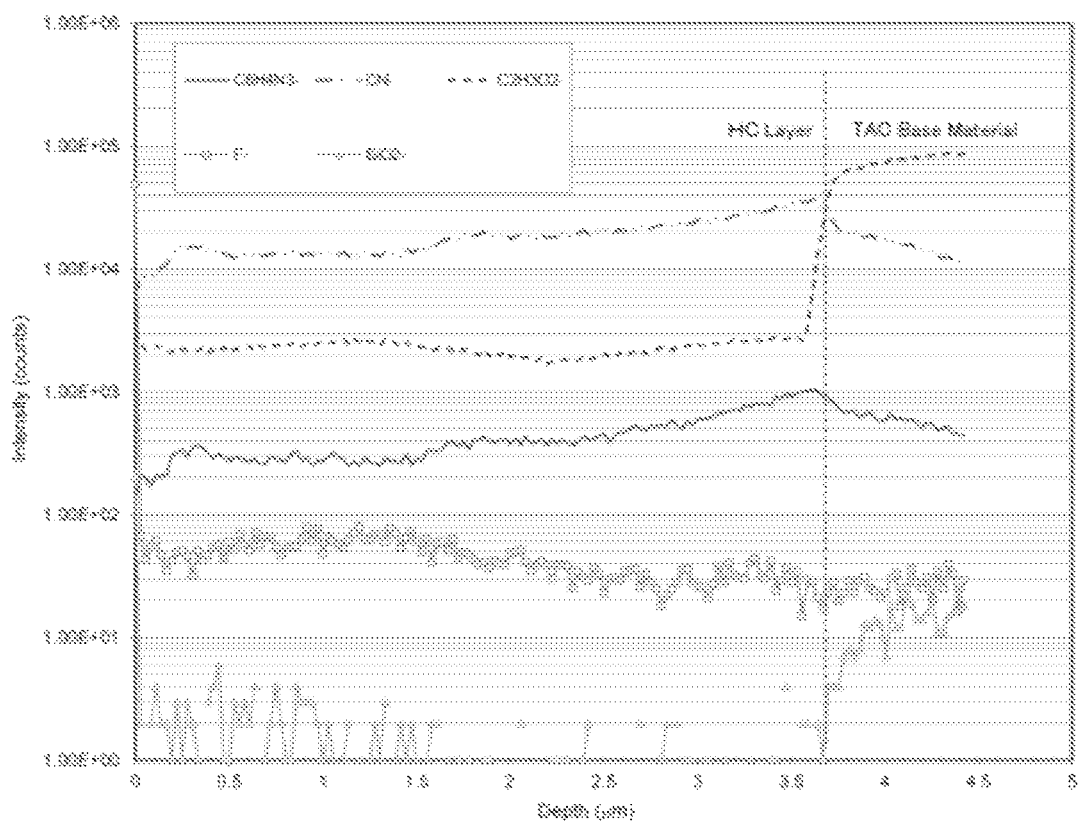
FIG. 15 is a depth profile of a hard coat layer in an optical film in Example B1, as measured by time-of-flight secondary ion mass spectrometry.

The results are seen in Table 6 to Table 9 below. In addition, FIG. 15 is a depth profile of the optical film in Example B1, as measured by time-of-flight secondary ion mass spectrometry.

TABLE 6

|  | HC Layer Film Thickness (μm) | Intensity Ratio | | | Pencil Hardness | Scratch Resistance | Endurance |
| --- | --- | --- | --- | --- | --- | --- | --- |
|  |  | $I_{U2}/I_{U1}$ | $I_{U3}/I_{U2}$ | $I_{U3}/I_{U1}$ |  |  |  |
| Example B1 | 6 | 1.6 | 2.3 | 3.6 | H | A | A |
| Example B2 | 6 | 3.4 | 1.3 | 4.3 | F | A | A |
| Example B3 | 2 | 2.6 | 2.2 | 5.7 | 3B | A | A |
| Example B4 | 10 | 1.1 | 3.2 | 3.5 | H | A | A |
| Example B5 | 6 | 1.2 | 2.8 | 3.4 | 2H | A | A |
| Example B6 | 6 | 1.5 | 2.4 | 3.6 | 2B | A | A |
| Example B7 | 6 | 1.6 | 2.4 | 3.8 | B | A | A |
| Example B8 | 6 | 2.1 | 2.5 | 5.3 | H | A | A |
| Example B9 | 6 | 2.0 | 2.4 | 4.8 | H | A | A |
| Example B10 | 6 | 1.5 | 3.2 | 4.8 | H | A | B |
| Example B11 | 6 | 1.6 | 3.4 | 5.4 | 2H | A | C |
| Comparative Example B1 | 6 | 1.0 | 1.1 | 1.1 | 5B | C | B |
| Comparative Example B2 | 6 | 1.0 | 1.0 | 1.0 | 5B | C | B |
| Comparative Example B3 | 6 | 0.4 | 0.7 | 0.3 | 5B | C | C |
| Comparative Example B4 | 6 | 1.4 | 4.8 | 6.5 | 4B | A | C |
| Comparative Example B5 | 6 | 0.6 | 0.4 | 0.2 | 5B | C | C |
| Comparative Example B6 | 6 | 6.2 | 1.1 | 6.6 | H | A | C |

TABLE 7

|  | Intensity Ratio | | | |
| --- | --- | --- | --- | --- |
|  | $I_{F1}/I_{F2}$ | $I_{F1}/I_{F3}$ | $I_{S1}/I_{S2}$ | $I_{S1}/I_{S3}$ |
| Example B1 | 89 | 128 | 45 | 21 |
| Example B2 | 42 | 68 | 20 | 17 |
| Example B3 | 40 | 53 | 10 | 3 |
| Example B4 | 50 | 67 | 8 | 6 |
| Example B5 | 47 | 82 | 30 | 15 |
| Example B6 | 37 | 45 | 23 | 8 |
| Example B7 | 54 | 79 | 25 | 8 |
| Example B8 | 39 | 55 | 28 | 12 |
| Example B9 | 80 | 114 | 36 | 20 |
| Example B10 | 52 | 168 | 37 | 21 |
| Example B11 | 38 | 53 | 32 | 18 |
| Comparative Example B1 | 20 | 23 | 7 | 5 |
| Comparative Example B2 | 25 | 29 | 2 | 2 |
| Comparative Example B3 | 14 | 37 | 2 | 1 |
| Comparative Example B4 | 27 | 26 | 48 | 24 |
| Comparative Example B5 | 16 | 21 | 2 | 2 |
| Comparative Example B6 | 80 | 118 | 42 | 20 |

TABLE 8

| | Spectral Transmittance (%) | | | | Total Light Transmittance (%) | Haze Value (%) | Evaluation of Visibility |
|---|---|---|---|---|---|---|---|
| | 380 nm | 400 nm | 410 nm | 440 nm | YI | | |
| Example B1 | 0.0 | 0.3 | 5.8 | 88.3 | 8.5 | 92.0 | 0.5 | A |
| Example B2 | 0.0 | 0.2 | 5.2 | 86.8 | 9.0 | 91.8 | 0.7 | A |
| Example B3 | 0.8 | 16.9 | 42.8 | 90.2 | 3.8 | 92.0 | 0.5 | A |
| Example B4 | 0.0 | 0.0 | 1.6 | 85.7 | 10.5 | 91.7 | 1.1 | A |
| Example B6 | 0.0 | 0.2 | 5.1 | 86.9 | 8.5 | 91.1 | 0.4 | A |
| Example B8 | 0.0 | 0.3 | 6.3 | 86.9 | 8.6 | 90.5 | 0.5 | A |
| Example B10 | 0.0 | 0.2 | 5.7 | 85.4 | 9.5 | 90.1 | 1.0 | B |

TABLE 9

| | Base Material | | Flexibility | | | | | | | |
|---|---|---|---|---|---|---|---|---|---|---|
| | | | 6 mm in diameter, 100,000 times | | | 6 mm in diameter, 200,000 times | | | 4 mm in diameter, 200,000 times | | |
| | Type | Thickness (μm) | Crack and Break | Crease | Micro-crack | Crack and Break | Crease | Micro-crack | Crack and Break | Crease | Micro-crack |
| Example B1 | TAC | 25 | A | A | A | A | B | A | A | A | A |
| Example B5 | TAC | 60 | A | B | A | A | B | B | A | C | C |
| Example B6 | COP | 25 | A | A | A | A | A | A | A | A | A |
| Example B7 | COP | 50 | A | A | A | A | B | A | A | B | A |
| Example B8 | Acryl | 30 | A | A | A | B | B | A | B | B | B |
| Example B9 | Acryl | 40 | A | B | A | B | B | B | B | C | C |
| Example B10 | PET | 40 | A | A | A | A | A | A | A | B | B |
| Example B11 | PET | 100 | B | B | A | B | B | B | B | C | B |

As seen in Table 6, the optical film according to each of Comparative Examples B1 to B6 had poor pencil hardness, scratch resistance, and endurance because $I_{U2}/I_{U1}$ was out of the range of 1.1 or more and 4.0 or less, or $I_{U3}/I_{U2}$ was out of the range of 1.2 or more and 4.0 or less. In contrast with this, the optical film according to each of Examples B1 to B11 enabled the film to promise to be thinner and at the same time, made it possible to obtain favorable pencil hardness, favorable scratch resistance, and favorable endurance because $I_{U2}/I_{U1}$ was 1.1 or more and 4.0 or less, and in addition, luz/luz was 1.2 or more and 4.0 or less. In this regard, the intensity of CN⁻ as the secondary ion derived from the nitrogen-containing organic substance resulted in the same as the intensity of $C_6H_4N_3^-$. From the graph of FIG. 15, it can also be understood that the smallest intensity of secondary ions derived from the ultraviolet absorber 1 in the first region is smaller than the smallest intensity of secondary ions derived the ultraviolet absorber 1 in the fourth region from the boundary on the cellulose triacetate base material side of the first region to the back face.

Examples C and Comparative Examples C

Preparation of First Ionizing Radiation-Curable Resin Composition

Components were blended so as to have the below-mentioned composition to obtain a first ionizing radiation-curable resin composition.
(First Ionizing Radiation-Curable Resin Composition 1)

A mixture (product name "KAYARAD PET-30" manufactured by Nippon Kayaku Co., Ltd.) of pentaerythritol triacrylate and pentaerythritol tetraacrylate was mixed with the above-mentioned acrylic polymer 1 at a solid mass ratio of 20:80, and the resulting mixture was diluted to a solid content of 25% with a solvent (a mixture of methyl ethyl ketone and toluene at a mass ratio of 80:20) to prepare a resin composition.

Then, 160 parts by mass of the obtained resin composition was mixed with 4 parts by mass of a polymerization initiator (a mixture of Omnirad 184 and Omnirad 819 manufactured by IGM Resins B.V. at a mass ratio of 50:50) and 0.2 parts by mass of leveling agent (product name "F568" manufactured by DIC Corporation), and the resulting mixture was well stirred to prepare a first ionizing radiation-curable resin composition 1.
(First Ionizing Radiation-Curable Resin Composition 2)

Urethane acrylate (product name "UV-3310B" manufactured by Mitsubishi Chemical Corporation) was diluted to a solid content of 25% with methyl ethyl ketone to prepare a resin composition. Then, 120 parts by mass of the obtained resin composition was mixed with 4 parts by mass of a polymerization initiator (a mixture of Omnirad 184 and Omnirad 819 manufactured by IGM Resins B.V. at a mass ratio of 50:50), 3 parts by mass of indole compound (product name "BONASORB UA-3912" manufactured by Orient Chemical Industries Co., Ltd.) as an ultraviolet absorber, 5 parts by mass of benzotriazole compound (product name "JF-79" manufactured by Johoku Chemical Co., Ltd.), and 0.2 parts by mass of leveling agent (product name "F568" manufactured by DIC Corporation), and the resulting mixture was well stirred to prepare a first ionizing radiation-curable resin composition 2.
(First Ionizing Radiation-Curable Resin Composition 3)

Fifty parts by mass of dicyclopentenyl acrylate (product name "FA-511AS" manufactured by Hitachi Chemical Co., Ltd.), 50 parts by mass of mixture of pentaerythritol triacrylate and pentaerythritol tetraacrylate (product name "KAYARAD PET-30" manufactured by Nippon Kayaku Co., Ltd.) as a radiation-polymerizable compound, 4 parts by mass of polymerization initiator (product name "Omnirad 184" manufactured by IGM Resins B.V.), and 0.2 Corporation) were mixed, and to the resulting mixture, a solvent (methyl isobutyl ketone) was added. The resulting mixture was stirred to prepare a first ionizing radiation-curable resin composition 3 having a solid concentration of 25%.

Preparation of Second Ionizing Radiation-Curable Resin Composition

Components were blended so as to have the below-mentioned composition to obtain a second Ionizing radiation-curable resin composition.
(Second Ionizing Radiation-Curable Resin Composition 1)
Liquid crystal compound represented by the above-mentioned chemical formula (11): 20 parts by mass
Polymerization initiator (product name "Omnirad 184" manufactured by IGM Resins B.V.): 5 parts by mass
Fluorine surfactant (product name "MEGAFACE F477" manufactured by DIC Corporation): 0.4 parts by mass
Solvent mixture (MEK:NMP=1:1): 74.6 parts by mass
(Second Ionizing Radiation-Curable Resin Composition 2)
A liquid crystal compound represented by the above-mentioned chemical formula (18) in an amount of 0.99 g and a liquid crystal compound represented by the above-mentioned chemical formula (19) in an amount of 10 mg were dissolved in a solvent mixture of 0.3 g of 1,3-dioxolane and 2.0 g of cyclopentanone to obtain a mixture 1. Then, components were blended so as to have the below-mentioned composition to obtain a second ionizing radiation-curable resin composition 2.
Mixture 1:20 parts by mass
Polymerization initiator (product name "Omnirad 184" manufactured by IGM Resins B.V.): 5 parts by mass
Fluorine surfactant (product name "MEGAFACE F477" manufactured by DIC Corporation): 0.4 parts by mass
Solvent mixture (MEK:NMP=1:1): 74.6 parts by mass
<Radiation-Curable Bonding Agent Composition 1>
Components were blended so as to have the below-mentioned composition to obtain a radiation-curable bonding agent composition 1.
Hydroxy acryl amide (product name "HEAA" manufactured by KJ Chemicals Corporation): 40 parts by mass
Tripropylene glycol diacrylate (product name "M-220" manufactured by Toagosei Co., Ltd.): 20 parts by mass
Acryloyl morpholine (product name "ACMO" manufactured by Chemicals Corporation): 40 parts by mass
Polymerization initiator (product name "Omnirad 189" manufactured by IGM Resins B.V.): 1.4 parts by mass Example C1

First, a polyethylene terephthalate film (PET film, product name "COSMO SHINE (registered trademark) A4100" manufactured by Toyobo Co., Ltd.) one face of which was treated for easy adhesion and which had a thickness of 100 μm was prepared as a release film, and the first ionizing radiation-curable resin composition 1 was applied to the untreated side of the PET film to form a coating film. Subsequently, the formed coating film was dried by dry air blown at 50° C. at a flow rate of 0.5 m/s for 15 seconds followed by further dry air blown at 70° C. at a flow rate of 10 m/s for 30 seconds to evaporate the solvent from the coating film, and then exposed to ultraviolet light to a cumulative light dose of 200 mJ/cm$^2$, whereby the coating film was cured. Thus, a hard coat layer having a film thickness of 8 μm was formed as a first resin layer.

After the hard coat layer was formed, an alignment layer-forming composition containing a polycinnamate compound (having a solid content of 4%, and diluted with propylene glycol monomethyl ether) was applied to the first resin layer to form a coating film. The obtained coating film was dried at 120° C. for one minute, and exposed to polarized light at 20 mJ/cm$^2$ (310 nm) to form an alignment layer having a film thickness 200 nm as a third resin layer.

Then, the second ionizing radiation-curable resin composition 1 was applied to the alignment layer using a bar coater, and dried to form a coating film. Then, dry air at 120° C. was blown over the formed coating film for 60 seconds to dry the film, thus evaporating the solvent from the coating film, and then, the resulting coating film was cured by exposure to ultraviolet light to a cumulative light dose of 200 mJ/cm$^2$. Thus, a λ/4 retardation layer having a film thickness of 2.0 μm was formed as a second resin layer. Thus, a polarizer protective film transferring member having a thickness of 10.2 μm and composed of a polarizer protective film and a release film was obtained.

The film thickness of the hard coat layer was defined as the arithmetic mean of the 10 film thickness values at 10 different locations, wherein a cross-section of the first resin layer was imaged using a scanning transmission electron microscope (STEM), and the film thickness of the hard coat layer was measured at the 10 different locations within the image of the cross-section. A specific method of imaging a cross-section is described below. First of all, a piece having a size of 1 mm×10 mm cut out of the polarizer protective film was embedded in an embedding resin to produce a block, and homogeneous sections having a thickness of 70 nm or more and 100 nm or less and having no openings or the like were cut out of the block according to a commonly used sectioning technique. For the production of sections, an "Ultramicrotome EM UC7" (Leica Microsystems GmbH) was used. Then, these homogeneous sections having no openings or the like were used as measurement samples. Then, cross-sections of the measurement samples were imaged using a scanning transmission electron microscope (STEM) (product name "S-4800" manufactured by Hitachi High-Technologies Corporation). The cross-sections imaged, with the detector, accelerating voltage, and emission set to "TE", "30 KV", and "10 μA" respectively, was observed. The focus, contrast, and brightness were suitably adjusted at a magnification of 5,000 to 200,000 times so that each layer could be identified by observation. Furthermore, the beam monitor aperture, the objective lens aperture, and the WD were set to 3, 3, and 8 mm respectively when the cross-section was imaged. The film thickness of each of the λ/4 retardation layer and the alignment layer was measured in the same manner as the film thickness of the hard coat layer.

At the same time, a polyvinyl alcohol film was allowed to adsorb iodine, and then, the resulting film was uniaxially-stretched and thus aligned to produce a polarizer. In addition, a polyvinyl alcohol bonding agent (a polyvinyl alcohol aqueous solution of a polyvinyl alcohol resin (product name "PVA-117" manufactured by Kuraray Co., Ltd.) diluted to a solid content of 5% with pure water) was applied to one face of the polarizer. Then, the polarizer and the polarizer protective film were arranged in such a manner that the polarizer protective film as a saponified cellulose triacetate base material (product name "FUJITACTJ25UL" manufactured by Fuji Film Co., Ltd.) having a thickness of 25 μm was in contact with the one face of the polarizer. In this state, the polarizer and the polarizer protective film were dried at 100° C. for 10 minutes to afford an intermediate in which the polarizer and the polarizer protective film were attached to each other via a polyvinyl alcohol bonding agent.

After the intermediate was obtained, the radiation-curable bonding agent composition 1 was applied to the other face of the polarizer to form a coating film of the radiation-curable bonding agent composition 1. The polarizer protective film transferring member was arranged on this coating film in such a manner that the λ/4 retardation layer was in contact with the coating film. The polarizer protective film transferring member was arranged in such a manner that the absorption axis of the polarizer and the lagging axis of the λ/4 retardation layer made an angle of 45° therebetween. In this state, the polarizer protective film side composed of a TAC base material was exposed to ultraviolet light to a cumulative light dose of 200 mJ/cm$^2$ to cure the coating film. Thus, the intermediate and the polarizer protective film transferring member were attached to each other.

Then, the PET film as a release film was removed from the polarizer protective film transferring member to obtain a polarizing plate at the surface of which the hard coat layer was exposed.

After the polarizing plate was obtained, λ/2 retardation film was attached to the polarizer protective film side composed of a TAC base material in the polarizing plate via an adhesive layer (product name "PANACLEAN (registered trademark) PD-S1" manufactured by Panac Co., Ltd.). The λ/2 retardation film was obtained by stretching, at 150° C., a cycloolefin polymer resin film (product name "ZEONOR Film (registered trademark) ZF-14" manufactured by Zeon Corporation) having a thickness of 100 μm so as to have an in-plane retardation of 270 nm at a wavelength of 550 nm. Furthermore, a λ/4 retardation film was attached to the opposite side of the λ/2 retardation film from the polarizing plate side via an adhesive layer (product name "PANACLEAN (registered trademark) PD-S1" manufactured by Panac Co., Ltd.). Thus, a circularly polarizing plate was obtained. The λ/4 retardation film was obtained by stretching, at 150° C., a cycloolefin polymer resin film (product name "ZEONOR Film (registered trademark) ZF-14" manufactured by Zeon Corporation) having a thickness of 100 μm so as to have an in-plane retardation of 140 nm at a wavelength of 550 nm.

After the circularly polarizing plate was obtained, an organic light-emitting diode panel (OLED panel) containing an organic light-emitting diode element taken out of an organic EL display (product name "Galaxy SII" manufactured by Samsung Electronics Co., Ltd.) was attached to the opposite side of the λ/4 retardation film of the circularly polarizing plate from the λ/2 retardation film side via an adhesive layer (product name "PANACLEAN (registered trademark) PD-S1" manufactured by Panac Co., Ltd.). Thus, an image display device in which an OLED panel, an adhesive layer, and a circularly polarizing plate were laminated in this order toward the observer' side was obtained.

Example C2

A polarizer protective film, a polarizer protective film transferring member, a circularly polarizing plate, and an image display device were obtained in Example C2 in the same manner in Example C1 except that the first ionizing radiation-curable resin composition 2 was used in place of the first ionizing radiation-curable resin composition 1.

Example C3

A polarizer protective film, a polarizer protective film transferring member, a circularly polarizing plate, and an image display device were obtained in Example C3 in the same manner in Example C1 except that the first ionizing radiation-curable resin composition 3 was used in place of the first ionizing radiation-curable resin composition 1.

Example C4

A polarizer protective film, a polarizer protective film transferring member, a circularly polarizing plate, and an image display device were obtained in Example C4 in the same manner in Example C1 except that the second ionizing radiation-curable resin composition 2 was used in place of the second ionizing radiation-curable resin composition 1.

Comparative Example C1

A circularly polarizing plate and an image display device were obtained in Comparative Example C1 in the same manner as in Example C1 except that the polarizer protective film on the observer's side was constituted by a cycloolefin polymer base material and a hard coat layer.

The polarizer protective film according to Comparative Example C1 was formed as below-mentioned. First, a cycloolefin polymer base material (COP base material) having a thickness of 25 μm was obtained by stretching, at 150° C., a cycloolefin polymer resin film (product name "ZEONOR Film (registered trademark) ZF-14" manufactured by Zeon Corporation) having a thickness of 100 μm so as to have an in-plane retardation of 140 nm at a wavelength of 550 nm. Then, the first ionizing radiation-curable resin composition 3 was applied to one face of this COP base material to form a coating film. Subsequently, the formed coating film was dried by dry air blown at 50° C. at a flow rate of 0.5 m/s for 15 seconds followed by further dry air blown at 70° C. at a flow rate of 10 m/s for 30 seconds to evaporate the solvent from the coating film, and then exposed to ultraviolet light to a cumulative light dose of 200 mJ/cm$^2$, whereby the coating film was cured. Thus, a hard coat layer having a film thickness of 5 μm was formed to obtain a polarizer protective film.

Comparative Example C2

A polarizer protective film, a polarizer protective film transferring member, a circularly polarizing plate, and an image display device were obtained in Comparative Example C2 in the same manner as in Example C1 except that the polarizer protective film on the observer's side was composed only of a hard coat layer.

A polarizer protective film according to Comparative Example C2 was formed as below-mentioned. First, a polyethylene terephthalate film (PET film, product name "COSMO SHINE (registered trademark) A4100" manufactured by Toyobo Co., Ltd.) one face of which was treated for easy adhesion and which had a thickness of 100 μm was prepared as a release film, and the first ionizing radiation-curable resin composition 1 was applied to the untreated side of the PET film to form a coating film. Subsequently, the formed coating film was dried by dry air blown at 50° C. at a flow rate of 0.5 m/s for 15 seconds followed by further dry air blown at 70° C. at a flow rate of 10 m/s for 30 seconds to evaporate the solvent from the coating film, and then exposed to ultraviolet light to a cumulative light dose of 200 mJ/cm$^2$, whereby the coating film was cured. Thus, a hard coat layer having a film thickness of 10 μm was formed to obtain a polarizer protective film.

<Measurement of Retardation Value>

The retardation value of the polarizer protective film according to each of Examples C1 to C4 and Comparative Examples C1 and C2 was measured. Specifically, an adhesive layer (product name "PANACLEAN (registered trademark) PD-S1" from Panac Co., Ltd.) was first attached to a sheet of glass (30 mm in length×30 mm in width, and 1 mm in thickness) having optical isotropy, and a polarizer protective film transferring member was attached to the resulting sheet in such a manner that the λ/4 retardation layer came in contact with the adhesive layer. Then, the PET film was removed from the polarizer protective film, thus exposing the hard coat layer to obtain a measurement sample. The piece to be used as a measurement sample of the polarizer protective film transferring member was cut to a size of 40 mm in length×40 mm in width out of the central portion of the polarizer protective film transferring member. Then, the in-plane retardation of this measurement sample was measured at a wavelength of 589 nm using a retardation measurement device (product name "KOBRA-WR" manufactured by Oji Scientific Instruments Co., Ltd.; measurement spot: 5 mm in diameter).

<Measurement of Light-Emitting Wavelength of OLED Panel>

The light-emitting wavelength A1 of the OLED panel used in each of Examples C1 to C4 and Comparative Examples C1 and C2 was measured. The light-emitting wavelength of the OLED panel was measured using a spectroradiometer (product name "CS2000" manufactured by Konica Minolta, Inc.) under conditions at a measurement angle of 1°

<Measurement of Absorption Start Wavelength of Hard Coat Layer and λ/4 Retardation Layer>

The absorption start wavelength A2 of the hard coat layer and the absorption start wavelength λ3 of the λ/4 retardation layer in the polarizer protective film according to each of Examples C1 to C4 and Comparative Examples C1 and C2 were measured. Specifically, a color filter spectral inspection system (device name "LCF-100MA-SF" manufactured by Otsuka Electronics Co., Ltd.) was first used to measure the transmittance spectrum of each layer in the wavelength range of 380 nm or more and 480 nm or less using a spot diameter of 2 μm and using a halogen lamp as the light source, and to determine the slope of the transmittance spectrum at wavelength intervals of 10 nm. Then, a wavelength at which the slope sharply decreased as seen overall on the data of the slope was found, and the wavelength was regarded as the absorption start wavelength.

<Indentation Hardness ($H_{IT}$)>

The indentation hardness of each of the λ/4 retardation layer and the hard coat layer in the circularly polarizing plate according to each of Examples C1 to $C_4$ was measured. The indentation hardness ($H_{IT}$) was measured by the same method and under the same measurement conditions as described in the section for the indentation hardness in Examples A.

<Evaluation of Visibility>

The visibility of the image display device according to each of Examples C1 to C4 and Comparative Examples C1 and C2 was evaluated before and after a light resistance test. Specifically, an image display device before the light resistance test was first set to white display in a dark place, and rotated in such a manner that the angle between the absorption axis of the polarized sunglasses and the absorption axis of the polarizer was changed from 0° (paralleled nicols) to 90° (crossed nicols) to evaluate whether the displayed image was visible. Then, a light stability testing device (product name "UV Fade Meter U48AU" manufactured by Suga Test Instruments Co., Ltd.) was used to perform the light resistance test, in which the image display device was exposed to light from a carbon arc lamp in an environment at 42° C. and a relative humidity of 50% for 50 hours. Then, the image display device after the light resistance test was again set in a dark place under the same condition as above-mentioned to evaluate whether the displayed image was visible. The evaluation criteria were as below-mentioned.

A: the displayed image was visible (visually recognized through polarized sunglasses) at any angle.

B: depending on the angle, the visibility decreased a little, but at a level which was not problematic for practical use.

C: the displayed image was not visible (not visually recognized through polarized sunglasses) depending on the angle.

<Flexibility>

The circularly polarizing plate according to each of Examples C1 to C4 was subjected to a mandrel test (a test in which a sample was wound around a metal column 2 mm to 32 mm) to evaluate the flexibility. Specifically, a piece having a size of 50 mm×50 mm cut out of the circularly polarizing plate was subjected to a mandrel test in accordance with JIS K5600-5-1:1999. In the test, the circularly polarizing plate was wound around a column with the λ/4 retardation layer inside to determine the smallest of the diameters of the columns with which the circularly polarizing plate generated no crack (fissure). The evaluation results were based on the following evaluation criteria:

A: the smallest diameter was 6 mm or less.

B: the smallest diameter was more than 6 mm.

The results are seen in Table 10 below.

TABLE 10

| | Thickness of Polarizer Protective Film (μm) | Re589 (nm) | Wavelength (nm) | | | $H_{IT}$ (MPa) | | Visibility | | Flexibility |
| | | | λ1 | λ2 | λ3 | λ/4 Retardation Layer | HC Layer | Before Light Resistance Test | After Light Resistance Test | |
| --- | --- | --- | --- | --- | --- | --- | --- | --- | --- | --- |
| Example C1 | 10.2 | 120 | 456 | 397 | 387 | 15 | 217 | A | A | A |
| Example C2 | 10.2 | 120 | 456 | 403 | 387 | 15 | 300 | A | A | A |
| Example C3 | 10.2 | 120 | 456 | unmeasurable | 387 | 15 | 350 | A | B | A |
| Example C4 | 10.2 | 125 | 456 | 397 | 393 | 15 | 420 | A | A | A |
| Comparative Example C1 | 32.5 | 105 | 456 | unmeasurable | — | — | 350 | A | A | C |

TABLE 10-continued

| | Thickness of Polarizer Protective Film (μm) | Re589 (nm) | Wavelength (nm) | | | λ/4 Retardation Layer | $H_{IT}$ (MPa) HC Layer | Visibility | | Flexi-bility |
| | | | λ1 | λ2 | λ3 | | | Before Light Resistance Test | After Light Resistance Test | |
|---|---|---|---|---|---|---|---|---|---|---|
| Comparative Example C1 | 10.0 | 0 | 456 | 397 | — | — | 280 | C | C | A |

As seen in Table 10, the polarizer protective film on the observer's side according to Comparative Example C1 included a COP base material, and thus, was thick. In contrast with this, the polarizer protective film according to each of Examples C1 to C4 included no base material, and thus, was thin.

As seen in Table 10, the polarizer protective film on the observer's side according to Comparative Example C2 included no λ/4 retardation layer containing a liquid crystal compound, and thus, the visibility evaluated through polarized sunglasses was poor. In contrast with this, the image display device according to each of Examples C1 to C4 included a λ/4 retardation layer containing a liquid crystal compound, and thus, the visibility evaluated through polarized sunglasses was excellent.

The visibility of the image display device according to Example C1 as evaluated through polarized sunglasses after the light resistance test was better than the visibility of the image display device according to Example C3 as evaluated through polarized sunglasses after the light resistance test. This is because the hard coat layer in the polarizer protective film according to Example C1 contained an ultraviolet absorber, thus making it possible to inhibit the liquid crystal compound in the λ/4 retardation layer from being deteriorated by ultraviolet light.

LIST OF REFERENCE NUMERALS 10, 100 . . . Optical film
10A . . . Surface
11, 101 . . . Light-transmitting base material
12 . . . First functional layer
13 . . . Second functional layer
14 . . . Mixed Layer
21 . . . First coating film
22 . . . Second coating film
30 . . . Polarizing plate
31 . . . Polarizer
40, 130, 170 . . . Image display device
50 . . . Display element
102 . . . Functional layer
140 . . . Polarizer protective film transferring member
150 . . . Polarizer protective film
151 . . . First resin layer
152 . . . Second resin layer
153 . . . Third resin layer
160 . . . Release film

The invention claimed is:

1. An optical film comprising a light-transmitting base material, a first functional layer, and a second functional layer in this order;
wherein the light-transmitting base material contains at least one selected from the group consisting of a cellulose acetate resin, a cycloolefin polymer resin, and a (meth)acrylic resin;
at least one of the first functional layer and the second functional layer contains an ultraviolet absorber;
the optical film further comprises a mixed layer provided between the first functional layer and the second functional layer, being adjacent to the first functional layer and the second functional layer, and containing a component of the first functional layer and a component of the second functional layer;
the total film thickness of the first functional layer, the second functional layer, and the mixed layer is 1 μm or more and 10 μm or less;
the ratio of the film thickness of the mixed layer to the total film thickness of the first functional layer, the second functional layer, and the mixed layer is 0.6% or more and 40% or less; and
the first functional layer contains a polymer of a radiation-polymerizable compound.

2. The optical film according to claim 1, wherein the film thickness of the mixed layer is 0.1 μm or more.

3. The optical film according to claim 1, wherein the first functional layer and the second functional layer each contain the ultraviolet absorber.

4. The optical film according to claim 1, wherein the first functional layer contains the ultraviolet absorber, and wherein the first functional layer has an indentation hardness of 50 MPa or more and 600 MPa or less.

5. A polarizing plate comprising:
the optical film according to claim 1; and
a polarizer provided on one face of the optical film.

6. An image display device comprising:
a display element; and
the optical film according to claim 1,
wherein the optical film is arranged on the observer's side of the display element.

7. The image display device according to claim 6, wherein the display element is an organic light-emitting diode element.

8. An optical film comprising a light-transmitting base material, a first functional layer, and a second functional layer in this order;
wherein at least one of the first functional layer and the second functional layer contains an ultraviolet absorber;
the optical film further comprises a mixed layer provided between the first functional layer and the second functional layer, being adjacent to the first functional layer and the second functional layer, and containing a component of the first functional layer and a component of the second functional layer;

the total film thickness of the first functional layer, the second functional layer, and the mixed layer is 1 µm or more and 10 µm or less;

the film thickness of the mixed layer is 0.02 µm or more and 1 µm or less; and the first functional layer contains a polymer of a radiation-polymerizable compound.

9. The optical film according to claim 8, wherein the film thickness of the mixed layer is 0.1 µm or more.

10. The optical film according to claim 8, wherein the first functional layer and the second functional layer each contain the ultraviolet absorber.

11. The optical film according to claim 8, wherein the first functional layer contains the ultraviolet absorber, and wherein the first functional layer has an indentation hardness of 50 MPa or more and 600 MPa or less.

\* \* \* \* \*